United States Patent [19]

Trussell et al.

[11] 4,145,746
[45] Mar. 20, 1979

[54] ENGINE TESTER DISPLAY AND PRINTING TECHNIQUES

[75] Inventors: Gerald C. Trussell, Park Ridge; Robert W. Arnston, Schaumburg; Daniel Elyashar, Chicago, all of Ill.

[73] Assignee: Sun Electric Corporation, Crystal Lake, Ill.

[21] Appl. No.: 756,532

[22] Filed: Jan. 3, 1977

[51] Int. Cl.² .................. G01L 25/00; G06F 15/46
[52] U.S. Cl. .................. 364/551; 73/117.3; 364/424; 364/442
[58] Field of Search .................. 235/150.2, 151.3; 73/116, 117.2, 117.3; 324/15, 16, 19; 364/424, 425, 442, 551

[56] References Cited

U.S. PATENT DOCUMENTS

| | | | |
|---|---|---|---|
| 3,614,617 | 10/1971 | Blake | 73/117.2 |
| 3,919,466 | 11/1975 | Huwyler et al. | 73/116 |
| 3,942,365 | 3/1976 | Hanson et al. | 73/116 |
| 3,990,302 | 11/1976 | Reeves et al. | 73/116 |
| 4,015,467 | 4/1977 | Armstrong | 73/116 |
| 4,027,532 | 6/1977 | Trussell et al. | 235/151.3 |
| 4,055,995 | 11/1977 | Armstrong et al. | 364/551 |
| 4,064,747 | 12/1977 | Rockliffe et al. | 364/551 |

*Primary Examiner*—Felix D. Gruber
*Attorney, Agent, or Firm*—Allegretti, Newitt, Witcoff & McAndrews

[57] ABSTRACT

The disclosure describes an improved apparatus and method for displaying and printing the results of an analysis of an internal combustion engine. The results simultaneously are displayed on a cathode ray tube (CRT) face and are written into a buffer memory of a printer. An operator can move a cursor to the line of the CRT display for which special printing is desired. By pushing an ENTER switch, the operator causes a problem flag to be displayed on the screen at the desired line. The information displayed on the CRT face then is printed, together with an additional message indicating a possible vehicle problem. The line designated by the problem flag is printed in a modified ink color to indicate the source of the possible vehicle problem.

16 Claims, 83 Drawing Figures

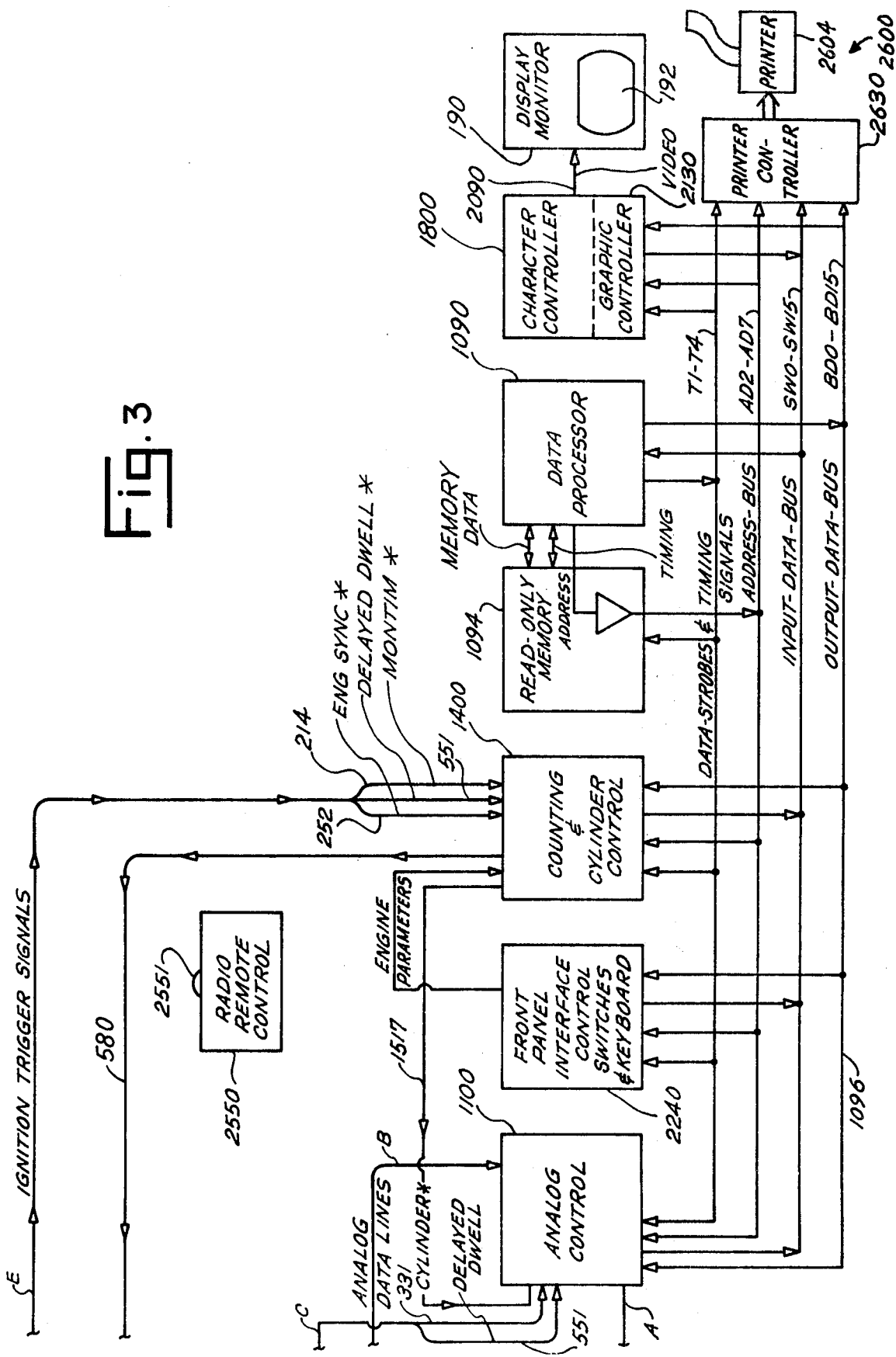

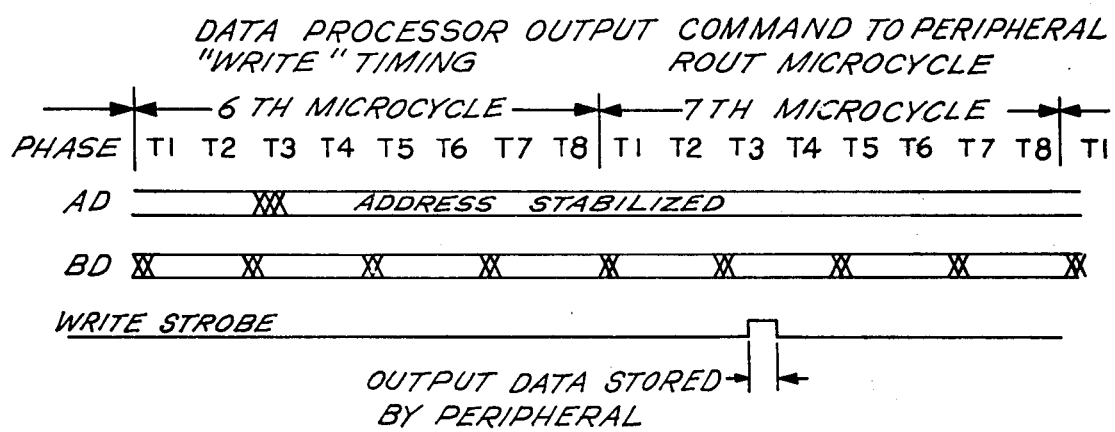
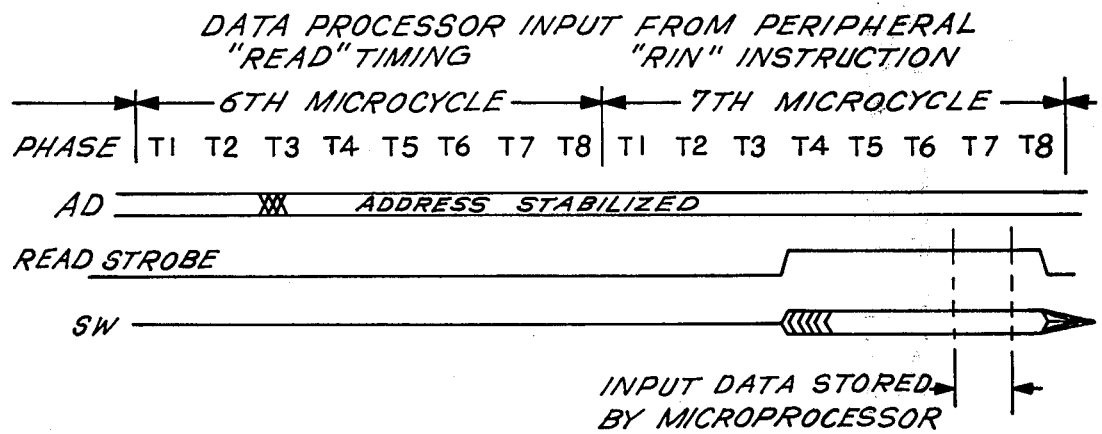

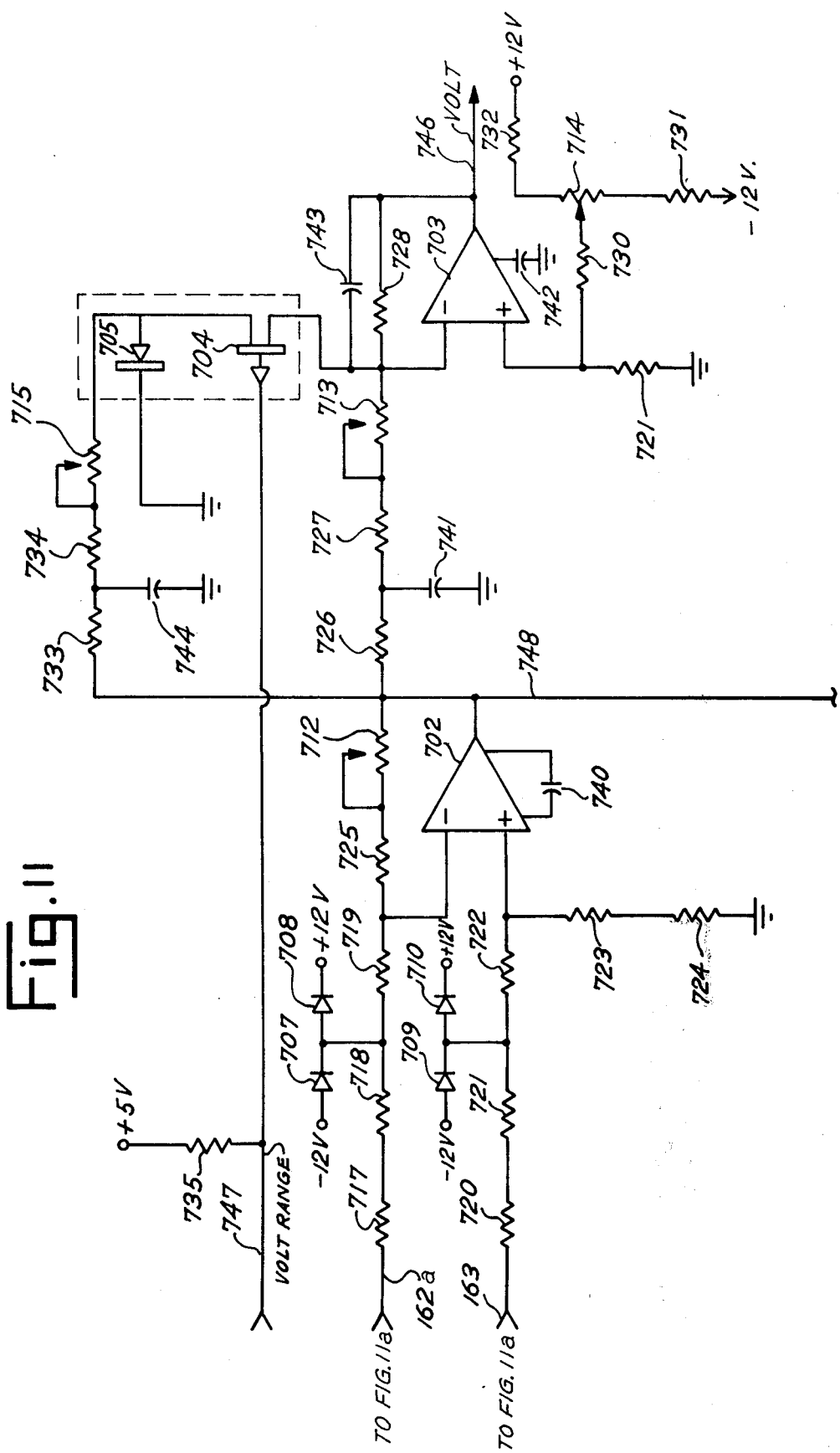

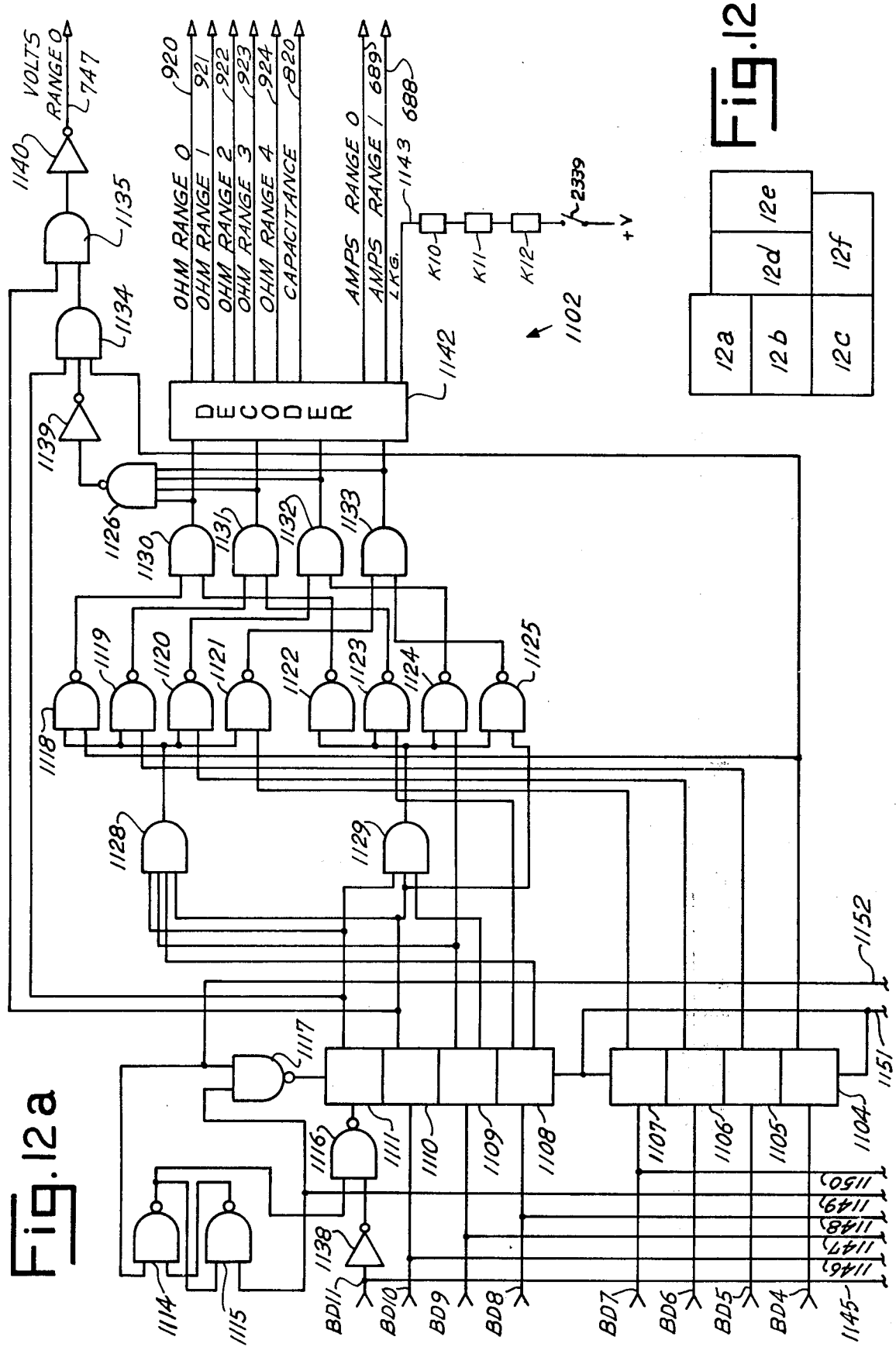

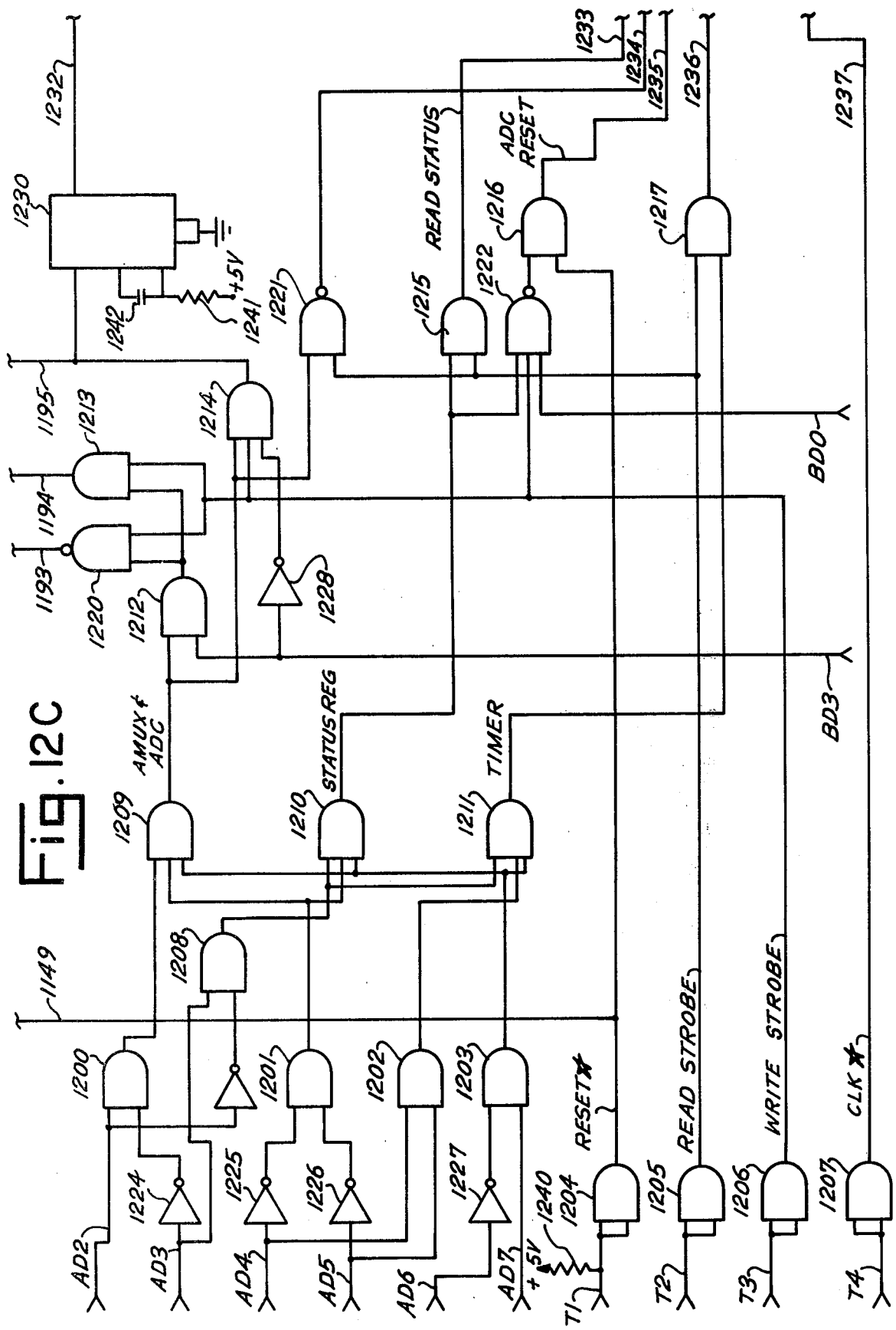

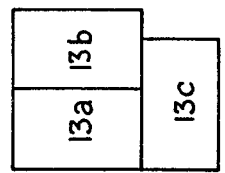
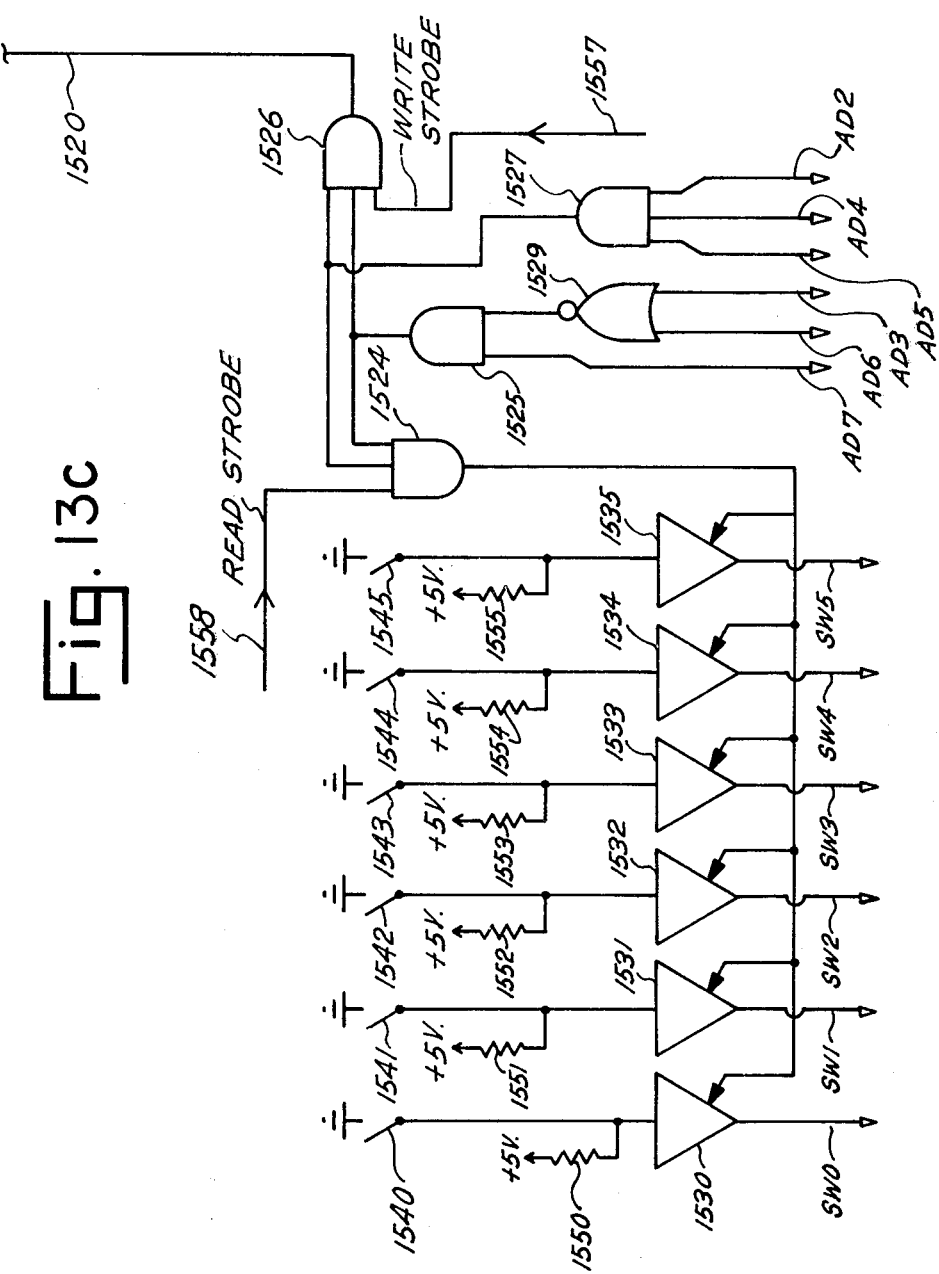

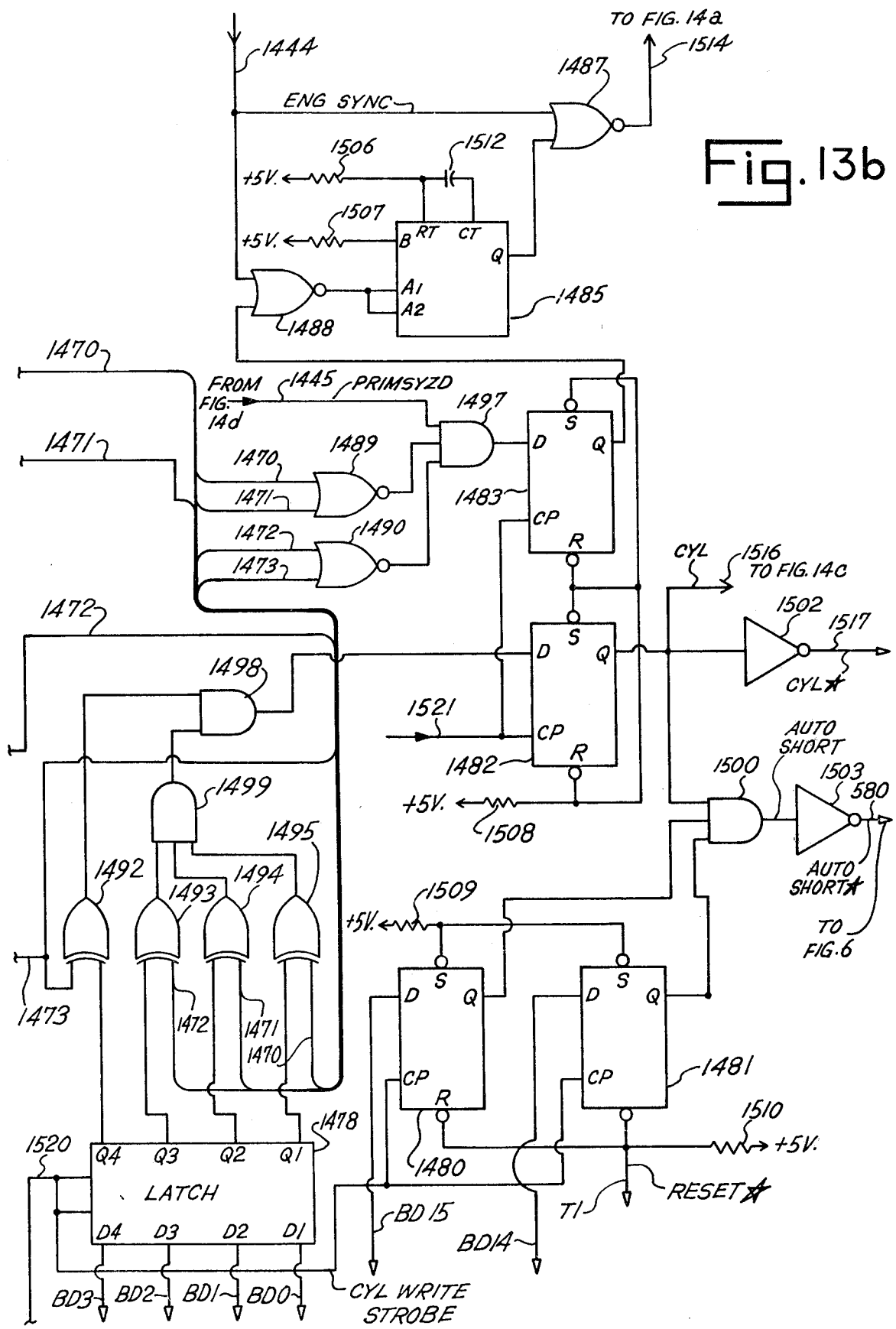

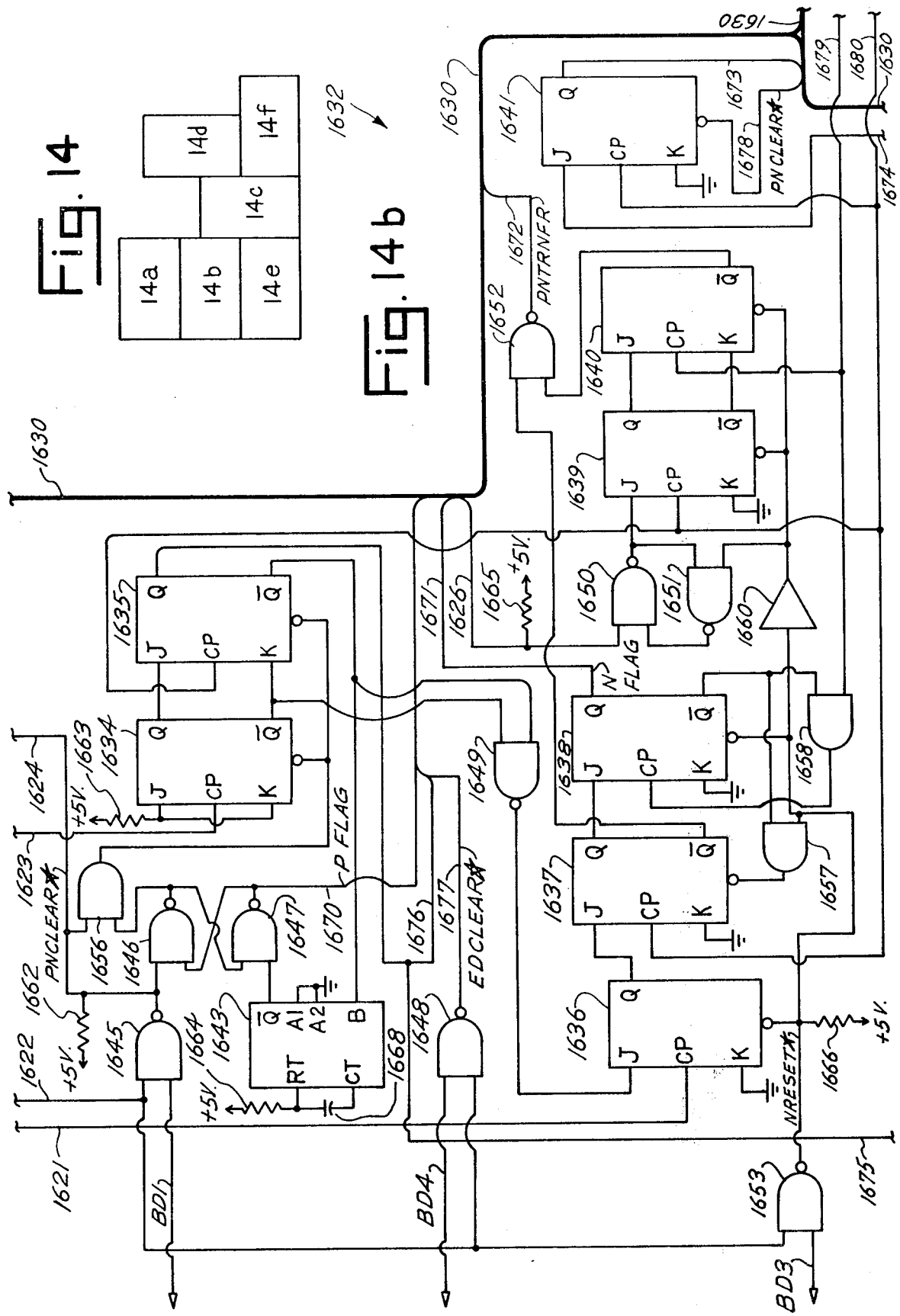

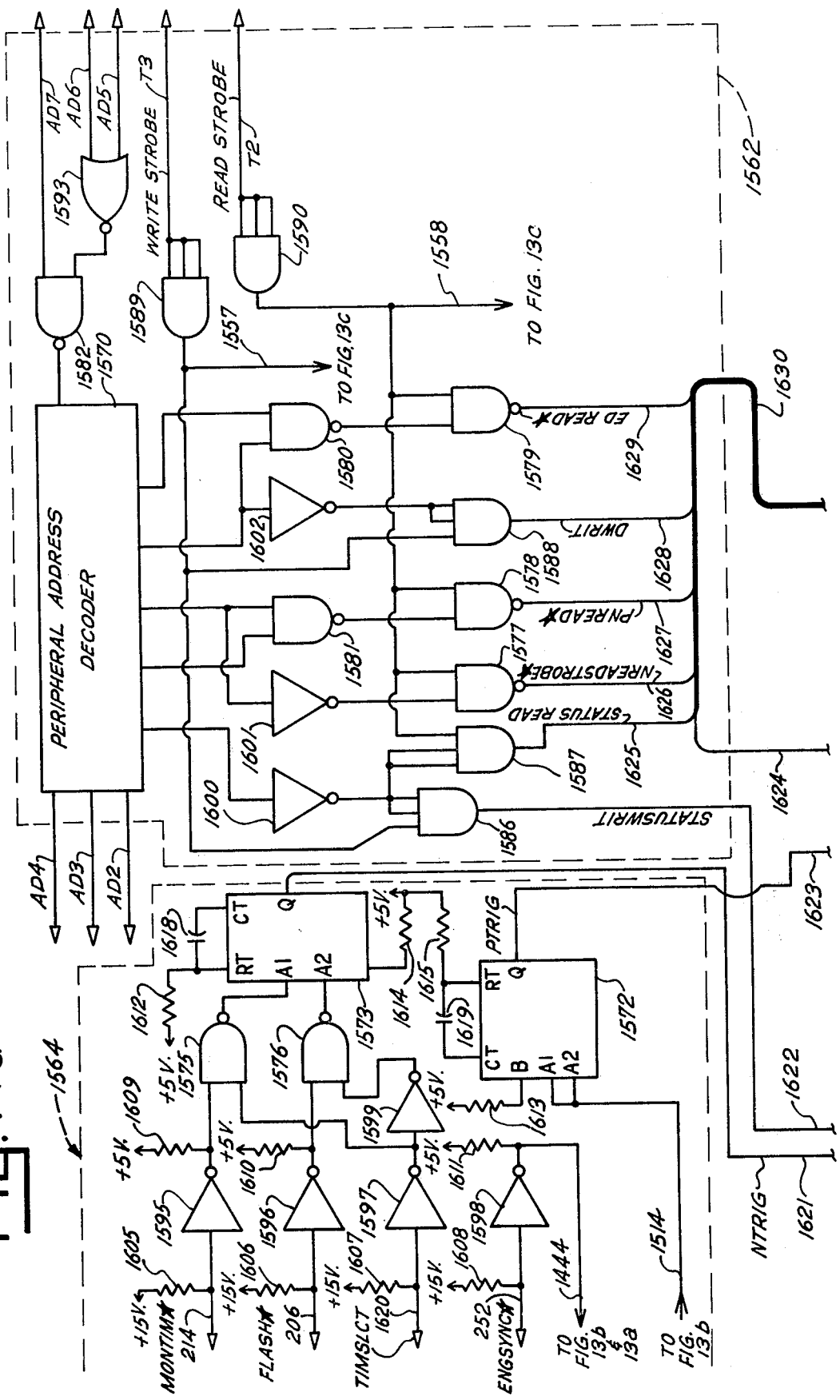

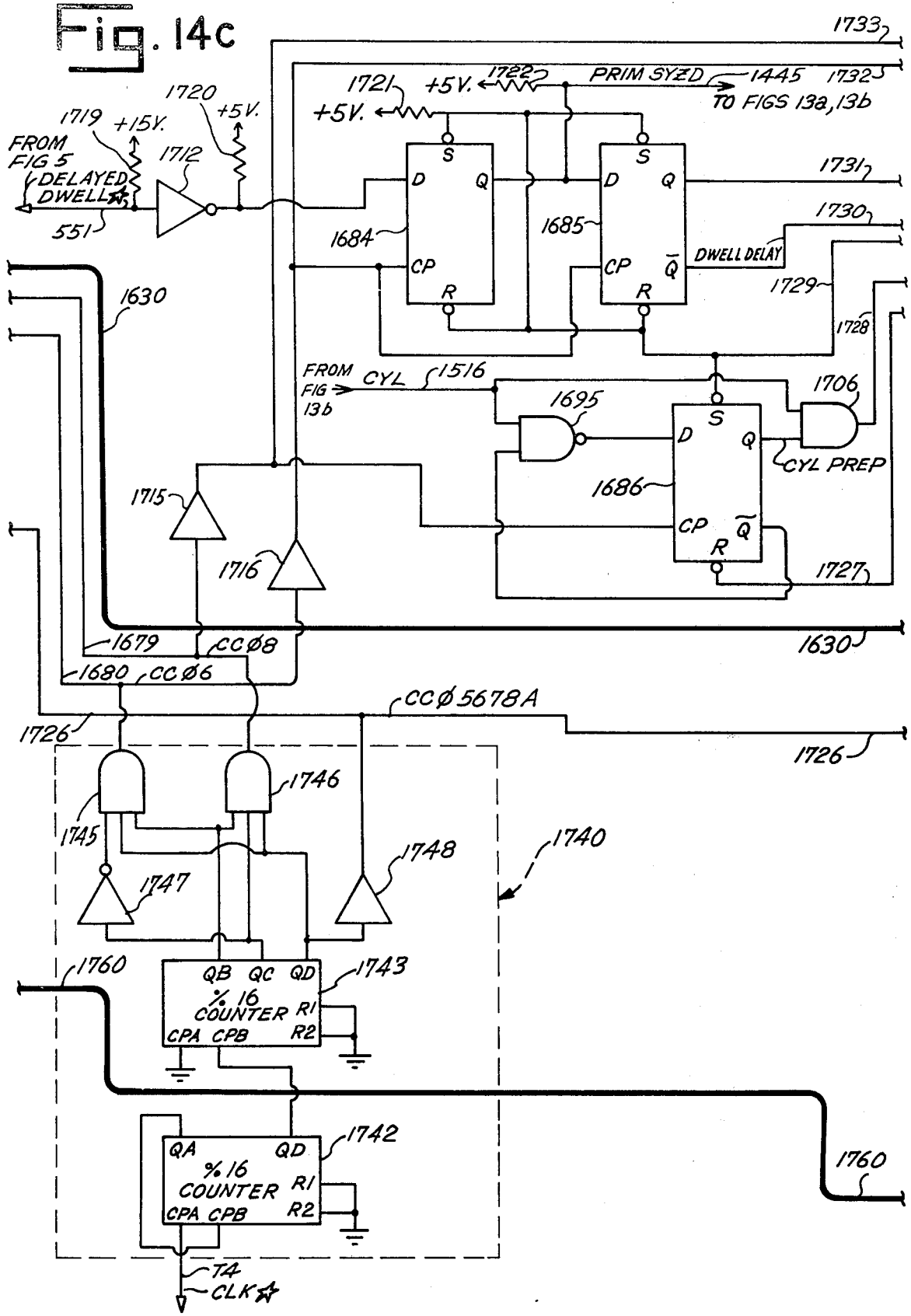

CLOCK PHASES & SEQUENCE SYNCHRONIZATION

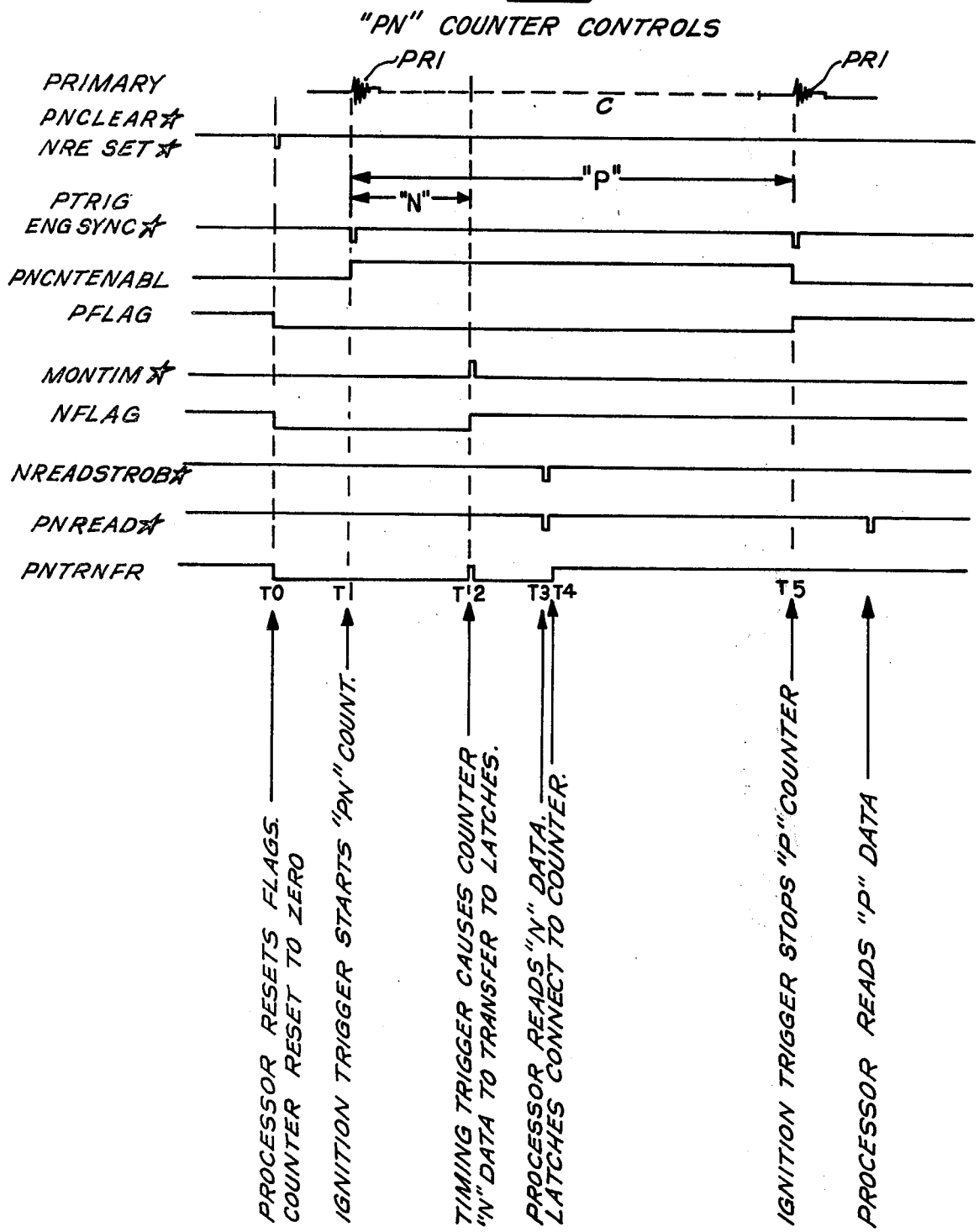

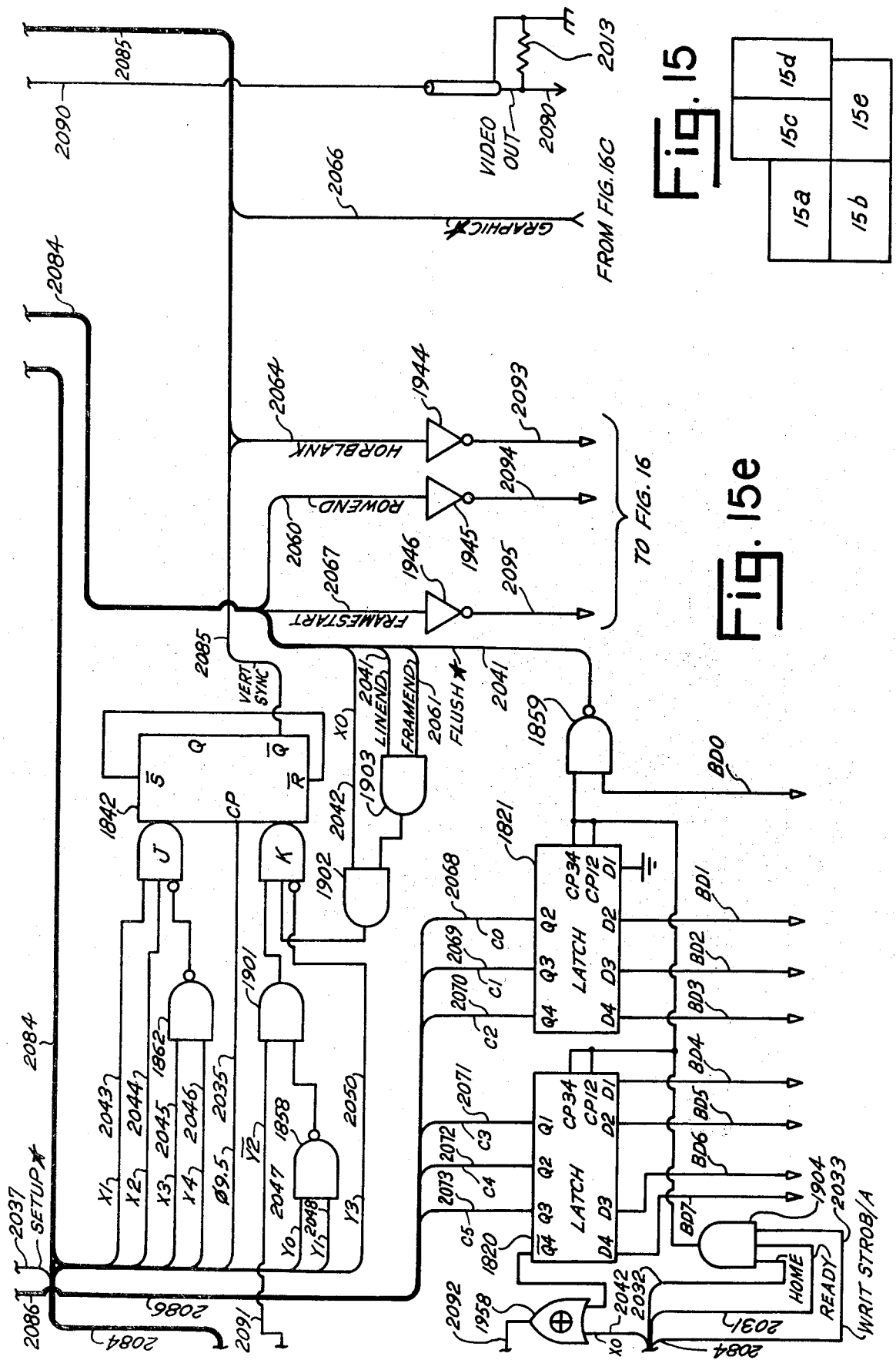

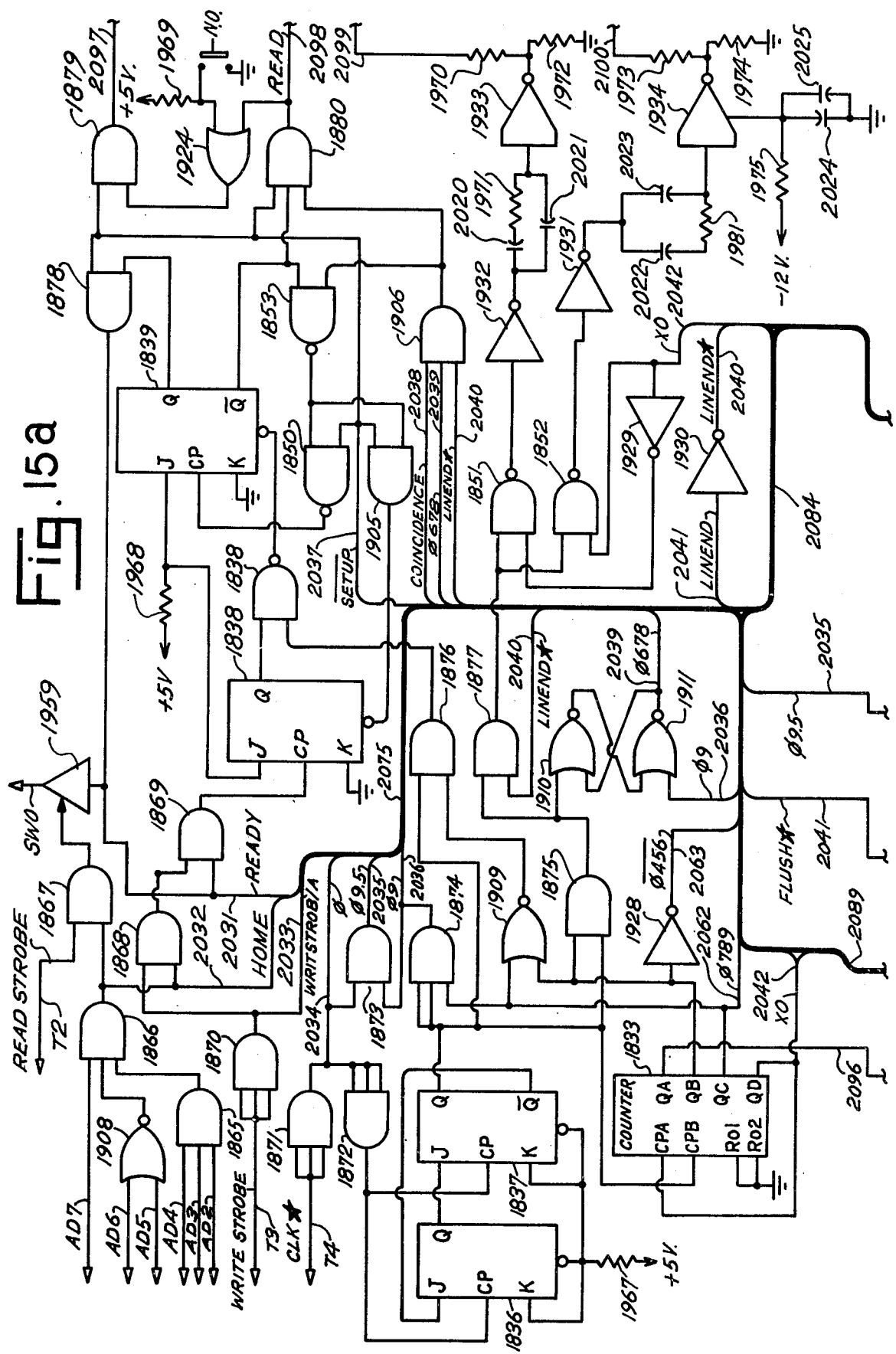

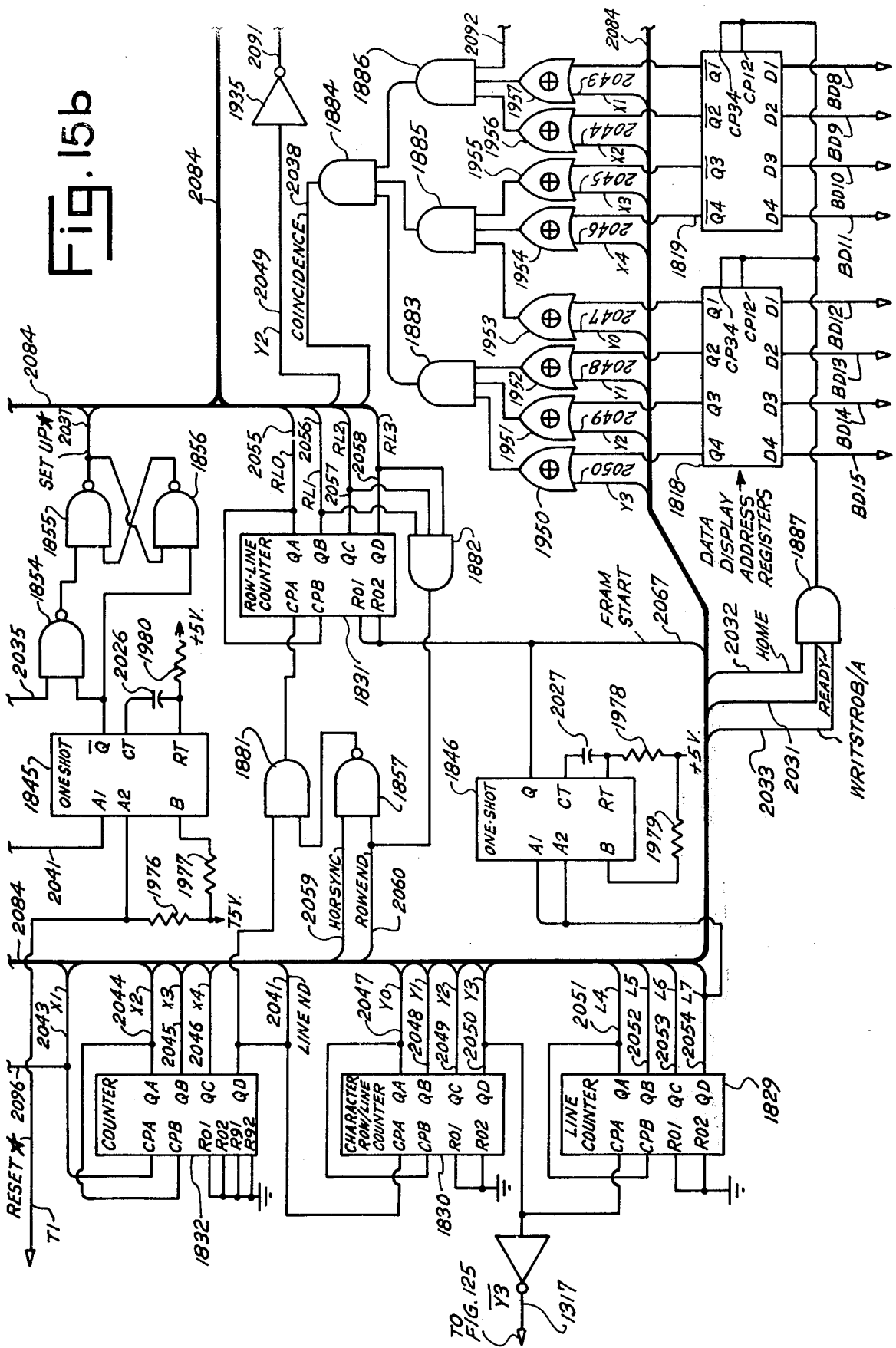

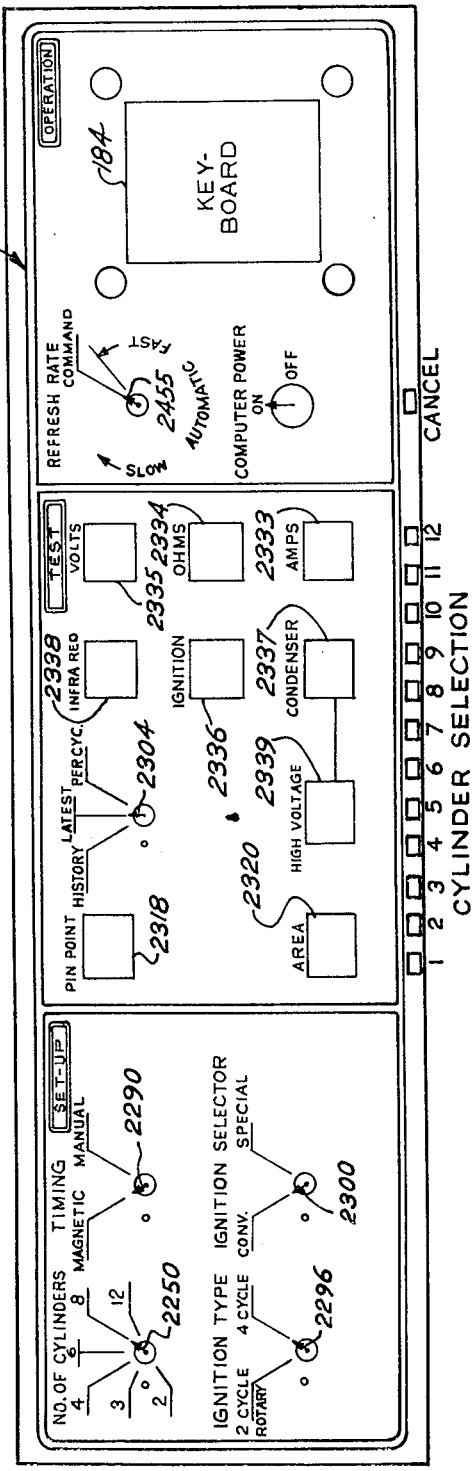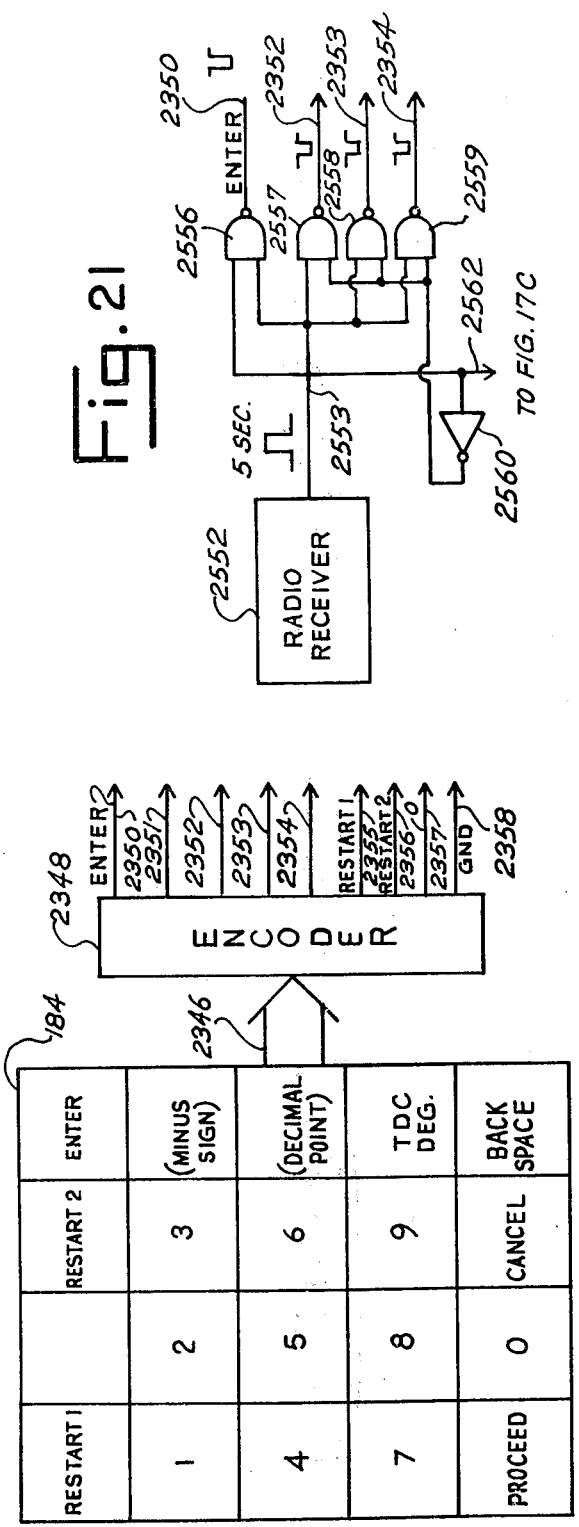

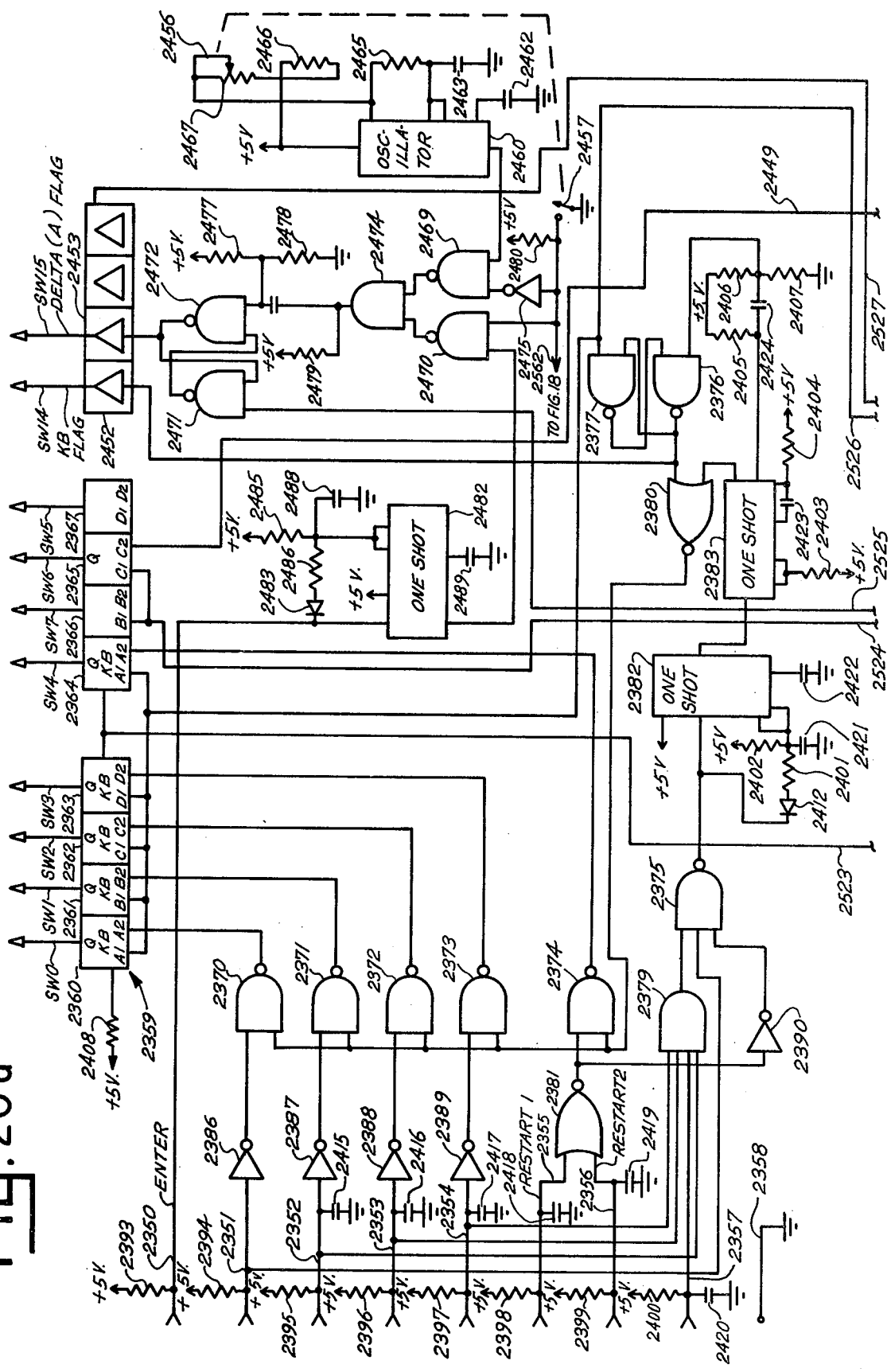

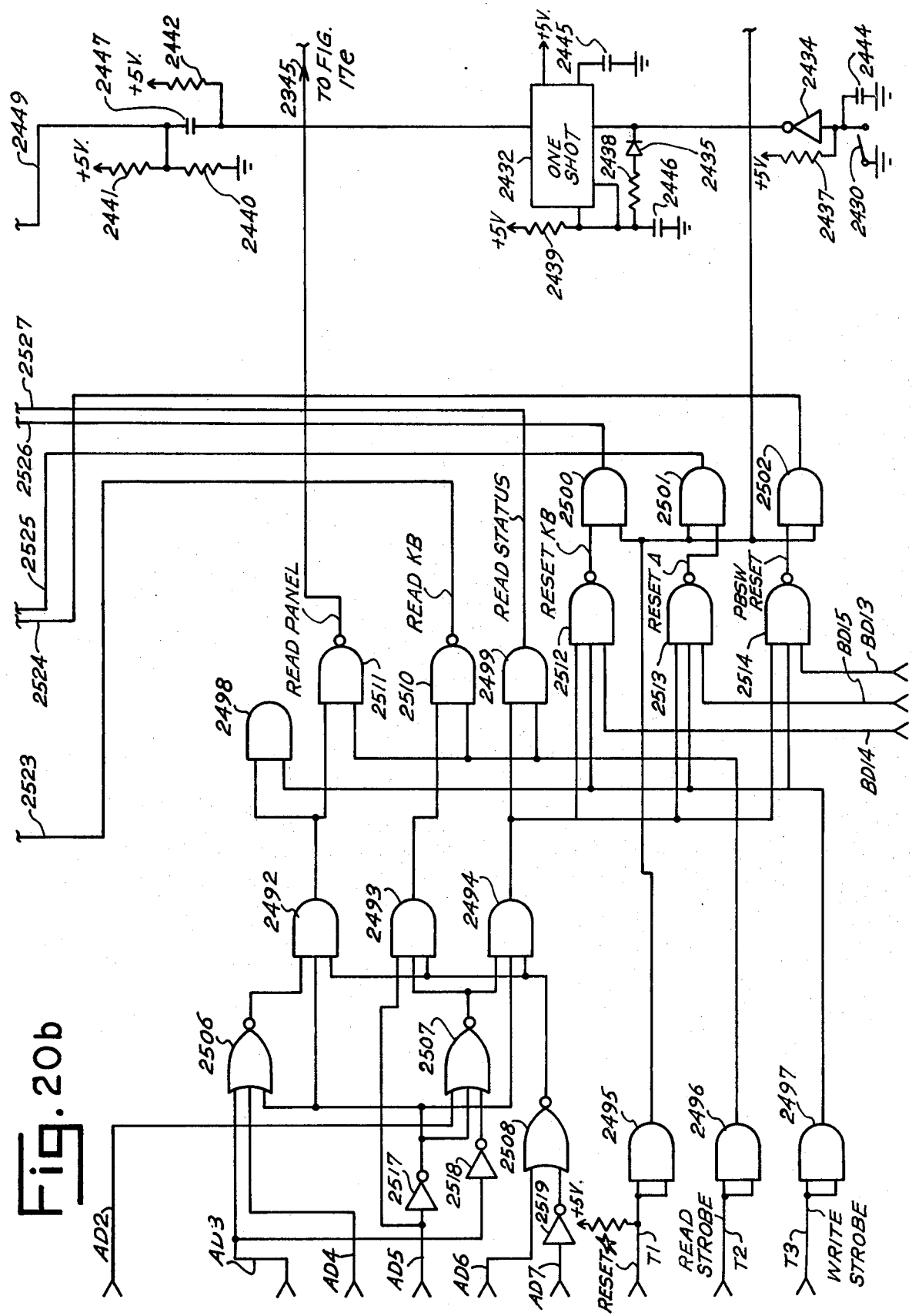

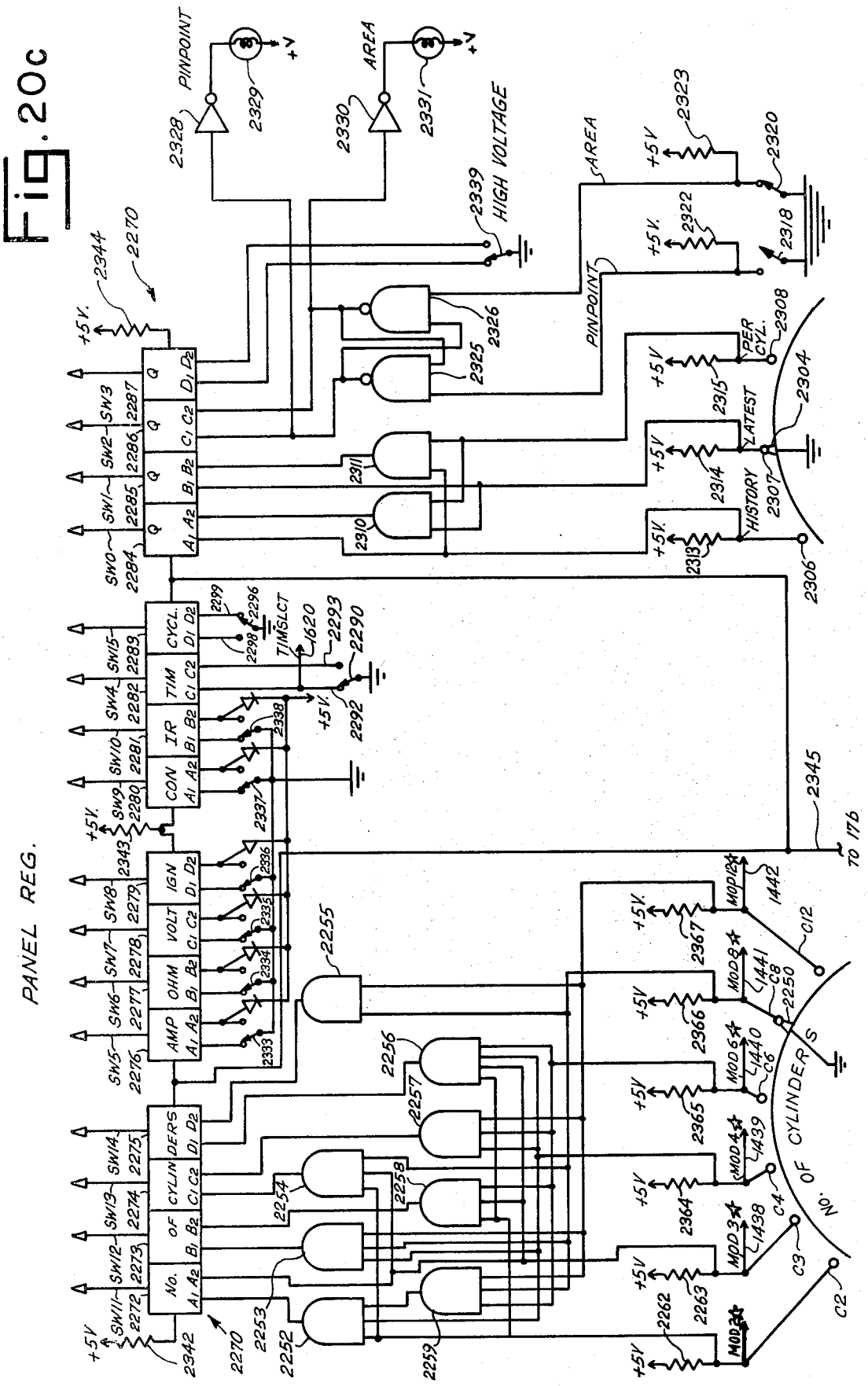

BASIC EXECUTIVE CONTROL SEQUENCE

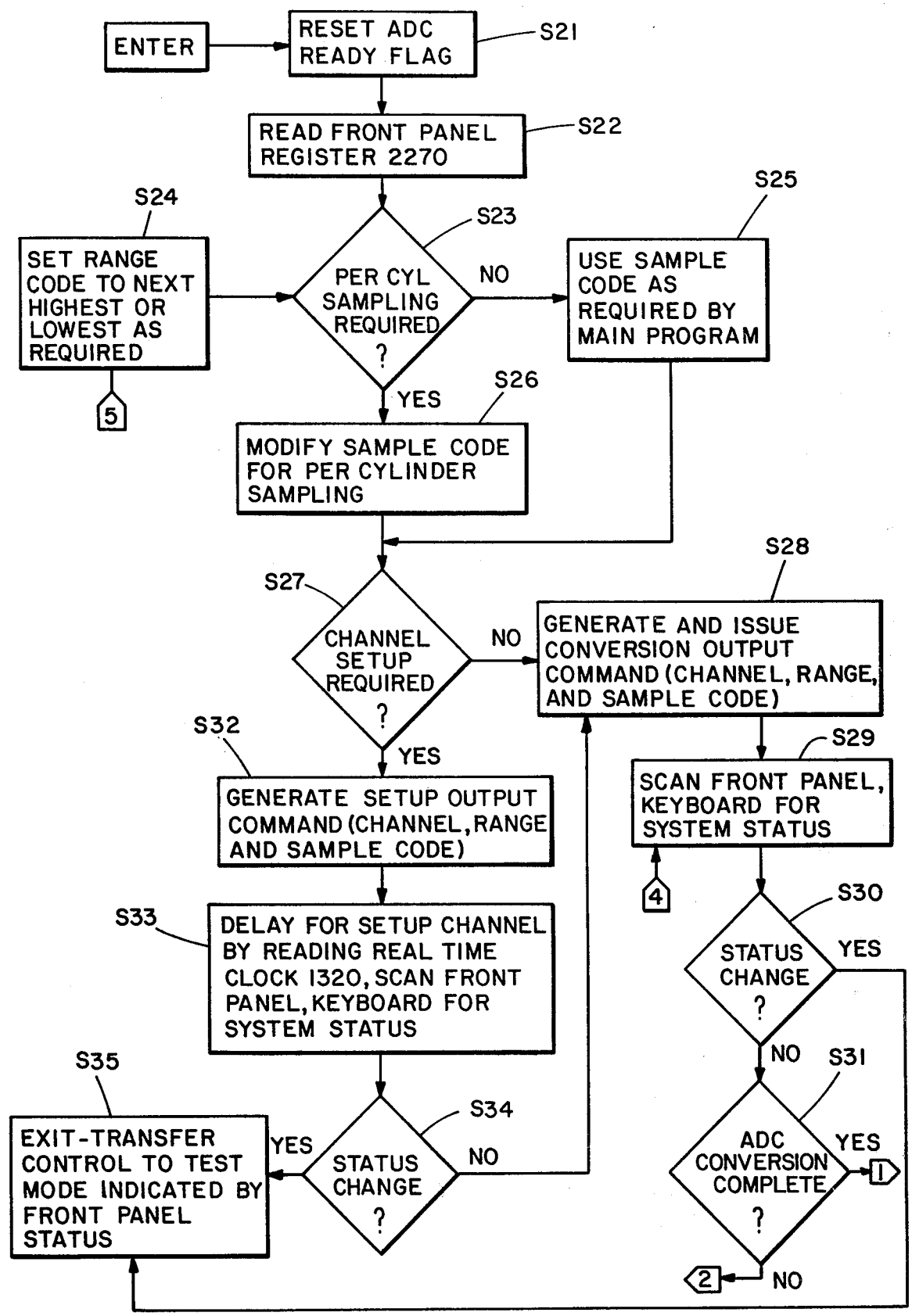
ANALOG/DIGITAL CONVERTER DATA ACQUISITION & DISPLAY
FIG. 23 - PART I

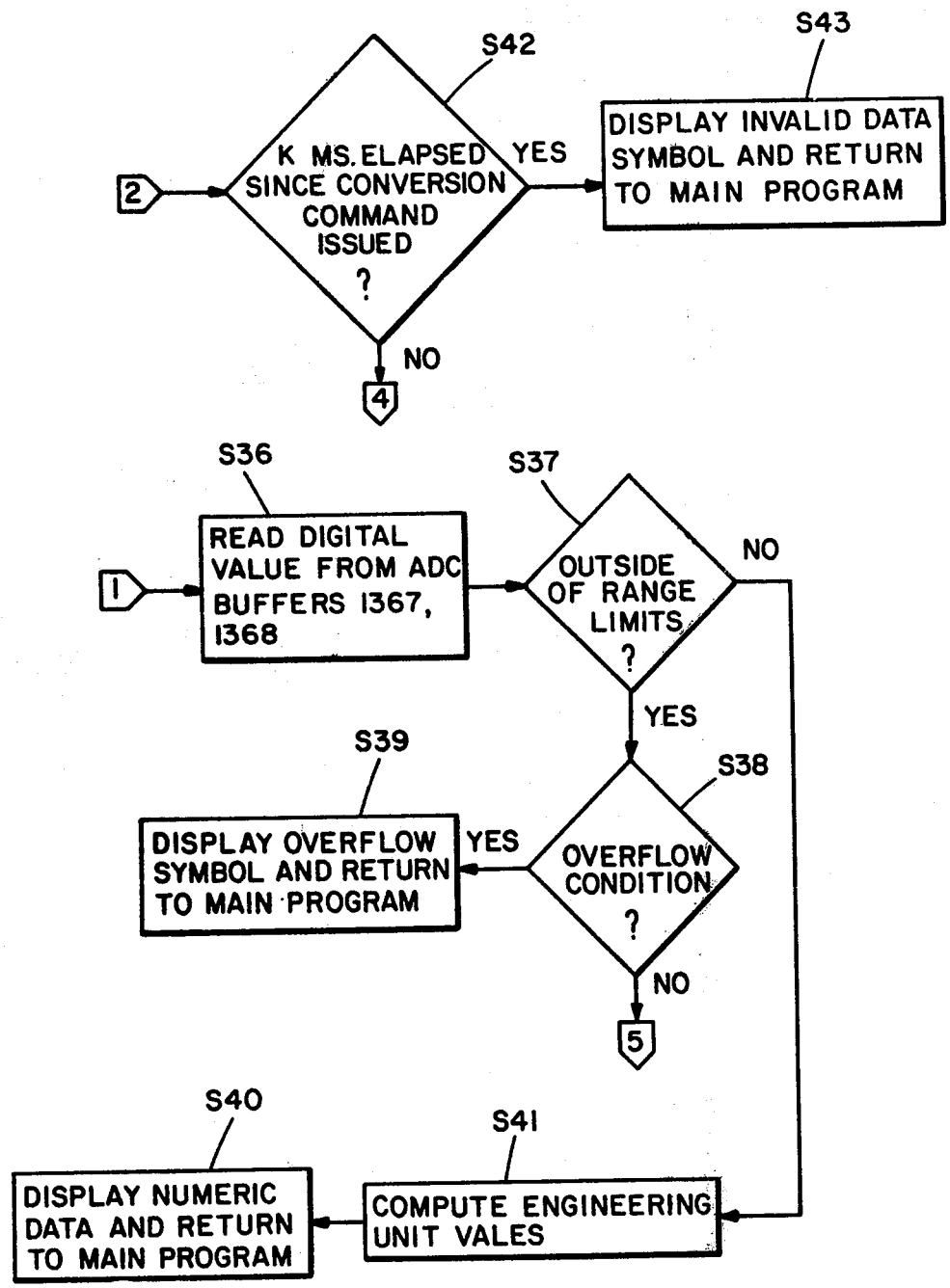
FIG. 23 - PART 2

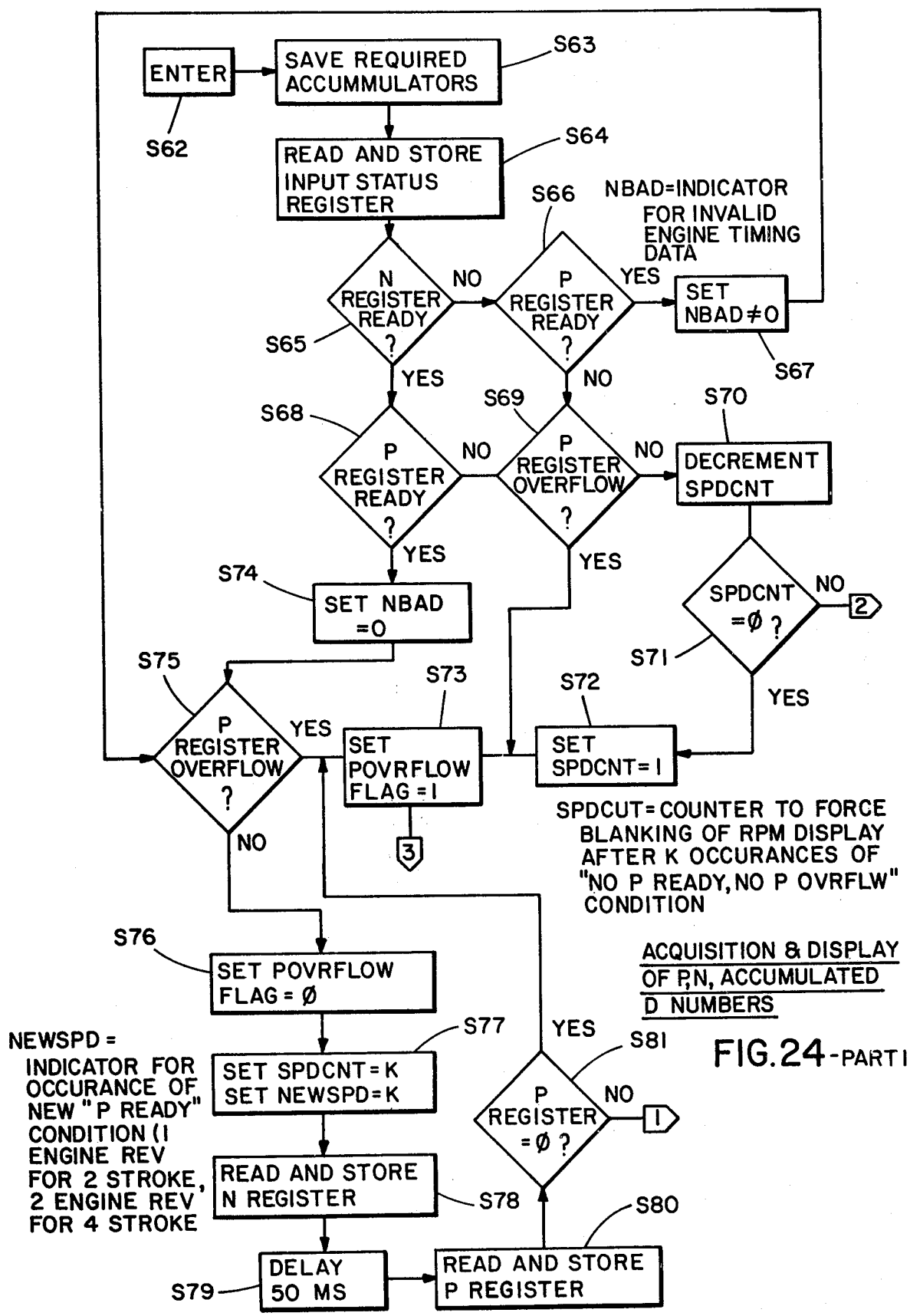

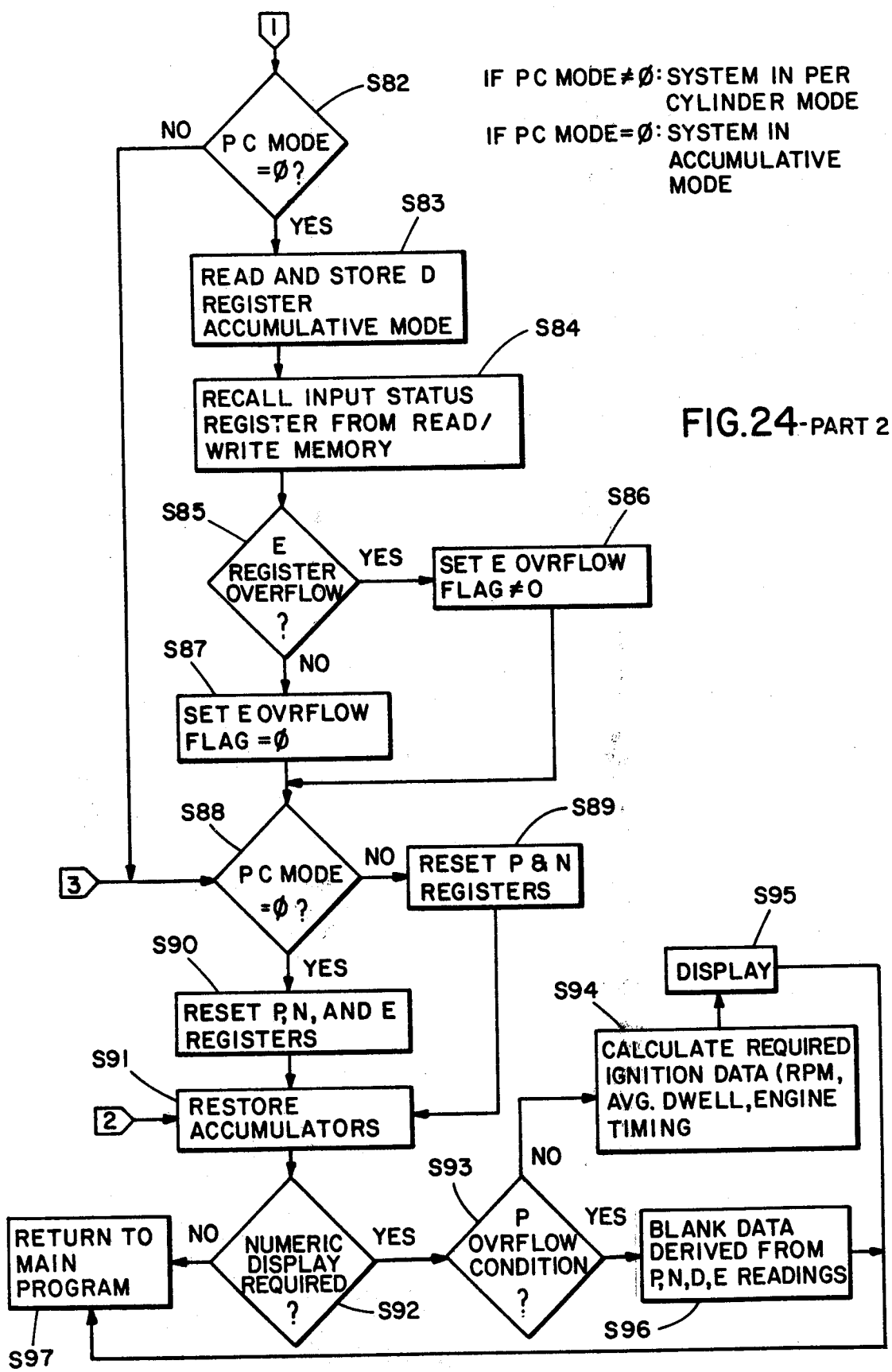
FIG.24-PART 2

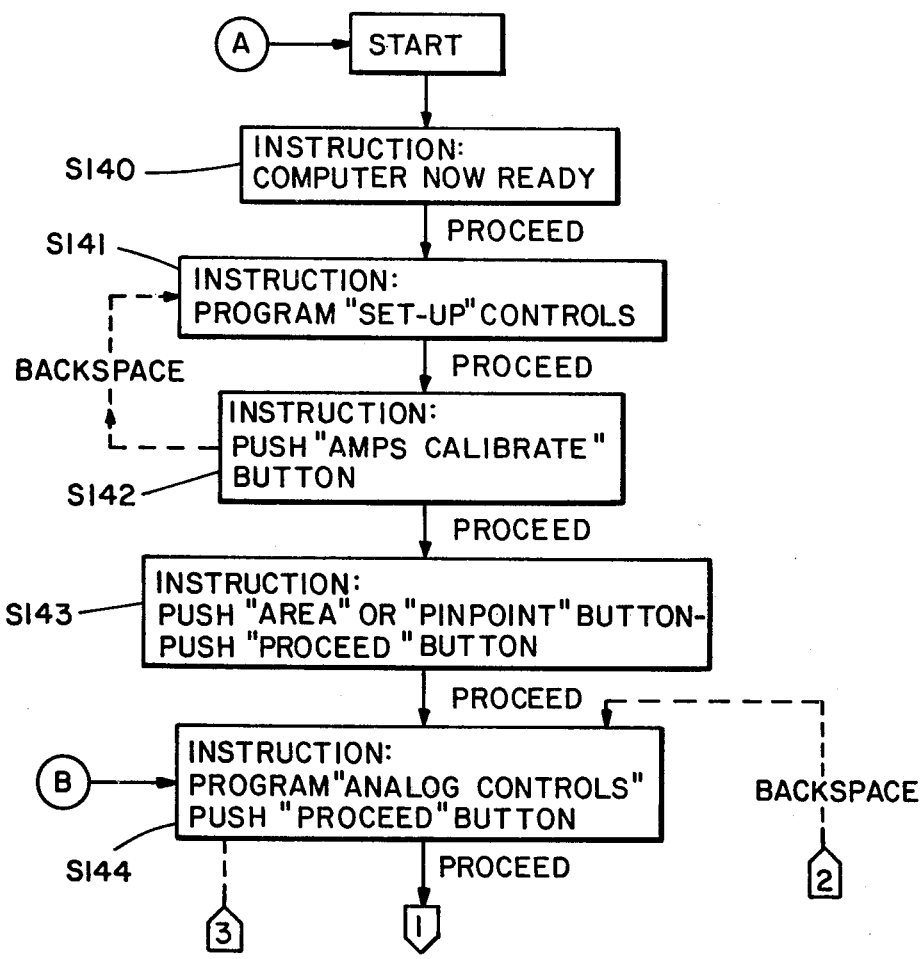
MAN/MACHINE FLOW DIAGRAM
FIG.25 - PART I

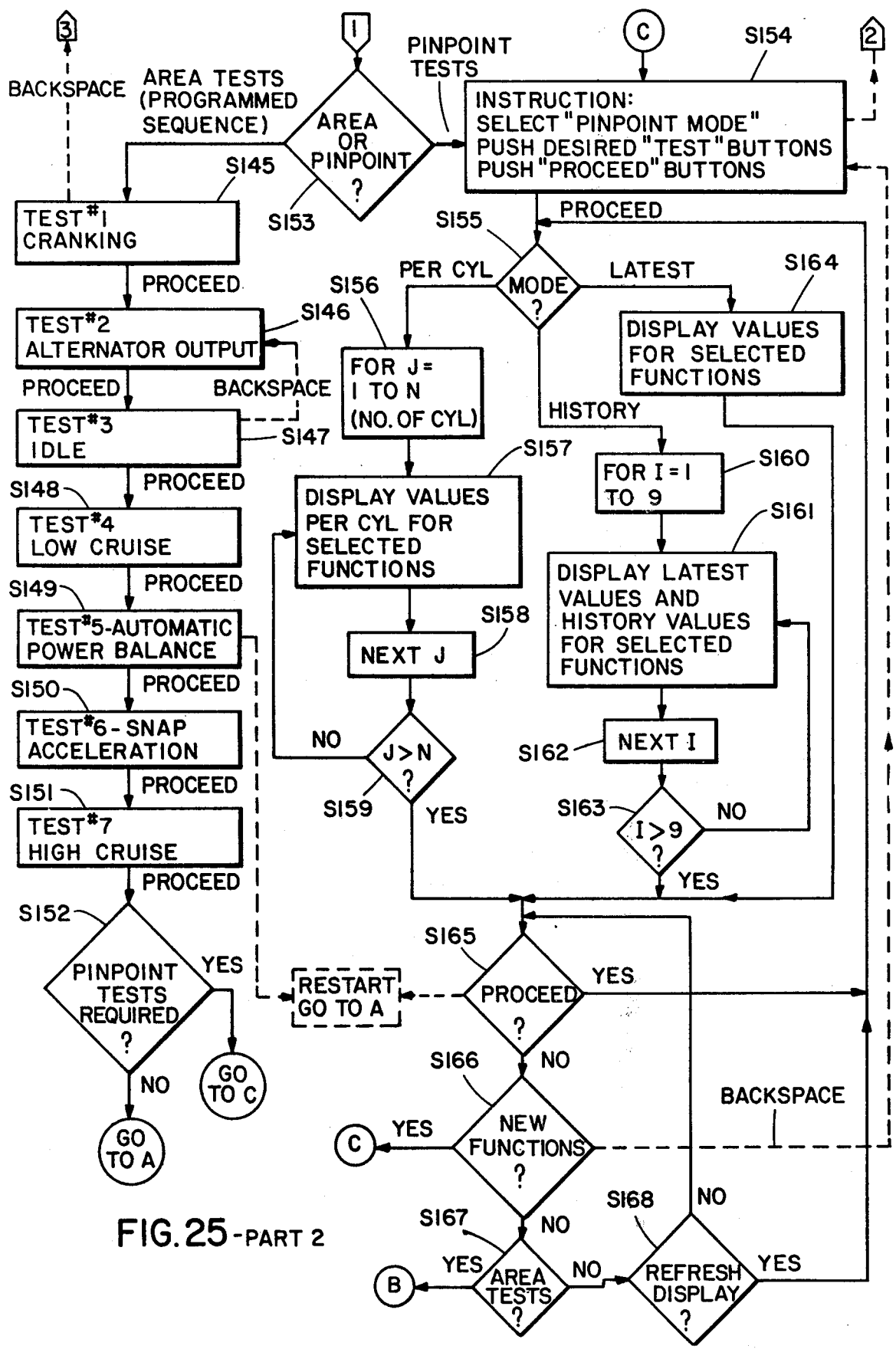
FIG.25 -PART 2

```
COMPUTER NOW READY

MAKE TEST CONNECTIONS

PUSH "PROCEED" BUTTON
```

FIG. 26

```
PROGRAM "SET-UP" CONTROLS

* NO. OF CYLS.
* IGN. TYPE
* IGN. SELECTOR
* TIMING
  IF MAGNETIC,
  "ENTER" TDC OFFSET ANGLE

ACCEPTED              -XXX.X
```

FIG. 27

FIG. 28 — Grid display showing:
- Row 11: PUSH "AMPS CALIBRATE" BUTTON
- Row 13: AMPS CALIBRATION COMPLETE (192)

FIG. 29 — Grid display showing:
- Row 3: PUSH "AREA" OR "PINPOINT" BUTTON
- Row 5: PUSH "PROCEED" BUTTON (192)

|   | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| 0 | | | | | | | | | T | E | S | T | | 1 | - | C | R | A | N | K | I | N | G | | | | | | | | | |
| 1 | | | | | | | | | | | | | | | | | | | | | | | | | | | | | | | | |
| 2 | D | I | S | A | B | L | E | | I | G | N | I | T | I | O | N | | | | | | | | | | | | | | | | |
| 3 | C | R | A | N | K | | E | N | G | I | N | E | | | | | | | | | | | | | | | | | | | | |
| 4 | | | | | | | | | | | | | | | | | | | | | | | | | | | | | | | | |
| 5 | | B | A | T | T | E | R | Y | | | | | | | | | | | | | X | X | . | X | | V | O | L | T | S | | |
| 6 | | S | T | A | R | T | E | R | | D | R | A | W | | | | | | | | X | X | X | | | A | M | P | S | | | |
| 7 | | C | R | A | N | K | I | N | G | | S | P | E | E | D | | | | | | X | X | X | X | | R | P | M | | | | |
| 8 | | D | Y | N | . | | D | I | S | T | . | | R | E | S | . | | | | | X | . | X | X | | V | O | L | T | S | | |
| 9 | | D | W | E | L | L | | | | | | | | | | | | | | | X | X | . | X | | D | E | G | | | | |
| 10 | | | | | | | | | | | | | | | | | | | | | | | | | | | | | | | | |
| 11 | | C | O | I | L | | O | U | T | P | U | T | | | | | | | | | | | X | X | | K | V | | | | | |
| 12 | | | | | | | | | | | | | | | | | | | | | | | | | | | | | | | | |
| 13 | | | | | | | | | | | | | | | | | | | | | | | | | | | | | | | | |
| 14 | | | | | | | | | | | | | | | | | | | | | | | | | | | | | | | | |
| 15 | | | | | | | | | | | | | | | | | | | | | | | | | | | | | | | | |

FIG. 30

AREA TEST I-CRANKING

FIG. 33 — AREA TEST 2 - ALTERNATOR OUTPUT

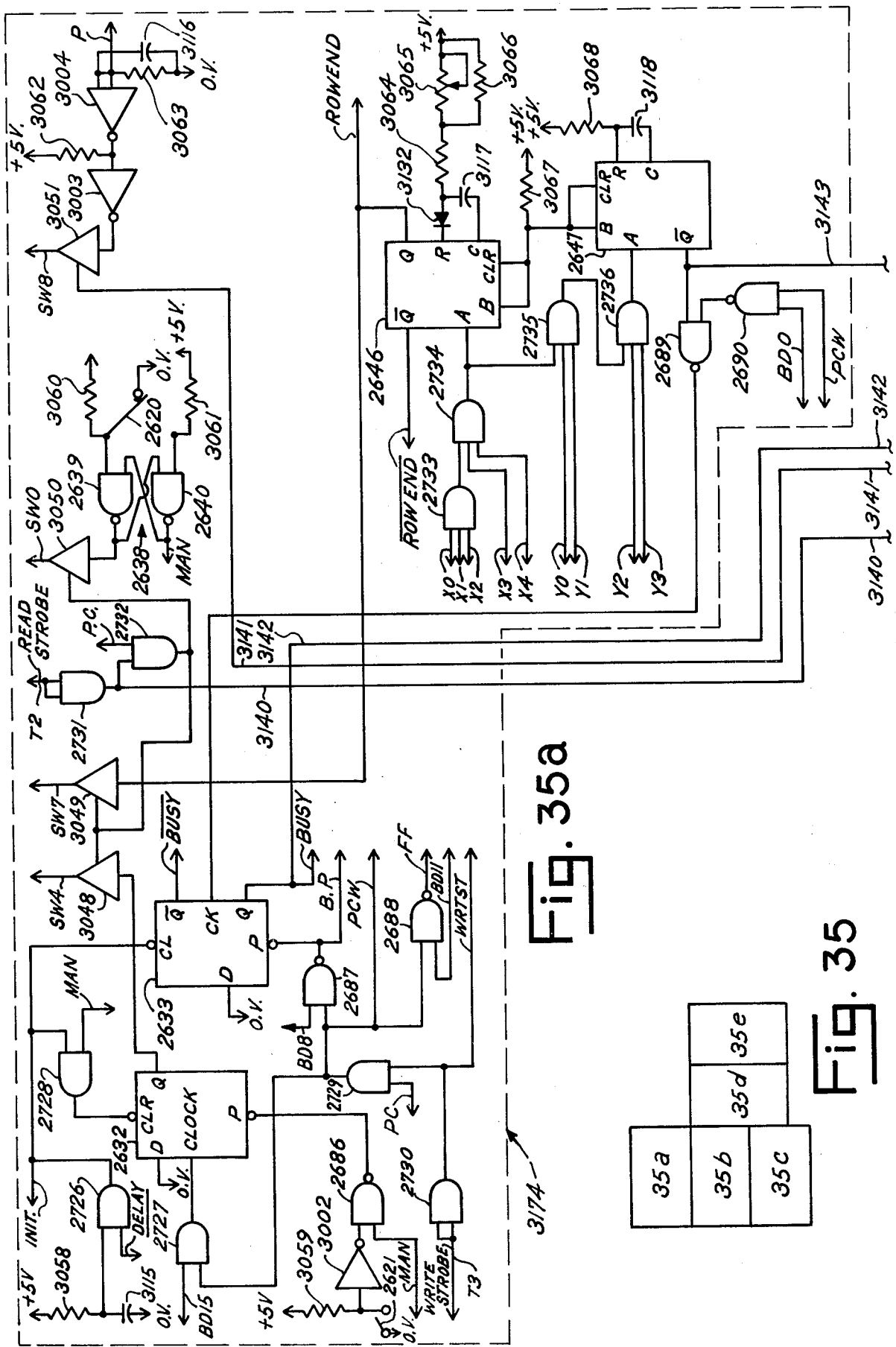

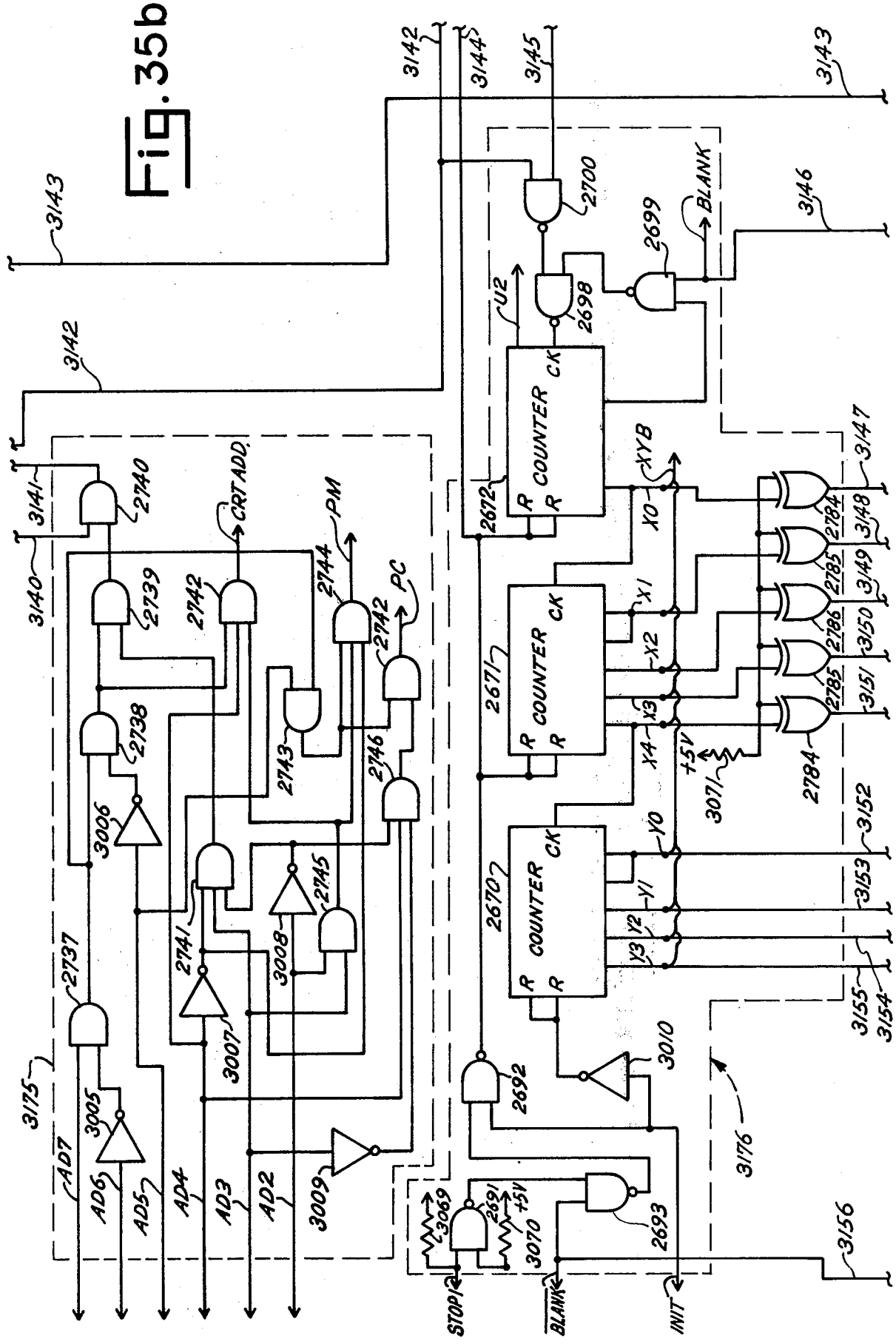

Fig. 35c

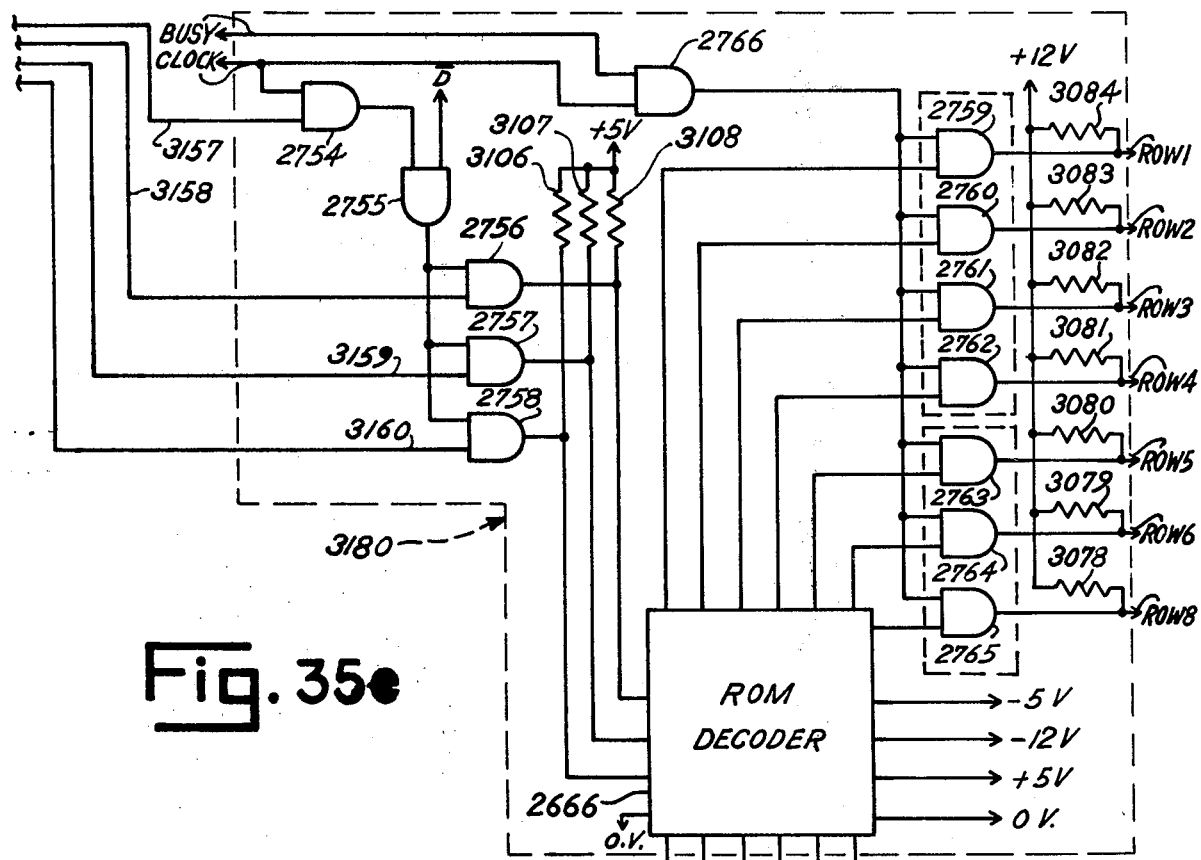
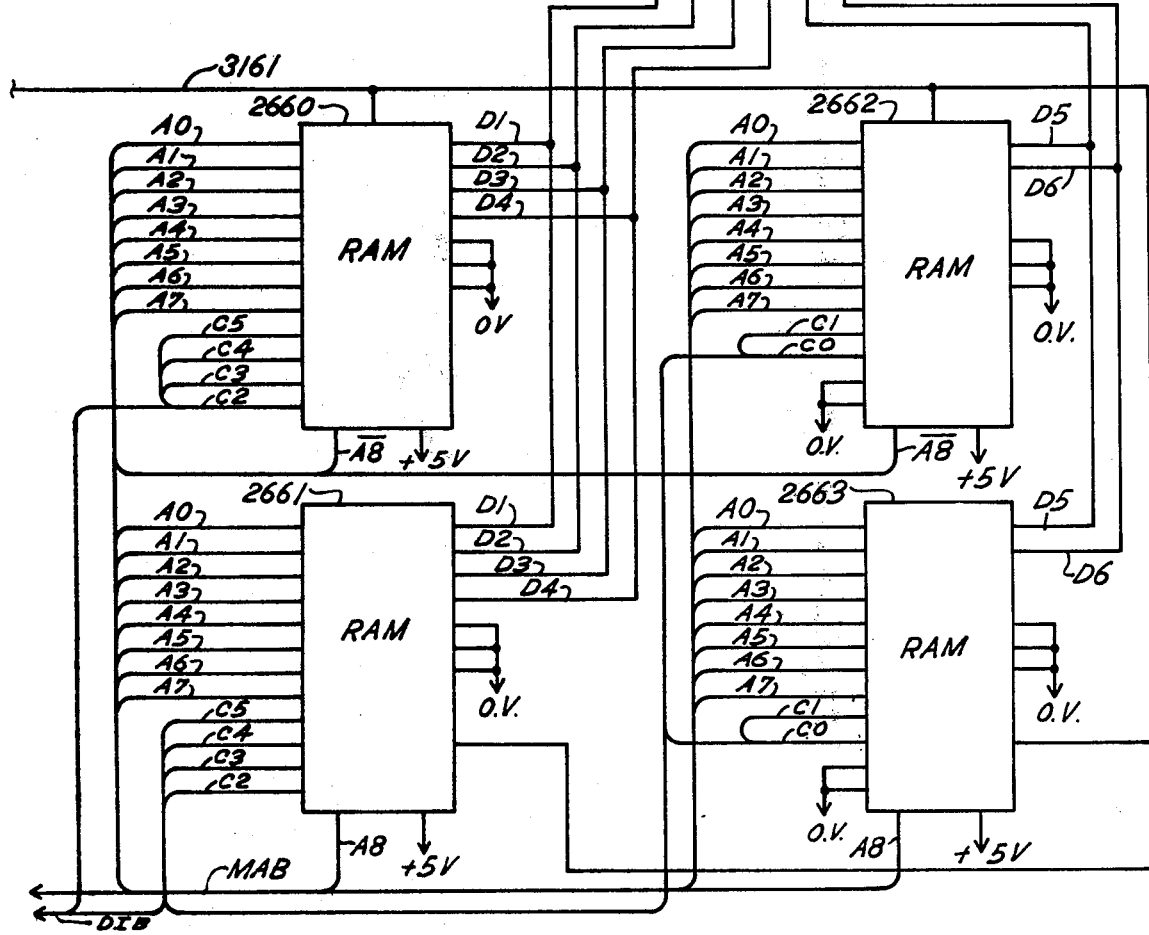
Fig. 35e

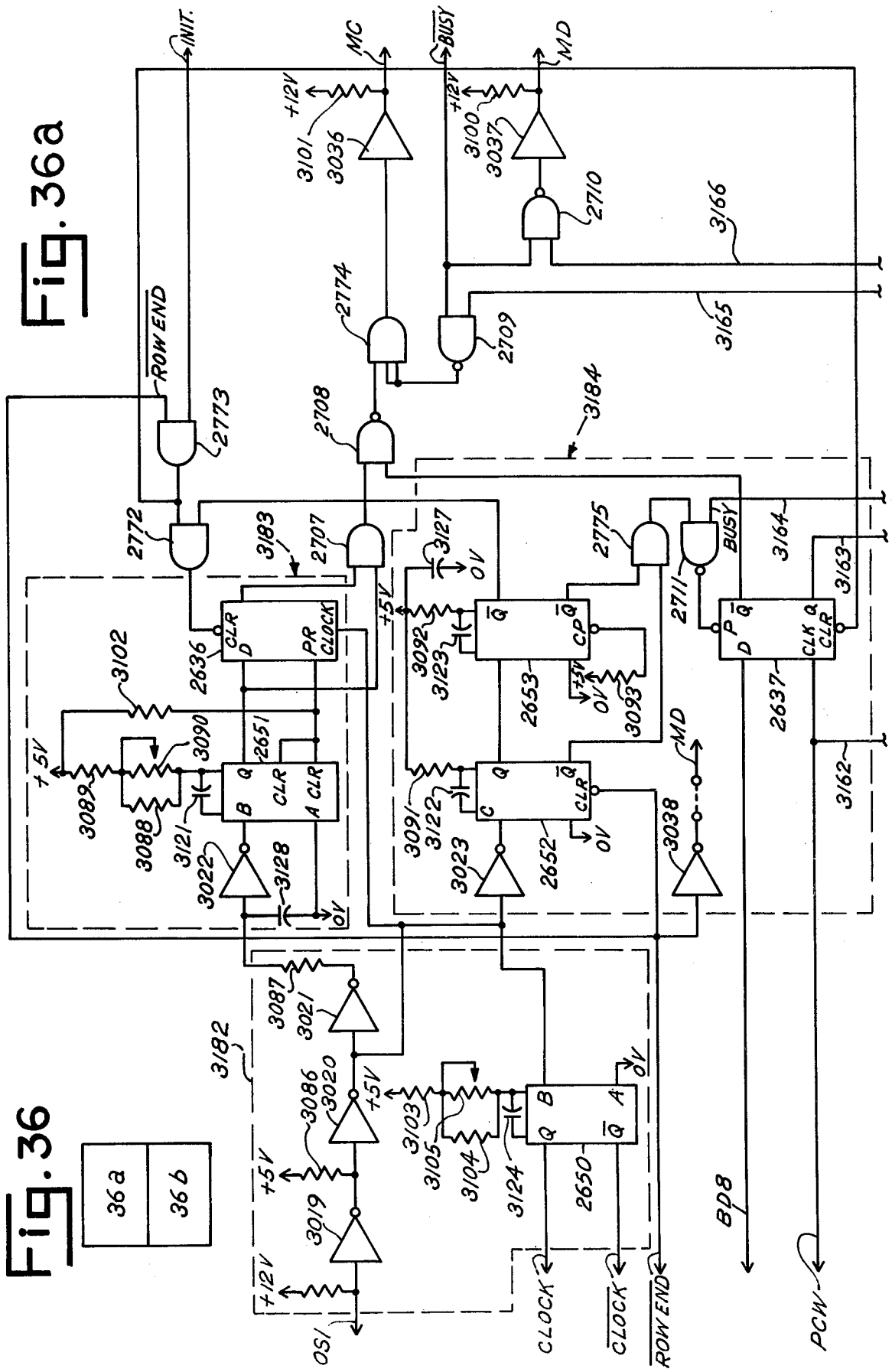

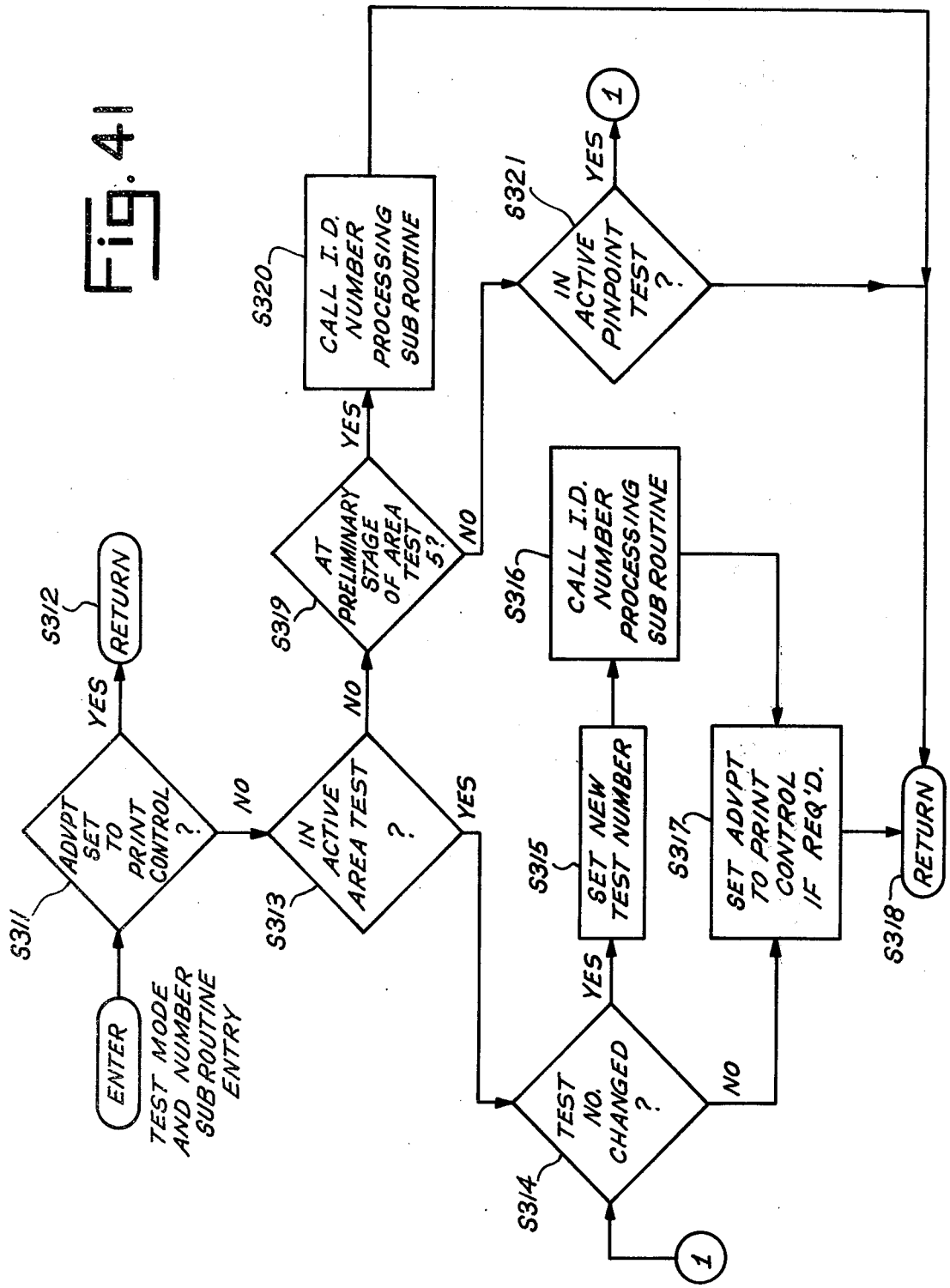

ENGINE TESTER DISPLAY AND PRINTING TECHNIQUES

BACKGROUND AND SUMMARY OF THE INVENTION

This invention relares to internal combustion testing apparatus and methods and more particularly relates to displaying and printing the results of such analysis by digital techniques.

In U.S. application Ser. No. 641,362, entitled "Engine Test and Display Apparatus", filed Dec. 16, 1975, in the names of Cashel et al, a system for display the results of engine analysis on a CRT face is described. Ser. No. 641,362 is now abandoned in favor of Ser. No. 798,181 filed May 18, 1977. Although the system is a major breakthrough in engine analysis, it is incapable of retaining a permanent record of the analysis. For some applications, it is important to retain a permanent record for the files of the system operator or his customers. Although printers for displaying results of engine analysis have been known in the past, each one has exhibited deficiencies which have inhibited its full utilization. For example, the known printers have required a data input system separate and apart from the visual display meters used to display engine analysis results on a real time basis. They also have been unable to call the attention of possible vehicle problems to the operator in a graphic, preselectable manner.

Accordingly, it is an object of the present invention to provide an improved engine analyzer which is capable of visually displaying and printing the resultsof the engine analysis on separate display and printer devices.

Another object is to provide an analyzer of the foregoing type in which the data to be printed is simultaneously displayed and written into a buffer memory of the printer.

Still another object is to provide an analyzer of the foregoing type in which data is simultaneously entered in a buffer memory of a display device and a buffer memory of the printer.

Another object is to provide an analyzer of the foregoing type in which an operator can move a cursor on the display device in order to specify the manner in which the data is to be printed.

Yet another object is to provide an analyzer of the foregoing type in which an operator can designate a portion of the data for special printing and can indicate the portion designated by the display of a problem flag.

Still another object is to provide an analyzer of the foregoing type in which text data can be written to the printer memory independent of the display memory.

Yet another object is to provide an analyzer of the foregoing type in which a message indicating a possible vehicle problem can be printed.

DESCRIPTION OF THE DRAWINGS

These and other object and features of the present invention will hereafter appear in connection with the accompanying drawings wherein like numerals refer to like parts throughout and wherein:

FIGS. 2 and 3 are schematic diagrams of an ignition system of the engine shown in FIG. 1 connected to a system block diagram of a preferred form of the present invention;

FIGS. 4 and 5 are timing diagrams showing the manner in which data is transmitted and received by the data processor of the present invention;

FIG. 11 is a schematic diagram of a voltmeter circuit made in accordance with the invention;

FIG. 12 illustrates the manner in which FIGS. 12a–12f should be arranged;

FIGS. 12a–12f, taken together as in FIGS. 12, are schematic diagrams of a preferred form of analog system made in accordance with the present invention;

FIG. 13 illustrates the manner in which FIGS. 13a–13c should be arranged;

FIGS. 13a–13c, taken together as in FIG. 13, are schematic diagrams of a preferred form of cylinder selection circuit made in accordance with the present invention;

Figure 1:
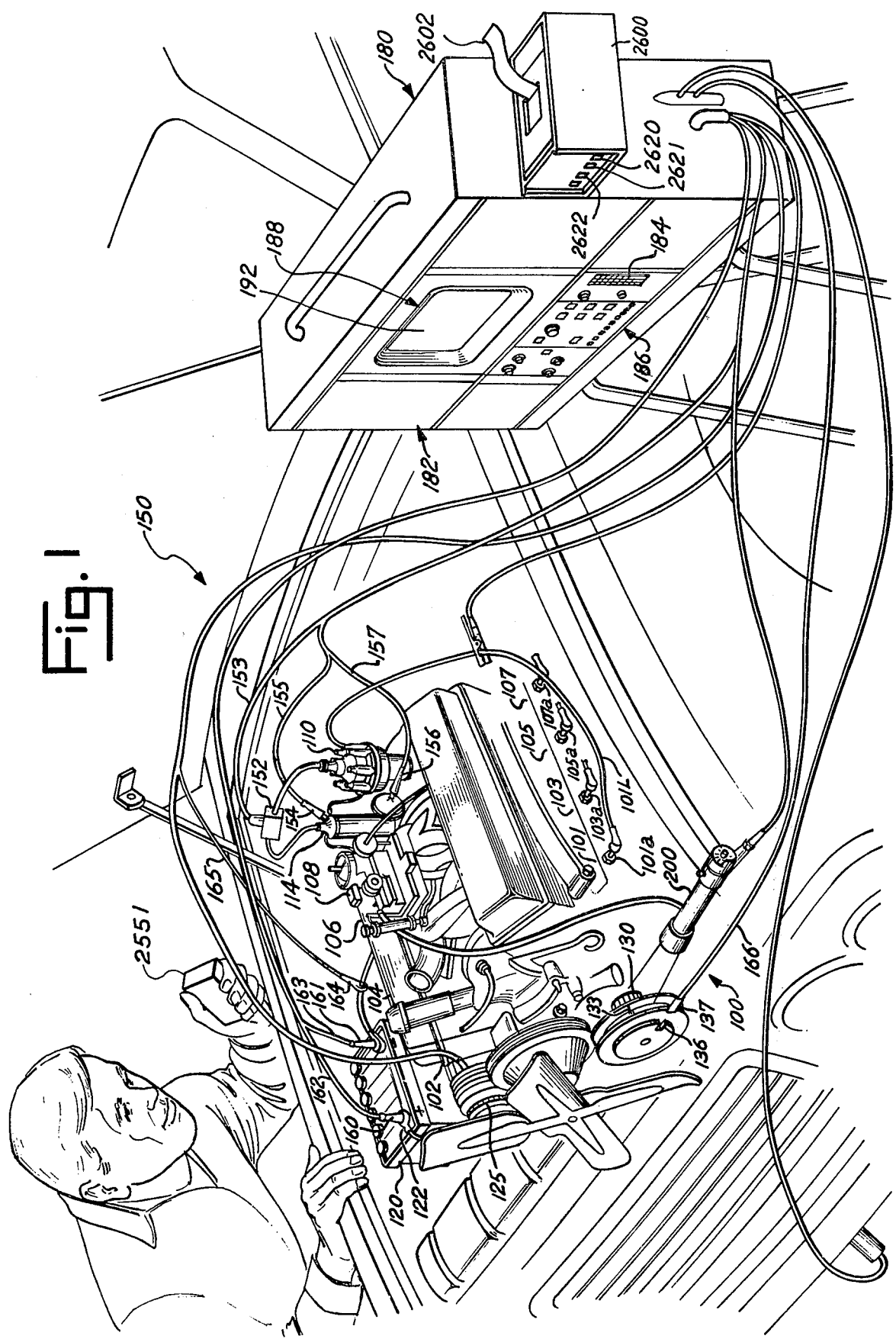
FIG. 1 is a perspective view of an internal combustion engine that is connected to a preferred form of the present invention.
Figure 13A:
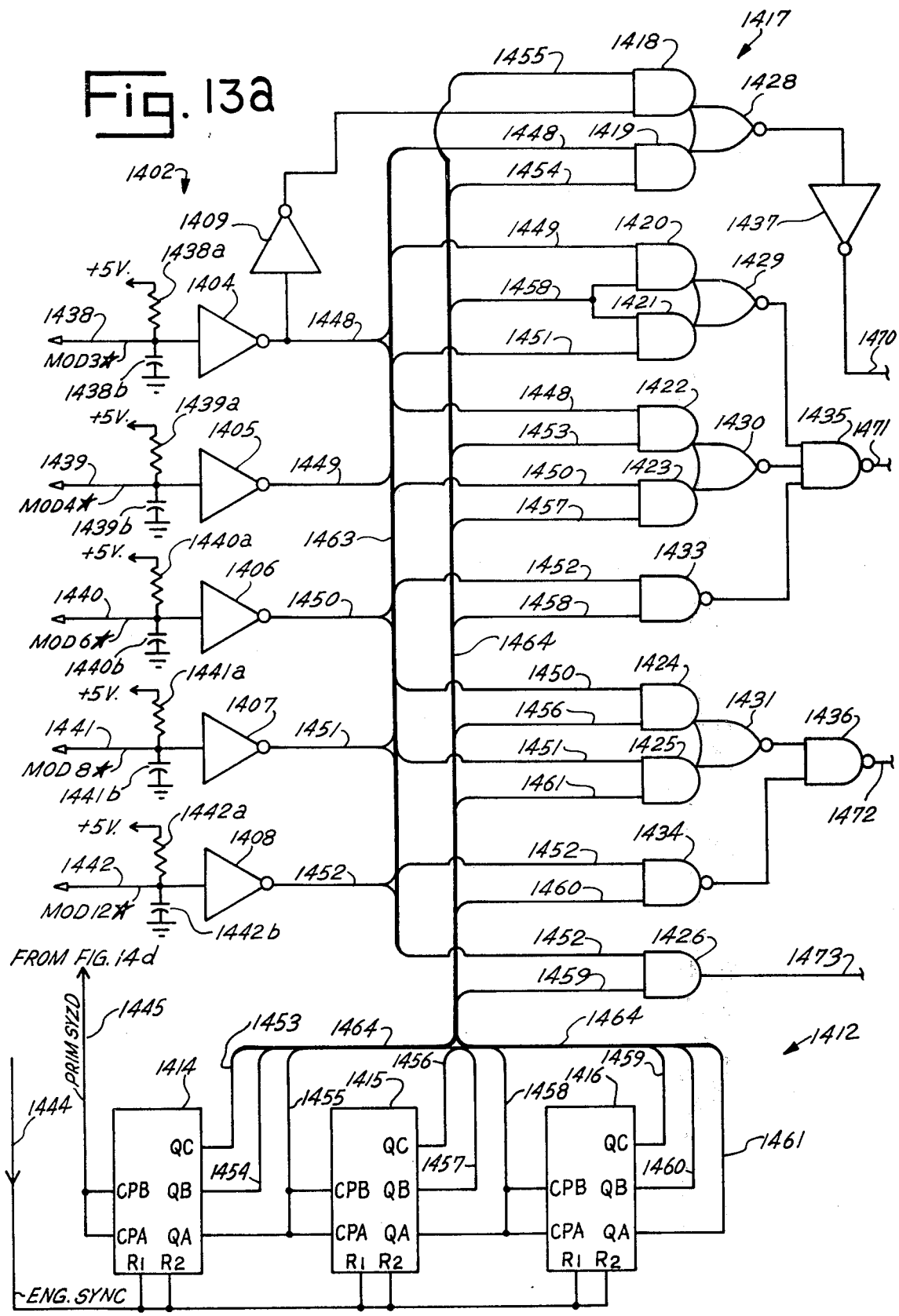
Figure 14D:
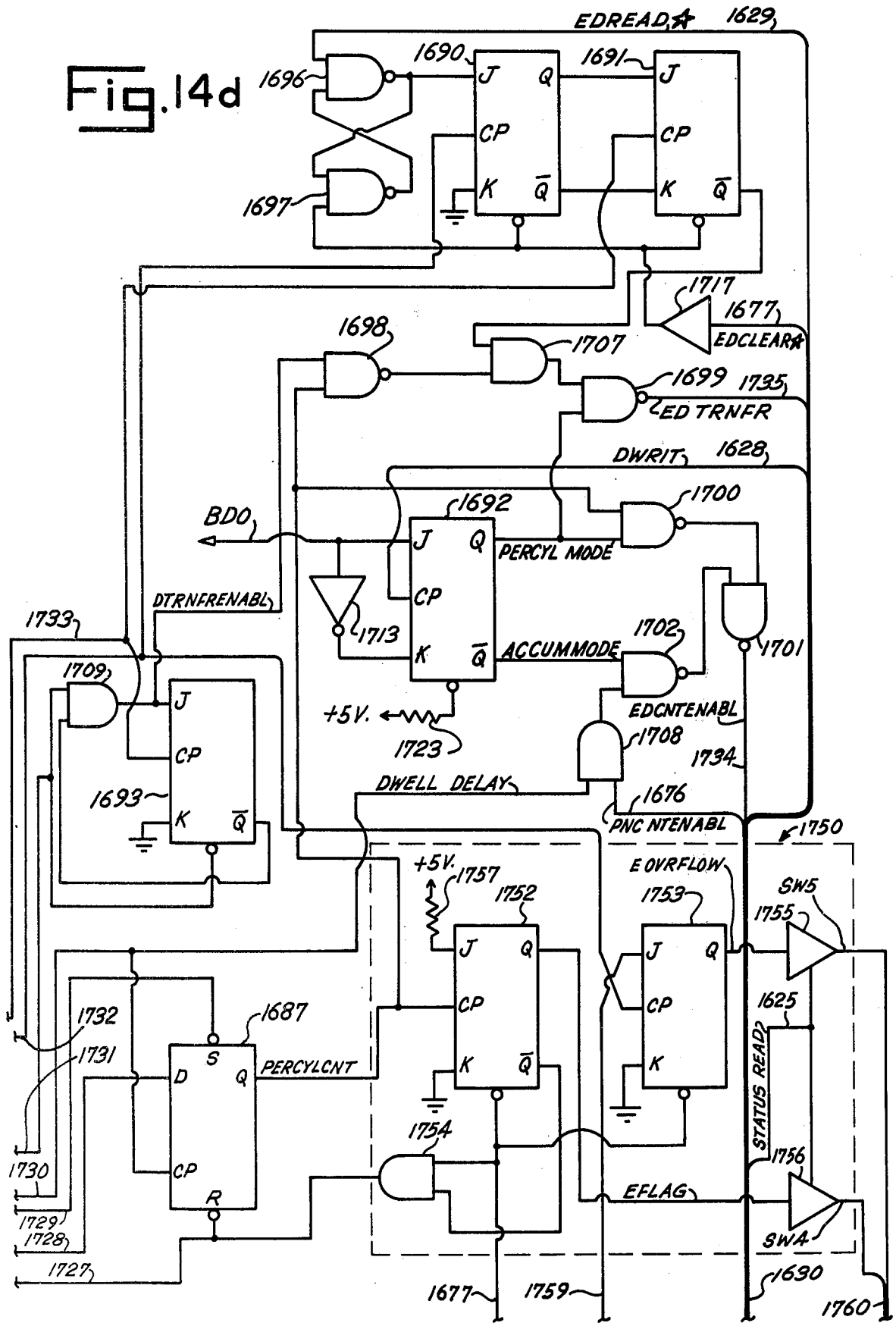
FIG. 14 illustrates the manner in which FIGS. 14a–14f should be arranged.
Figure 14E:
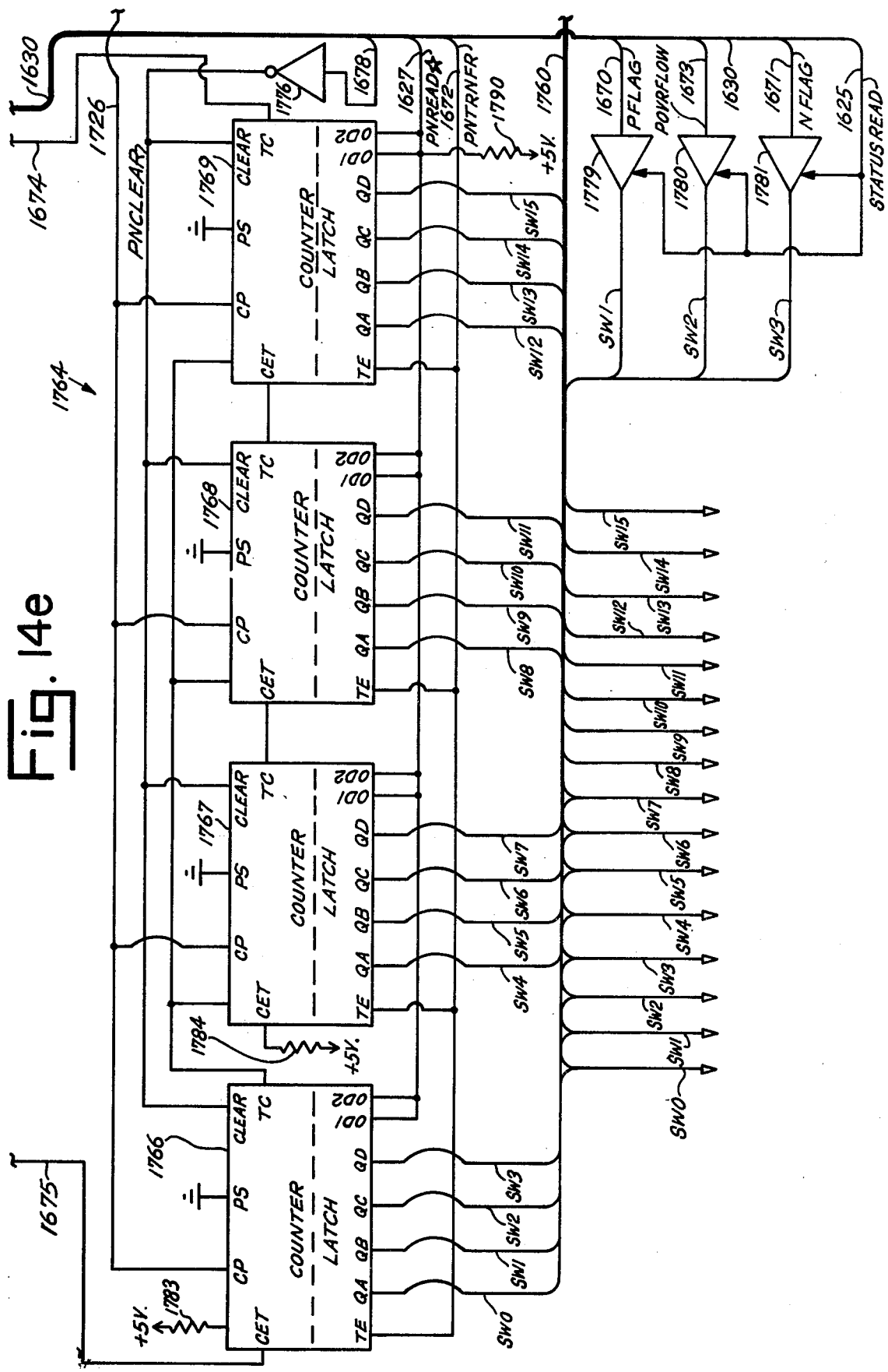
Figure 14F:
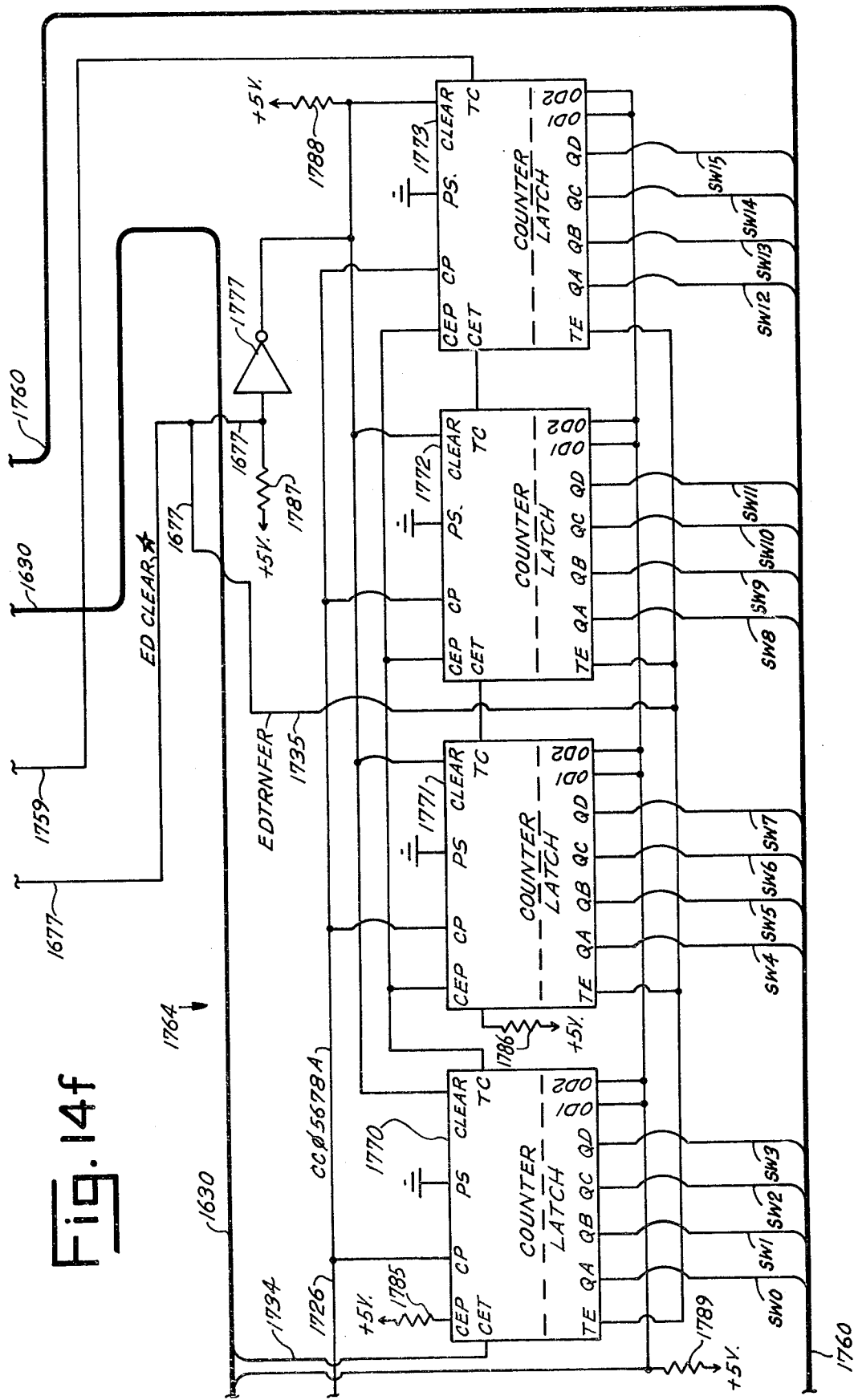
Figure 14G:
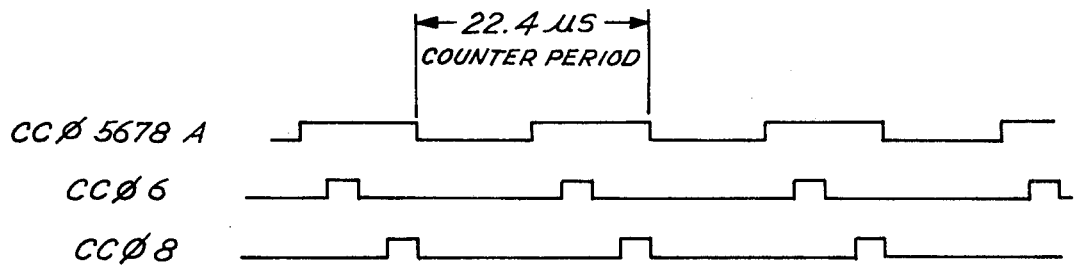
Figure 14H:
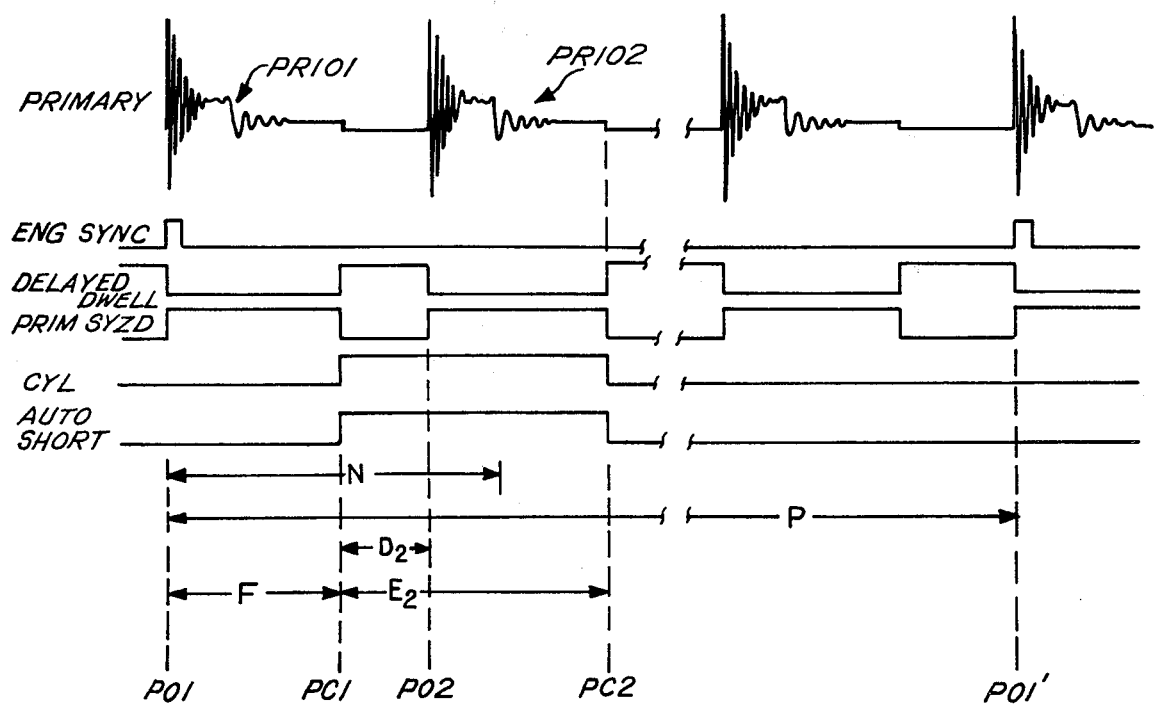
Figure 15C:
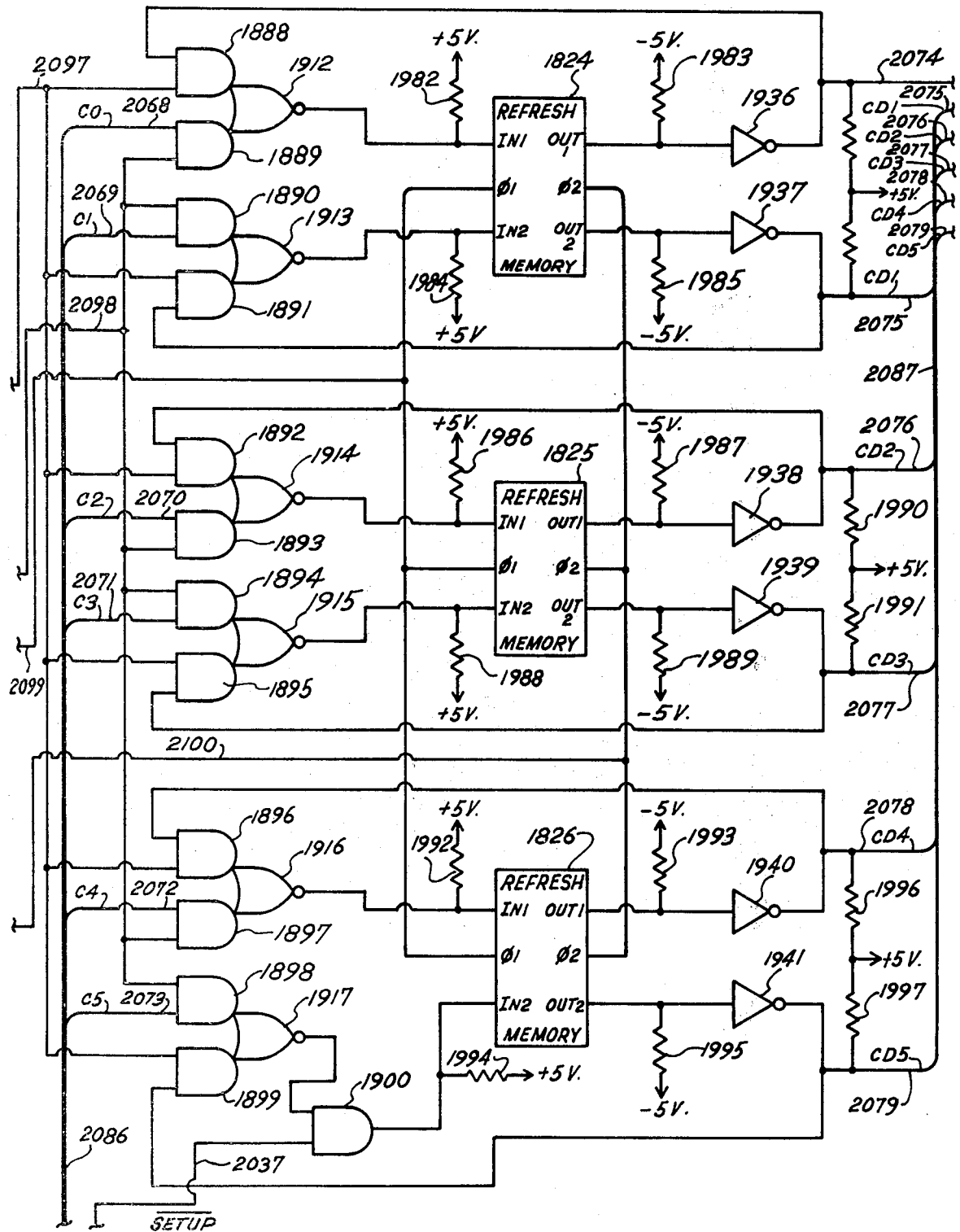
Figure 15D:
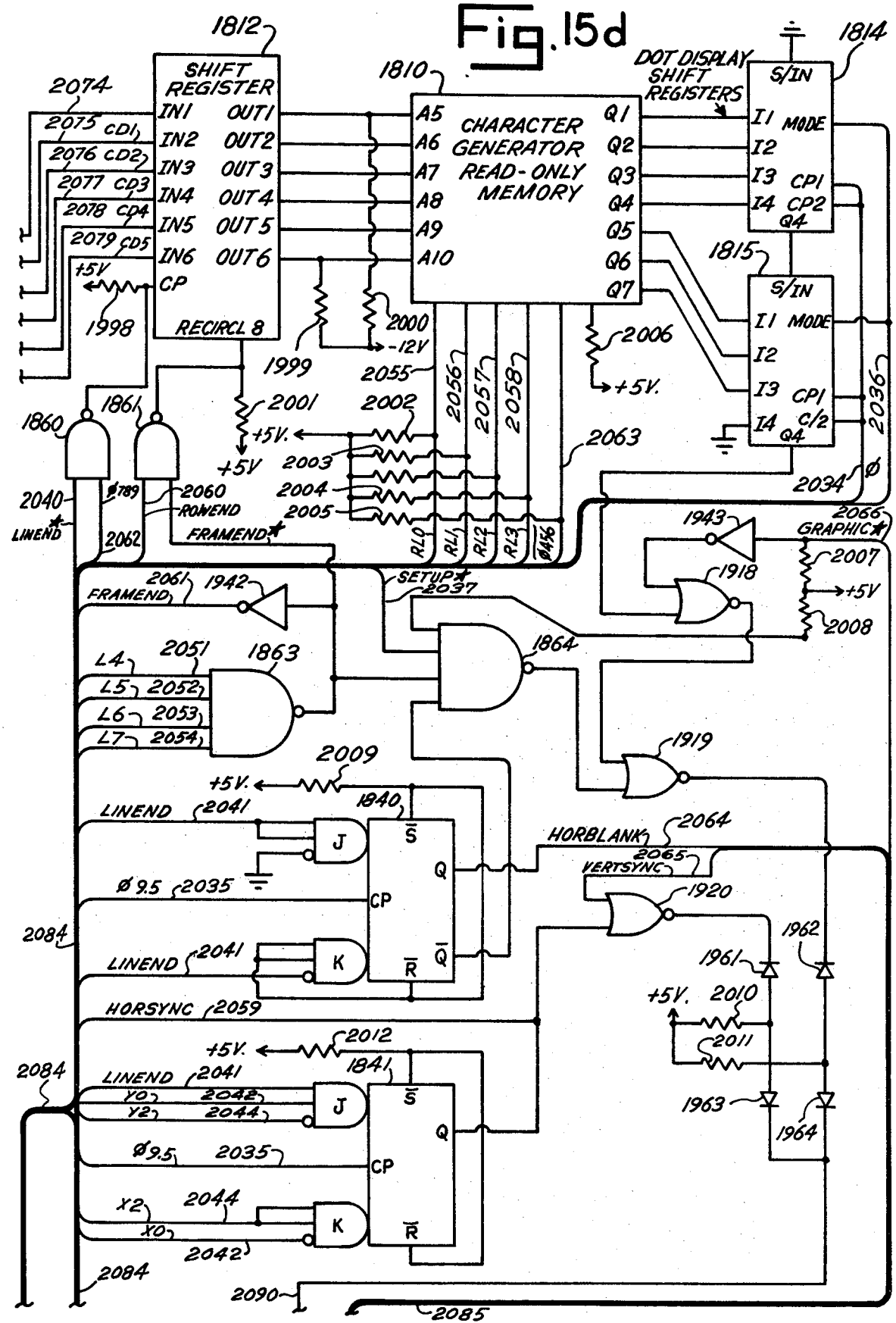
Figure 16:
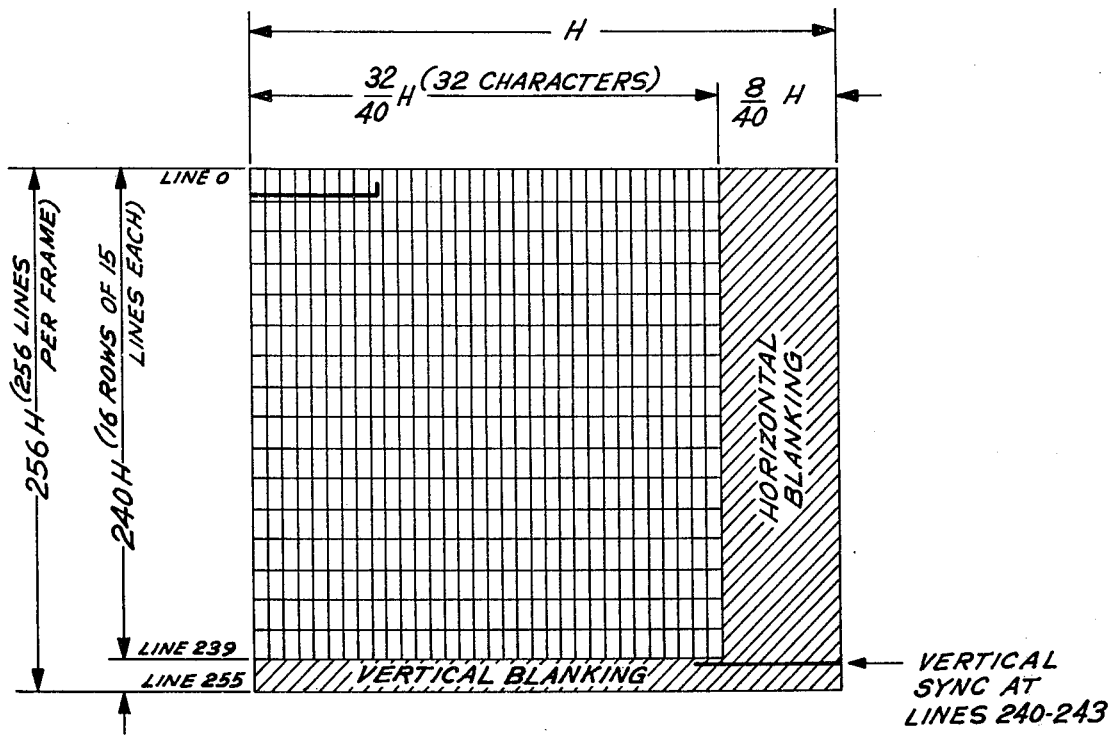
Figure 18:
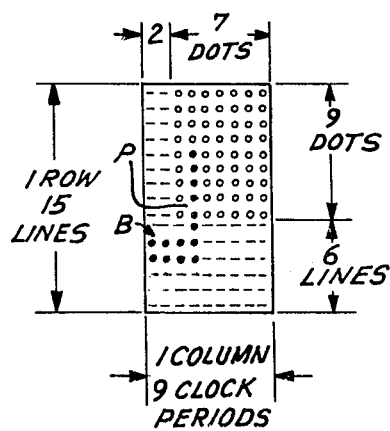
Figure 17:
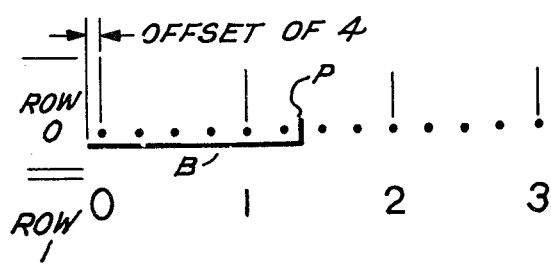
Figure 22:
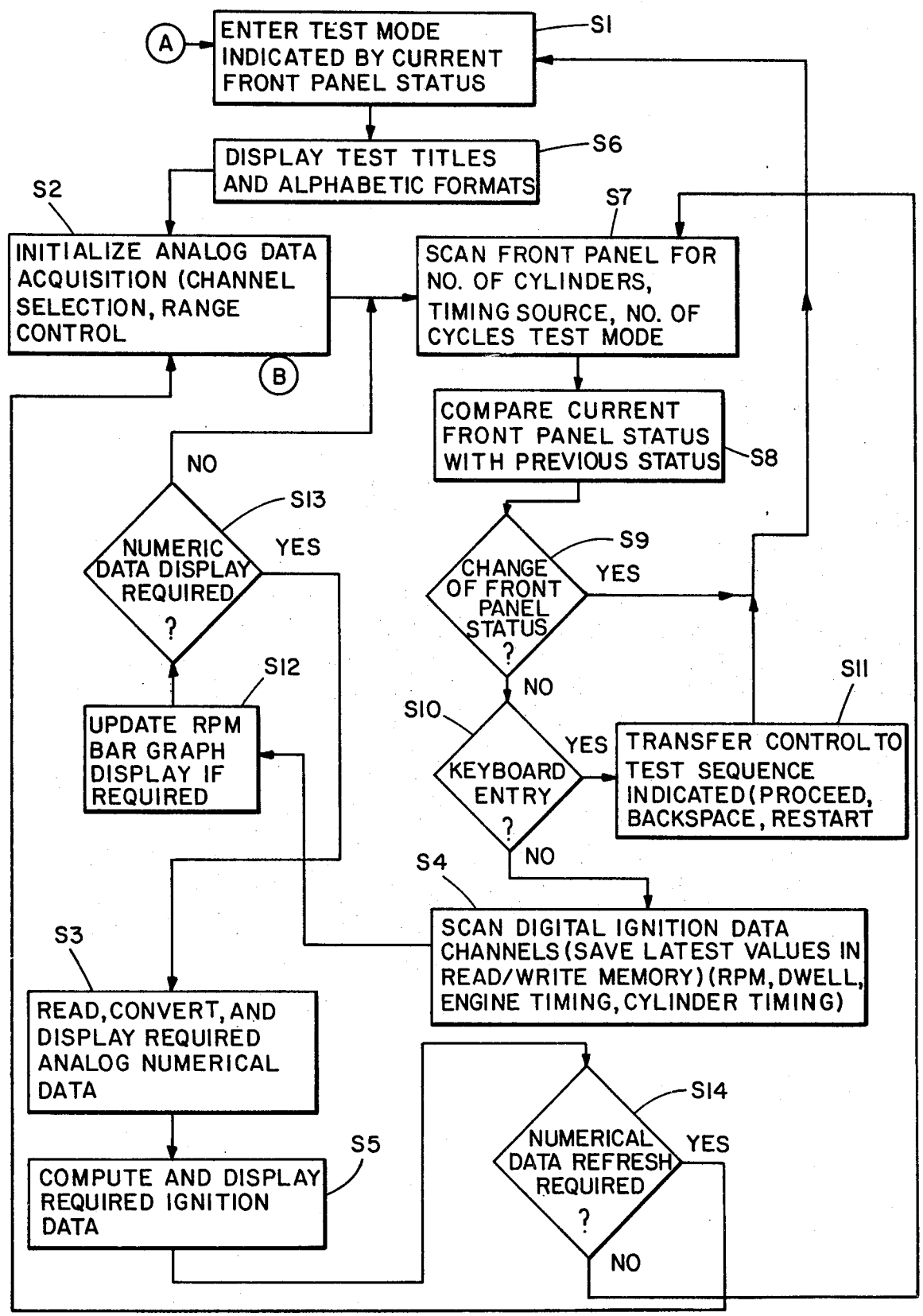
Figure 31:
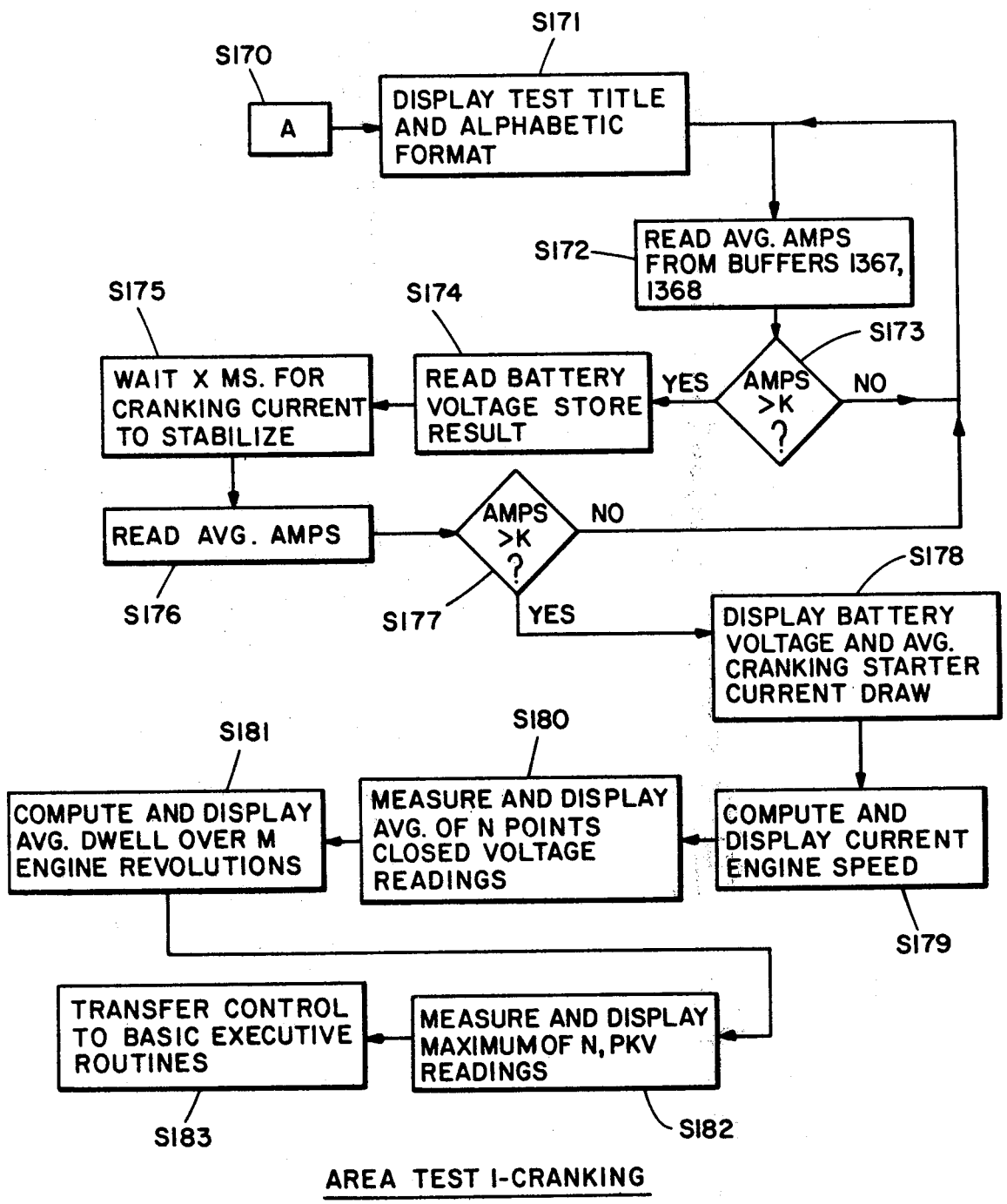
Figure 32:
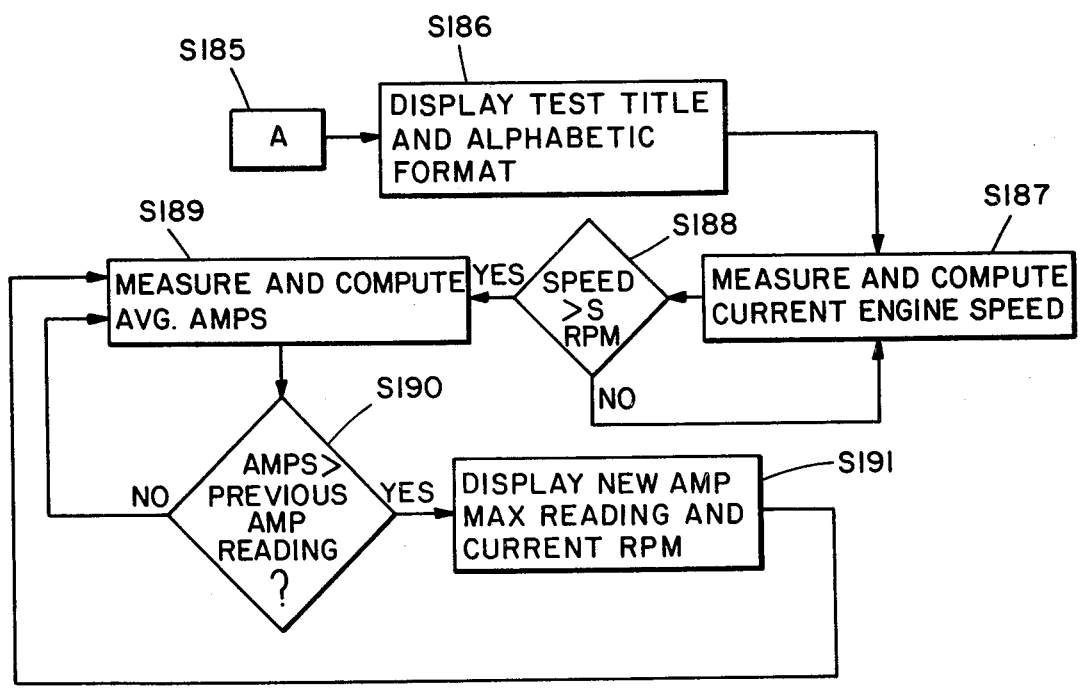
Figures 34, 37:
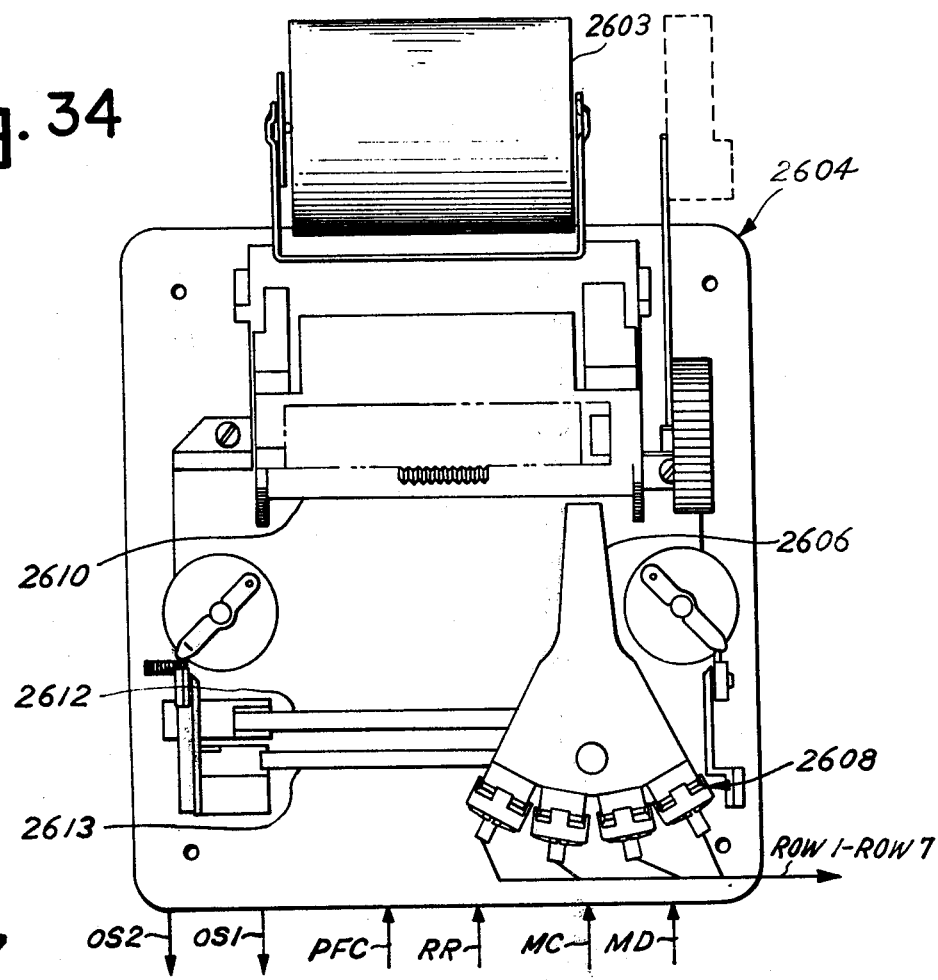
Figure 35D:
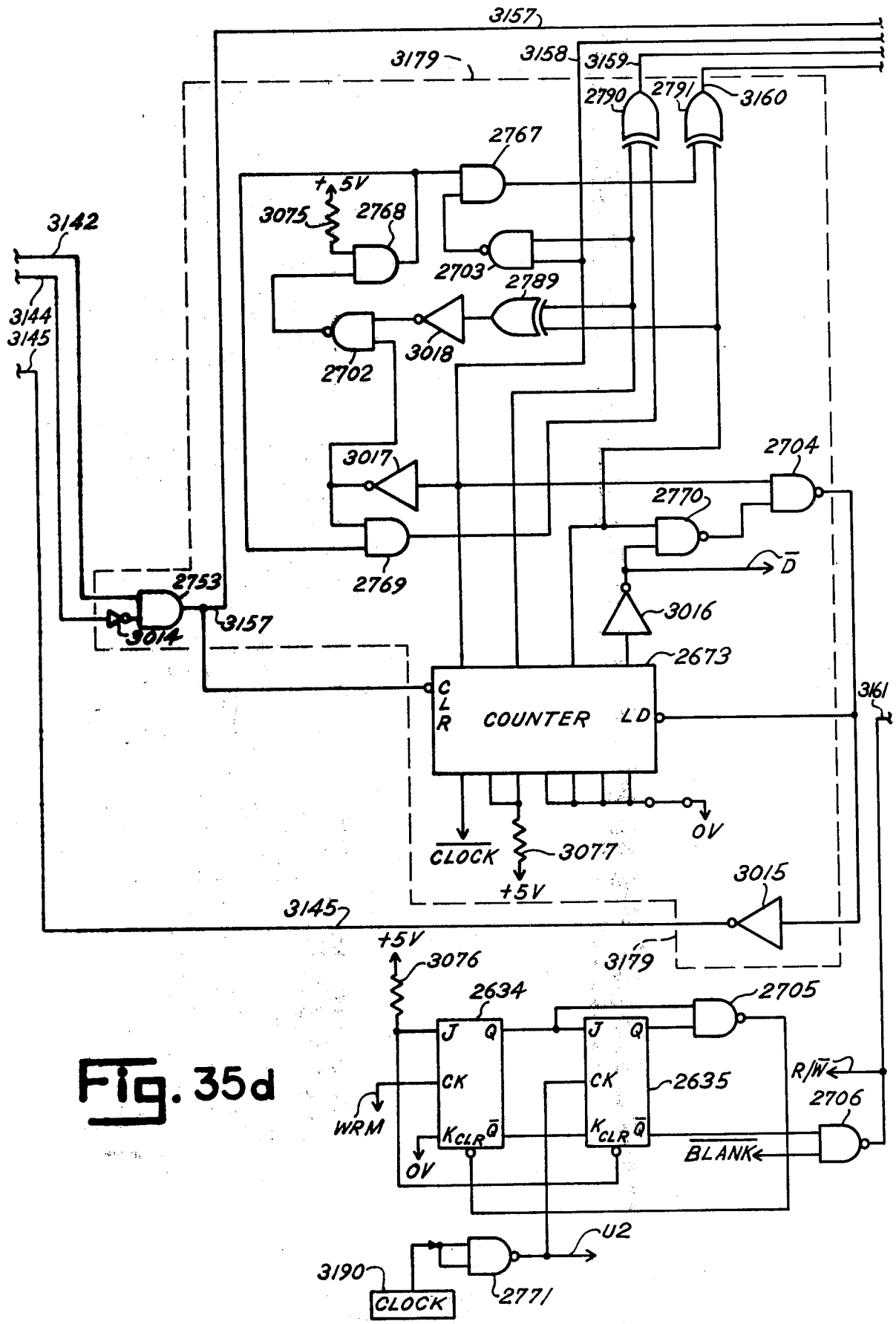
Figure 36B:
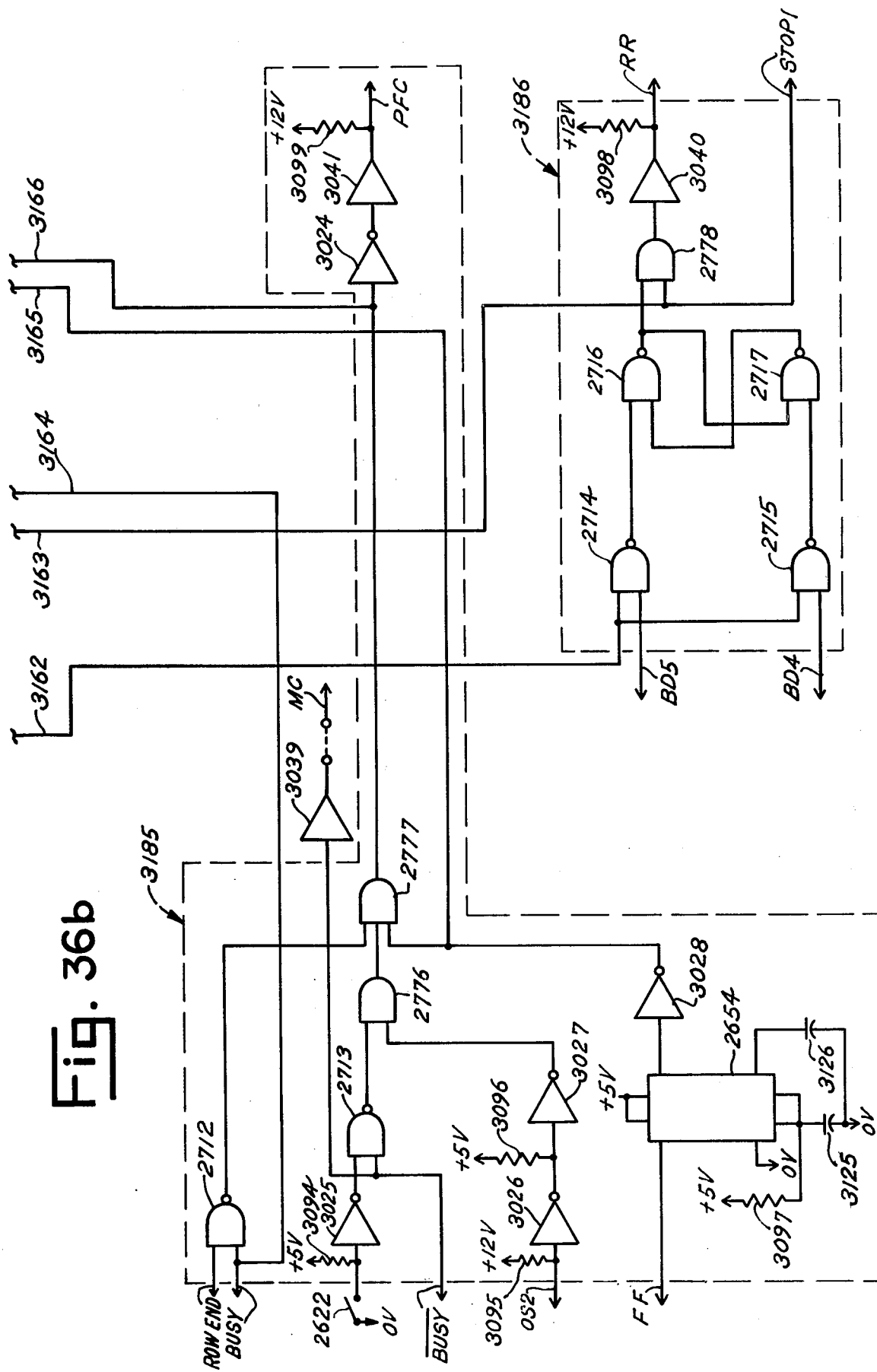

FIGSl 14a–14f taken together as in FIG. 14, are schematic diagrams of a preferred form of a counting and cylinder control sysftem made in accordance with the invention;

FIG. 14g illustrates exemplary clock pulses generated by the circuit shown in FIG. 14c;

FIG. 14h illustraes exemplary voltage waveforms produced by the circuits shown in FIGS. 13a–13c and FIGS. 14a–14f;

FIG. 14i illustrates exemplary voltage waveforms used to control the generation of P and N numbers in the counters of circuits 1776–1769;

FIG. 15 illustrates the manner in which FIGS. 15a–15e should be arranged;

FIGS. 15a–15e, taken together as in FIG. 15, are schematic diagrams of a preferred form of a character controller made in accordance with the present invention;

FIG. 16 is a schematic illustration of the manner in which the CRT display shown in FIG. 1 is divided by scanning into rows and columns;

FIG. 17 is an enlarged plan view of a preferred form of a graphical RPM bar as displayed on the CRT;

FIG. 18 is an enlarged view of the righthand end of the RPM bar shown in FIG. 16e;

FIG. 19a is a plan view of a preferred form of front control panel for use in the present invention;

FIG. 19b is a schematic diagram of a preferred form of the keyboard shown in FIG. 17a;

FIGS. 20a–20c are schematic diagrams of a preferred form of front panel interface circuit made in accordance with the invention;

FIG. 21 is a logic schematic diagram of a preferred form of remote control circuitry made in accordance with the invention;

FIG. 22 is a flow chart illustrating the basic executive control sequence executed by the data processor;

FIG. 23 is a flow chart illustrating the analog-to-digital converter data acquisition and display program segment executed by the data processor;

FIG. 24 is a flow chart illustrating the manner in which the data processor acquires the P, N and accumulated D numbers and displays the RPM, average dwell and engine timing parameters calculated from the numbers;

FIG. 25 is a flow chart illustrating the overall operation of the system;

FIG. 26 illustrates the format displayed on the CRT screen during step S140 of the flow chart shown in FIG. 25;

FIG. 27 illustrates the format displayed on the CRT screen during step S141 of the flow chart shown in FIG. 25;

FIG. 28 illustrates the format displayed on the CRT screen during step S142 of the flow chart shown in FIG. 25;

FIG. 29 illustrates the format displayed on the CRT screen during step S143 of the flow chart shown in FIG. 25;

FIG. 30 illustrates the format displayed on the CRT screen during area test one;

FIG. 31 is a flow chart describing the program segment executed by data processor during area test one;

FIG. 32 illustrates the format displayed on the CRT screen during area test two;

FIG. 33 is a flow chart illustrating the program segment executed by the data processor during area test two;

FIG. 34 is a fragmentary, top plan view of a Victor IPM-130 Print Mechanism adapted for use in the present invention;

Figure 35C:
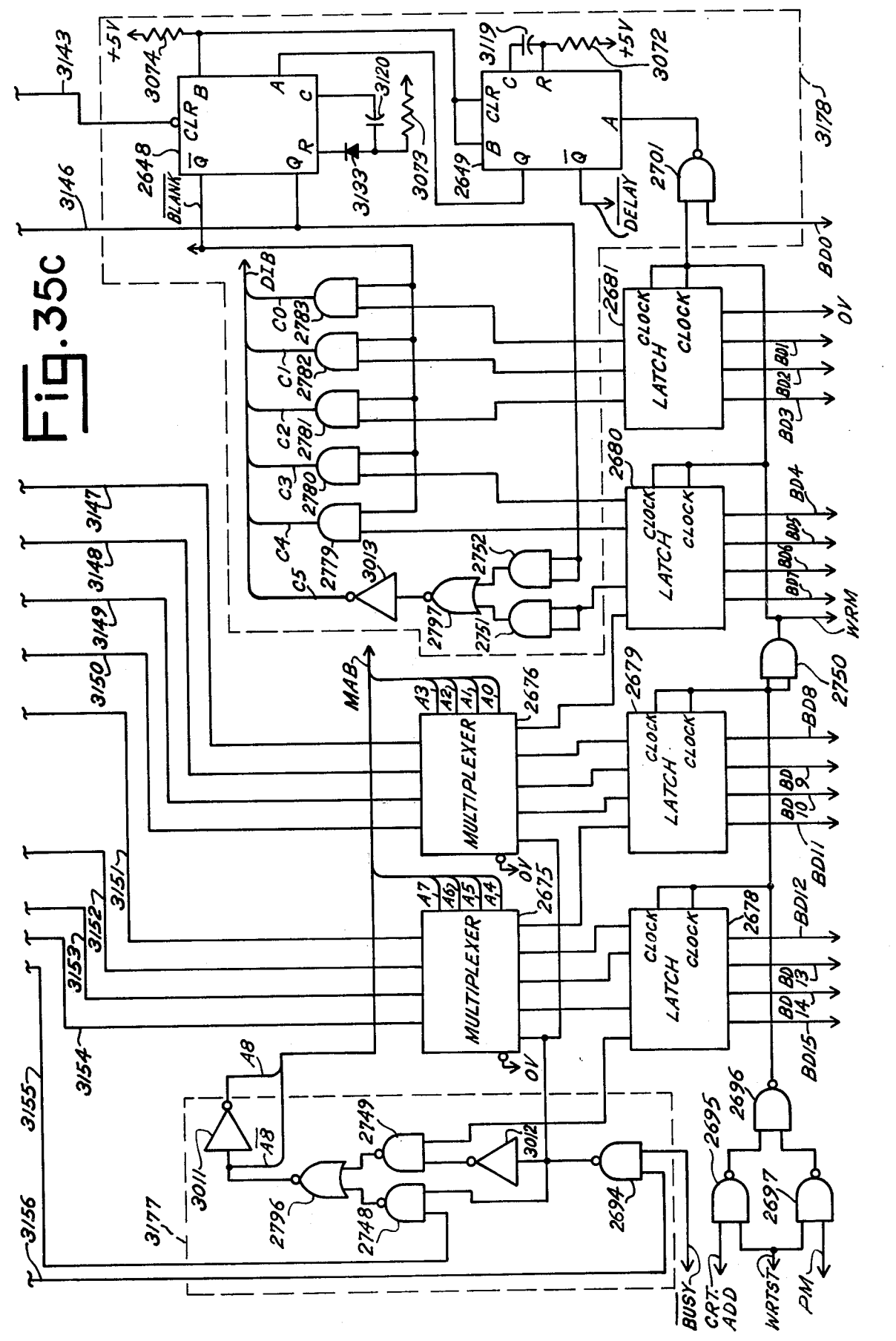

FIG. 35 illustrates the manner in which FIGS. 35a–35e should be arranged;

FIGS. 35a–35e, taken together as in FIG. 35, are schematic diagrams of a portion of a preferred form of printer controller made in accordance with the invention;

FIG. 36 illustrates the manner in which FIGS. 36a and 36b should be arranged;

FIGS. 36a and 36b are schematic diagrams of a portion of a preferred form of printer controller made in accordance with the invention;

FIGS. 37–39 illustrate various formats displayed by the CRT face and/or printed during area test one;

FIGS. 40–43b are flow charts illustrating the program segment executed by the data processor for printer and display control; and FIGS. 44 and 45 illustrate two formats displayed by the CRT face and/or printed during area test two.

DESCRIPTION OF THE PREFERRED EMBODIMENT

Introduction

Figure 2:
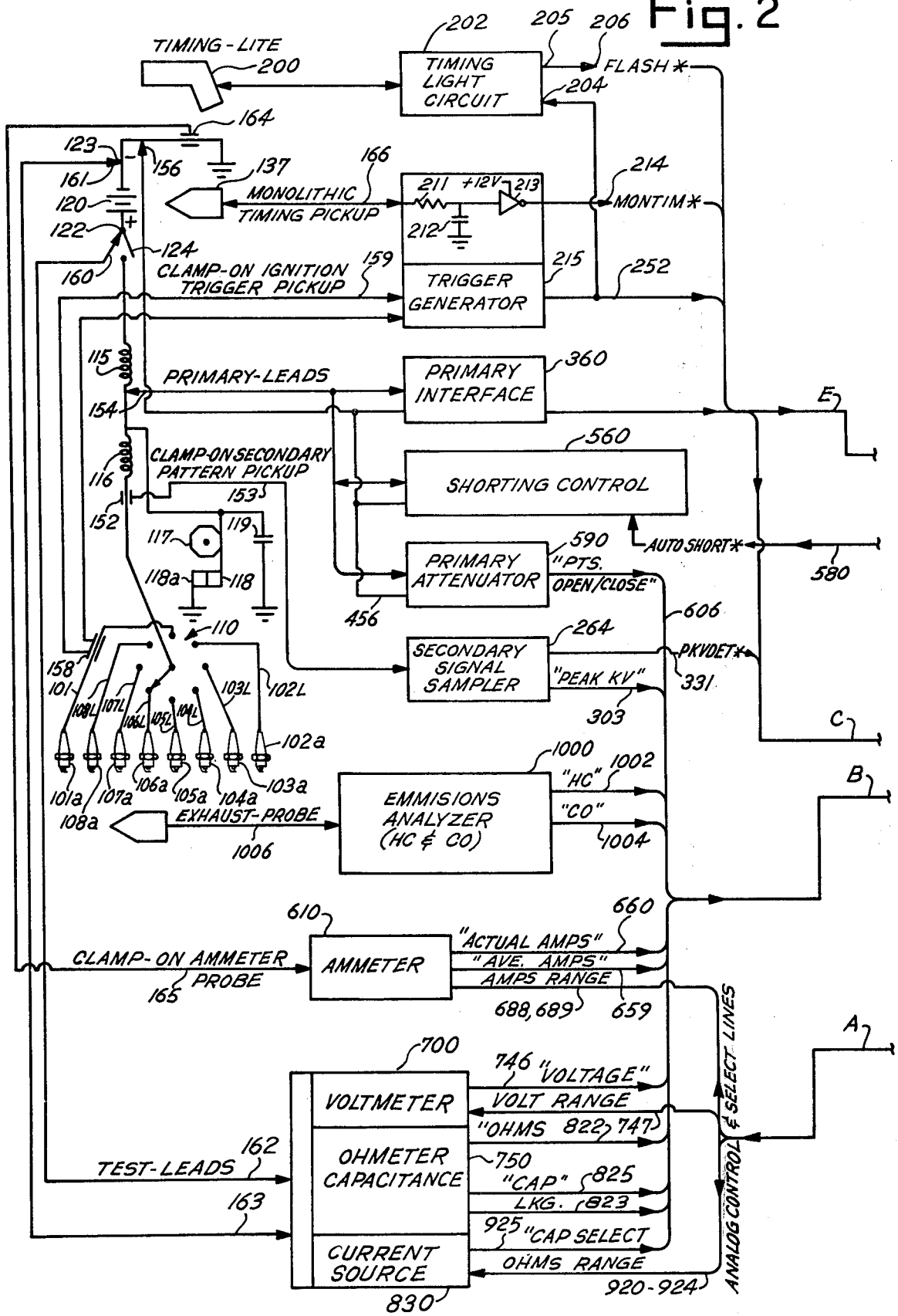

Referring to FIGS. 1, 2, and 3, the parameters of an exemplary V-8 internal combustion engine 100 can be displayed and printed by the present invention. A schematic diagram of the ignition system of engine 100 is shown in FIG. 2.

Engine 100 comprises cylinders or ignition chambers 101–108 which are fitted with spark plugs or ignitors 101a–108a. The invention also can be used with a Wankel-type engine which uses firing chambers rather than cylinders. Spark plugs 101a–108a are connected to a distributor 110 by spark plug leads 101L–108L, respectively. Distributor 110 includes a rotor 112 which distributes high voltage ignition signals to each of the spark plugs in a defined sequence. The rotor receives high voltage ignition signals from a coil assembly 114 comprising a primary coil 115 that is magnetically coupled to a secondary coil 116. Voltage signals are generated in the primary coil by an 8-sided cam 117 which is mechanically rotated in synchronism with engine 110 in order to periodically open and close contact points 118, 118a. A conventional distributor capacitor 119 is connected across conact points 118, 118a. The primary coil voltage induces in the secondary coil high voltage ignition or firing sgnals or pulses which fire the spark plugs sequentially.

Electrical powder is supplied to the ignition system by a conventional 12-volt battery 120 having a positive terminal 122 and a negative terminal 123. An ignition switch 124 is connected in series between the battery and primary coil 115, and an alternator 125 charges battery 120.

Although engine 100 is shown with a conventional mechanical contact point ignition system, it should be understood that the present invention can be used to diagnose more sophisticated ignition systems in which electronic or semi-conductor switches are used in place of contacts 118, 118a.

Engine timing marks 130 are fixed to the block of the engine and cooperate with a damper mark 133 on the rotating engine vibration damper 132 in order to properly time the firing of the spark plugs. The engine damper also can include a slot 136, the position of which can be detected by a conventional magnetic pick-up 137 that produces a change in voltage when slot 136 moves past the location of the pick-up. Such devices are well-known in the art and need not be described in detail. Basically, they comprise an electronic circuit typically fabricated on a single or monolithic chip of silicon, and are therefore, commonly referred to as "monolithic" pick-ups.

A preferrred form of the present invention which can be used to diagnose an engine of the above-described type basically comprises a cable assembly 150, a case assembly 180, a display monitor 190, including a cathode ray tube (CRT) face 192, a timing light 200, a timing light circuit 202, a monolithic input circuit 210, a trigger generator 215, a primary interface circuit 360, a primary attenuator 590, an ammeter circuit 610, a voltmeter circuit 700, a data processor 1090, a read-only memory 1094, a processing bus 1096, an analog control system 1100, a counting and cylinder control system 1400, a character controller 1800, a graphic controller 2130, a front panel interface circuit 2240, a remote controller 2550, and a printer system 2600, including an impact printer 2604 and a printer controller 2630.

The system can be approximately divided into the functions of (1) data acquisition, (2) acquisition control, (3) display and printing and (4) system processing and management. The function performed by each of the basic circuits is shown in TABLE A:

TABLE A

| DATA ACQUISITION | ACQUISITION CONTROL | DISPLAY & PRINTING | SYSTEM PROCESSING & MANAGEMENT |
|---|---|---|---|
| Cable | Analog Control | Display | Data Processor 1090 |

TABLE A-continued

| DATA ACQUISITION | ACQUISITION CONTROL | DISPLAY & PRINTING | SYSTEM PROCESSING & MANAGEMENT |
|---|---|---|---|
| Assembly 150 | System 1100 | Monitor 190 | |
| Timing Light 200 | Control System 1400 | Character Controller 1800 | Read-Only Memory 1094 |
| Timing Light Circuit 202 | Front Panel Interface 2240 | Graphic Controller 2130 | Processing Bus 1096 |
| Monolithic Input Circuit 210 | Remote Controller 2550 | Impact Printer 2604 | |
| Trigger Generator 215 | | Printer Controller 2630 | |
| Primary Interface 360 | | | |
| Primary Attenuator 590 | | | |
| Ammeter Circuit 610 | | | |
| Voltmeter Circuit 700 | | | |

In general, the preferred system made in accordance with the present invention is capable of conducting area tests in order to locate a general area of malfunction of the engine. As the operator pushes a PROCEED button on keyboard 184, the system automatically evaluates the engine in the areas of cranking and idle. As each area test is conducted, the critical parameters of the engine are measured and displayed on CRT face 192. The part of the system is fully described in U.S. application Ser. No. 641,362, entitled "Engine Test And Display Apparatus", filed Dec. 16, 1975, in the names of Cashel et al, which is incorporated by reference. Only the essential matter from that application is repeated in this specification. It has been discovered that the system described in the Cashel et al application can be combined with a novel printer and controller in order to achieve the objects of the present invention.

In order to completely describe the system, including the printer, the data acquisition will first be discussed in detail. Then the data processor 1090 and processing bus 1096 will be described so that the mode of operation of the analog control system 1100 and the counting and cylinder control system 1400 can be understood. The display circuits will then be described in detail, followed by a discussion of the front panel interface and remote controller which enable the operator to interface with the overall system. The programmed instructions stored in read-only memory 1094, which control the overall operation of the display portion of the system, then will be described. The printer structure and the portion of the instructions which enable the cooperation of the display monitor and printer will conclude the specification.

CABLE ASSEMBLY 150

Referring to FIGS. 1 and 2, cable assembly 150 comprises a secondary pattern pick-up 152 which is a capacitive attenuator capable of reducing the high voltage signal at the secondary coil to appropriate levels that can be handled by the amplifiers of the secondary signal sampler. After the secondary signal has been attenuated by the pick-up by a factor of about 213:1, the attenuated signal is transmitted to he secondary signal sampler over lead 153.

The primary signal is sampled by a primary clip 154 and a lead 155, as well as a clip 156 and a lead 157 which are connected to chassis ground.

A clamp-on trigger pick-up 158 is normally clipped around the spark plug lead for the number 1 cylinder (e.g., lead 101L) and generates signals each time the number 1 spark plug (i.e., plug 101a) is fired. The signals are transmitted through conductors 159, 159a to the trigger generator.

During area tests, test clips 160, 161, which conduct signals through leads 162 and 163, respectively, are normally connected to the battery with the polarity shown. However, the leads can be used to measure voltage drops across any two points in the automotive system, and the leads also are used for conducting ohmeter and coil/condenser tests.

An ammeter probe 164 is normally connected around one lead of battery 120. The probe is a Hall effect transducer that can be used to sense the fluctuations in the DC current flowing into or out of the battery. The probe has a polarity indicator which is necessary to determine the direction of current flow. Such devices are well-known in the art and need not be described in detail. The signal generated by the ammeter probe is conducted to the ammeter circuit by lead 165.

A lead 166 is connected from the monolithic timing pick-up 137 to the monolithic input circuit 210.

CASE ASSEMBLY 180

Referring to FIG. 1, case assembly 180 comprises a front panel 182 that includes a keyboard 184 for reading the digits 0–9 into the system. The panel also includes a control switch assembly 186 which performs various input control functions.

The case assembly is fitted around a conventional display monitor 190, such as Model XM-702-72 manufactured by Motorola Corp., Chicago, Illinois. The monitor has a cathode ray tube with a display face 192, for displaying data in alphabetic, numeric or graphical form.

TIMING LIGHT 200 AND TIMING LIGHT CIRCUIT 202

Referring to FIG. 2, timing light 200 is a conventional device for producing a brilliant flash of light in order to illuminate the timing marks on engine 100. Such devices are well-known in the art and need not be described in detail.

Timing light circuit 202 contains an adjustable delay circuit which flashes the light and generates a FLASH* pulse after an ENG. SYNC* pulse is received at input 204. The operator adjusts the amount of delay in the delay circuit until the flash occurs as timing mark 133 coincides with the 0 advance or top-dead-center line of marks 130. Such circuitry is well-known in the art and need not be described in detail. One circuit is described in U.S. Pat. No. 3

MONOLITHIC INPUT CIRCUIT 210

Monolithic input circuit 210 comprises a resistor 211, a capacitor 212, an inverting amplifier 213, and an output conductor 314, connected as shown (FIG. 2).

TRIGGER GENERATOR 215

Trigger Generator 215 is used to generate an ENG. SYNC* pulse at the time the no. 1 cylinder of the engine is fired. (Throughout this specification, an asterisk (*) is used to identify the inverse or complement of a pulse of signal identified without an asterisk.)

Figure 6:
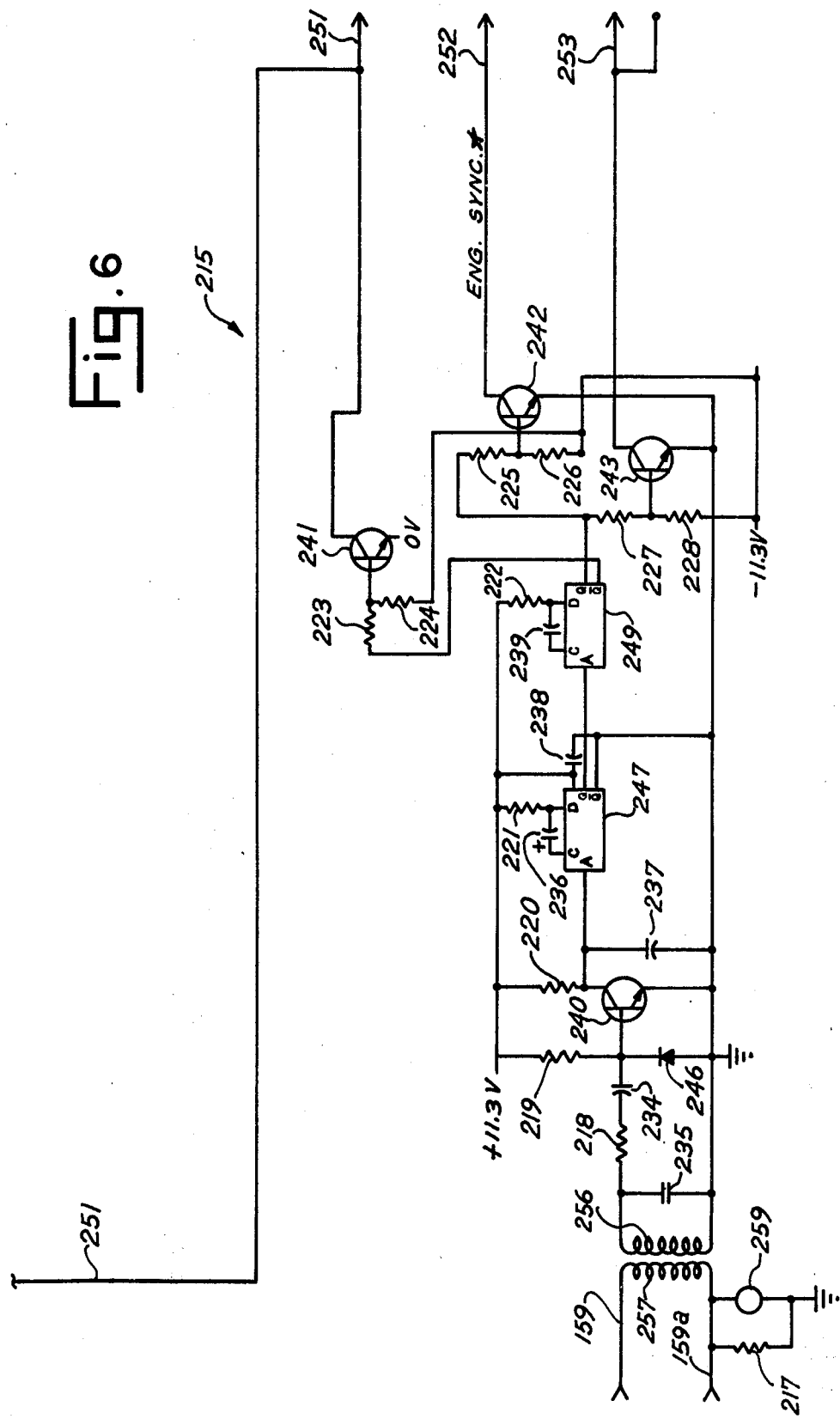
FIG. 6 is a schematic diagram of a preferred form of trigger generator made in accordance with the present invention.

Referring to FIG. 6, the trigger generator comprises resistors 217–228, capacitors 234–239, transistors 240–243 and a diode 246, connected as shown. A 9 millisecond one-shot multivibrator 247 and a 1.3 millisecond one-shot multivibrator 249 are used to suppress noise which may be picked up on the input to the trigger generator. Output conductor 251 provides an ENG. SYNC pulse when spark plug 101a is fired, and output conductors 252–253 each provide an ENG. SYNC* pulse. An output lead 254 is connected to the primary interface circuit. Transformer coils 256, 257 provide an input signal from trigger pick-up 158, and over voltage protection is provided by a varactor 259.

PRIMARY INTERFACE 360

Primary interface circuit 360 generates a DELAYED DWELL* pulse having a duration proportional to the contact points 118, 118a when closed.

Figure 7:
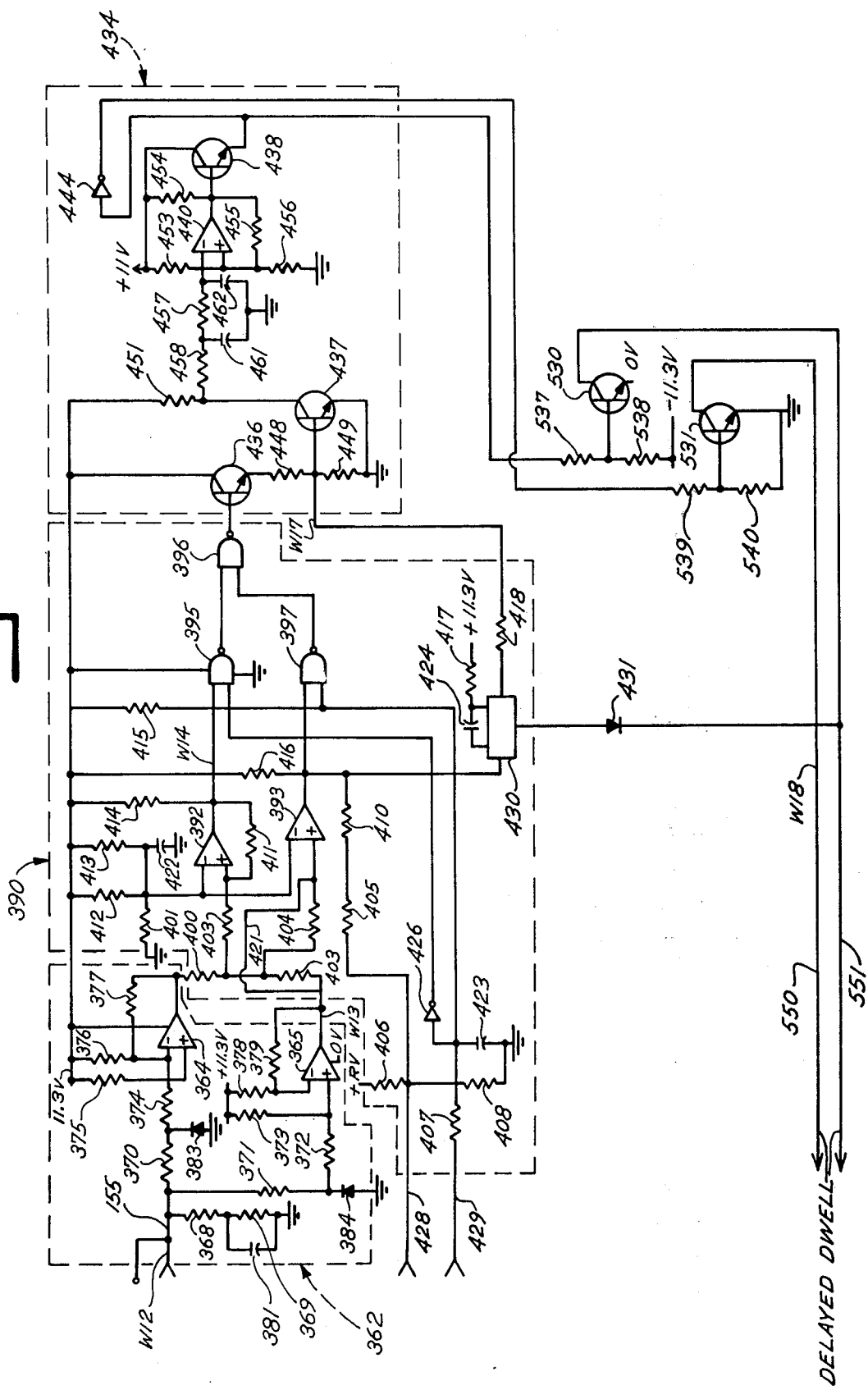
FIG. 7 is a schematic diagram of a preferred form of a primary-secondary interface circuit made in accordance with the present invention.

Referring to FIG. 7, circuit 360 includes an input circuit 362 capable of conditioning signals from a positive or negative grounded battery system. Circuitry 362 comprises operational amplifiers 364, 365, each connected as a comparator circuit, as well as resistors 368–379, a capacitor 381 and diodes 383, 384, connected as shown. A conditioning circuit 390 processes signals from conventional as well as high energy ignition circuits by means of operational amplifiers 392, 393, respectively, each of which is connected as a comparator circuit. The conditioning circuit also includes NAND gates 395–397, resistors 400–418, capacitors 421–424, and inverter 426, input conductors 428, 429, and a one-shot multivibrator 430 connected to a diode 431.

A stretching and delay circuit 434 includes transistors 436–438, an operational amplifier 440 connected as a comparator circuit, an inverter 444, resistors 448, 449, 451, 453–458, and capacitors 461–462, all connected as shown.

Driver transistors 530–531 amplify the signals conducted to output conductors 550–551. The transistors are biased by resistors 537–540.

Primary interface circuit 360 is basically used to condition the signals received from engine 100 in order to provide a DELAYED DWELL* pulse.

Figure 8:
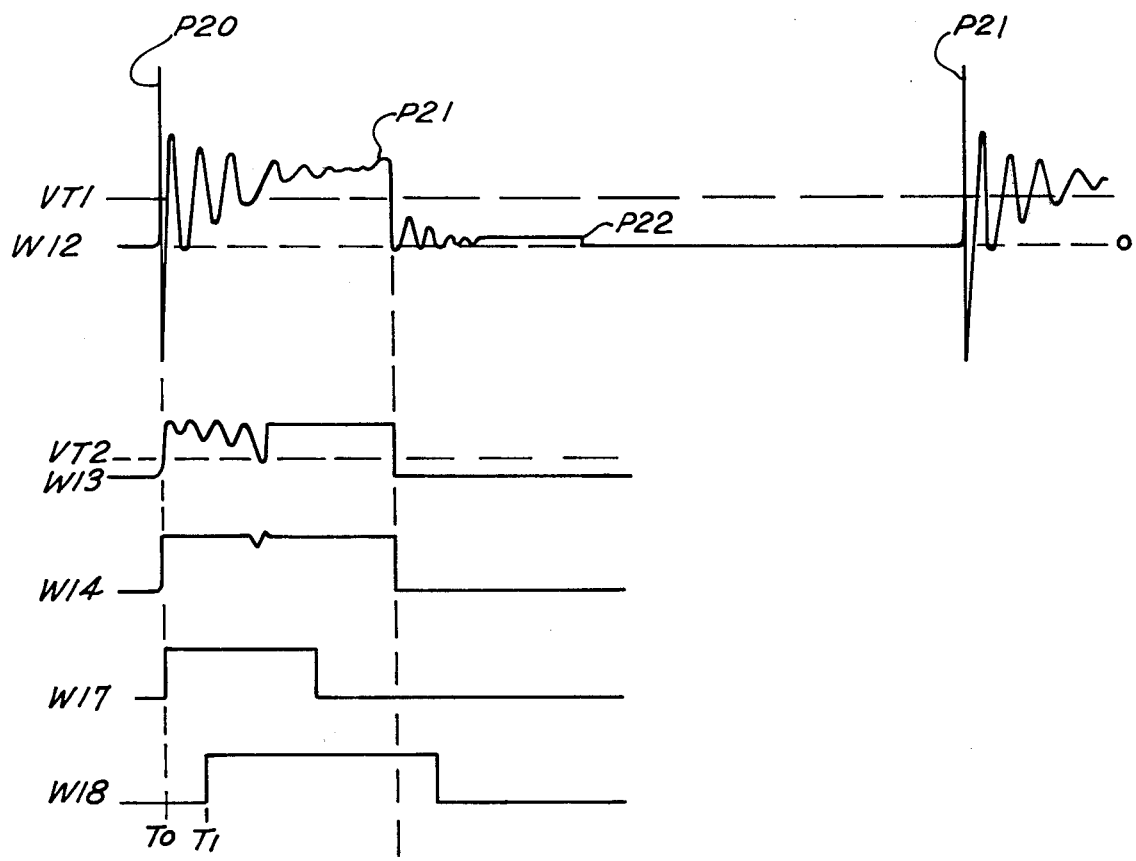
FIG. 8 illustrates exemplary voltage waveforms generated by the signal sampler shown in FIG. 5.

Referring to FIGS. 7 and 8, the primary interface circuit 360 operates as follows:

Waveform W12 illustrates an exemplary primary voltage waveform of the type received on conductor 155 from primary coil 115. Waveform W12 includes a firing line P20 generated at the time contact points 118, 118a open in order to fire a spark plug. The line between points P20 and P21 on waveform W12 indicates the time period during which current is gapping across the spark plug. At point P22, contact points 118, 118a close in order to initiate the dwell portion of the ignition cycle. The dwell portion ends at point P21 when the contact points again open in order to fire another spark plug.

Operational amplifiers 364 and 365 are arranged to accommodate either a negative battery or positive battery ignition system, respectively. The amplifiers from input primary signal W12 remove many of the oscillations by means of a comparator technique. For example, the inverting input of operational amplifier 365 may be biased approximately at voltage VT1 (waveform W12). In response to this operation, the output of operational amplifier 365 produces voltage wavefor W13.

Operational amplifiers 392 and 393 apply the same comparator technique as amplifiers 364 and 365 in order to convert waveform W13 into a signal more nearly resembling a pulse, such as voltage waveform W14. In order to achieve this result, the inverting input of operational amplifier 392 can be set at approximately VT2 volts (waveform W13). In this mode of operation, operational amplifier 392 produces an output voltage waveform W14 which closely resembles a pulse of the type useful for the data processing apparatus described later.

Operational amplifier 393 is used in connection with so-called high energy ignition (HEI) systems that produce voltages than conventional ignition systems. As a result, operational amplifier 393 is less sensitive than operational amplifier 392.

The output of amplifier 393 is connected to the input of one-shot 430 in order to produce an output voltage waveform W17. This voltage is used as a noise blanking signal in order to produce a more nearly uniform pulse at the input of stretching and delay circuit 434. Monostable multivibrator 430 produces a pulse having a duration of approximately 1 millisecond. It has been found that a multivibrator of this type is needed in connection with certain models of vehicle ignition systems which have a particularly long dwell time period.

NAND gates 395–397 select either the output of amplifier 392 or the output of amplifier 393 for conduction to circuit 434 depending on the state of conductor 429 which is operated from a switch on front panel 182. The switch is set by the operator depending on whether a conventional system or a special high energy ignition system is used in the vehicle being tested. (See FIG. 19a).

The output of transistor 436 is amplified by a transistor 437 and is delayed by a filter and delay circuit comprising resistors 457, 458 and capacitors 461, 462. The delay circuit delays the leading and trailing edges of voltge waveform W14 by approximately 600 microseconds in order to produce a voltage waveform W18. This voltage is amplified by operational amplifier 440 and transistor 438. After being conditioned by inverter 444 and additional driver transistors 530, 531, the waveform and its inverse are transmitted over output conductors 550 and 551 as DELAYED DWELL and DELAYED DWELL* pulses, respectively.

PRIMARY ATTENUATOR 590

Figure 9:
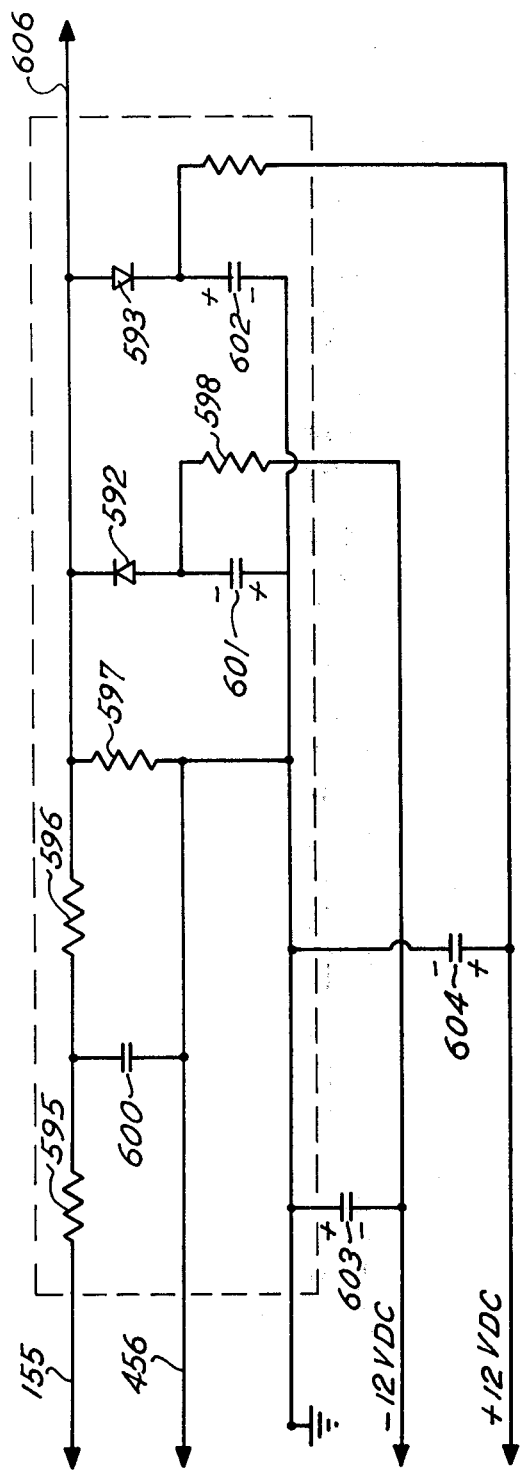
FIG. 9 is a schematic diagram of a preferred form of primary attenuator circuit made in accordance with the present invention.

Referring to FIG. 9, primary attenuator 590 comprises diodes 592, 593, resistors 595–598 and capacitors 600–604, connected as shown. The circuitry filters and clips the primary signal generated by primary coil 115, and provides an input to analog system 1100.

AMMETER CIRCUIT 610

Ammeter Circuit 610 provides output signals proportional to the average amperes and instantaneous amperes flowing through any test wire associated with engine 100, such as the battery cable. The circuit can be automatically ranged and zeroed by the analog system 1100 and data processor.

Figure 10:
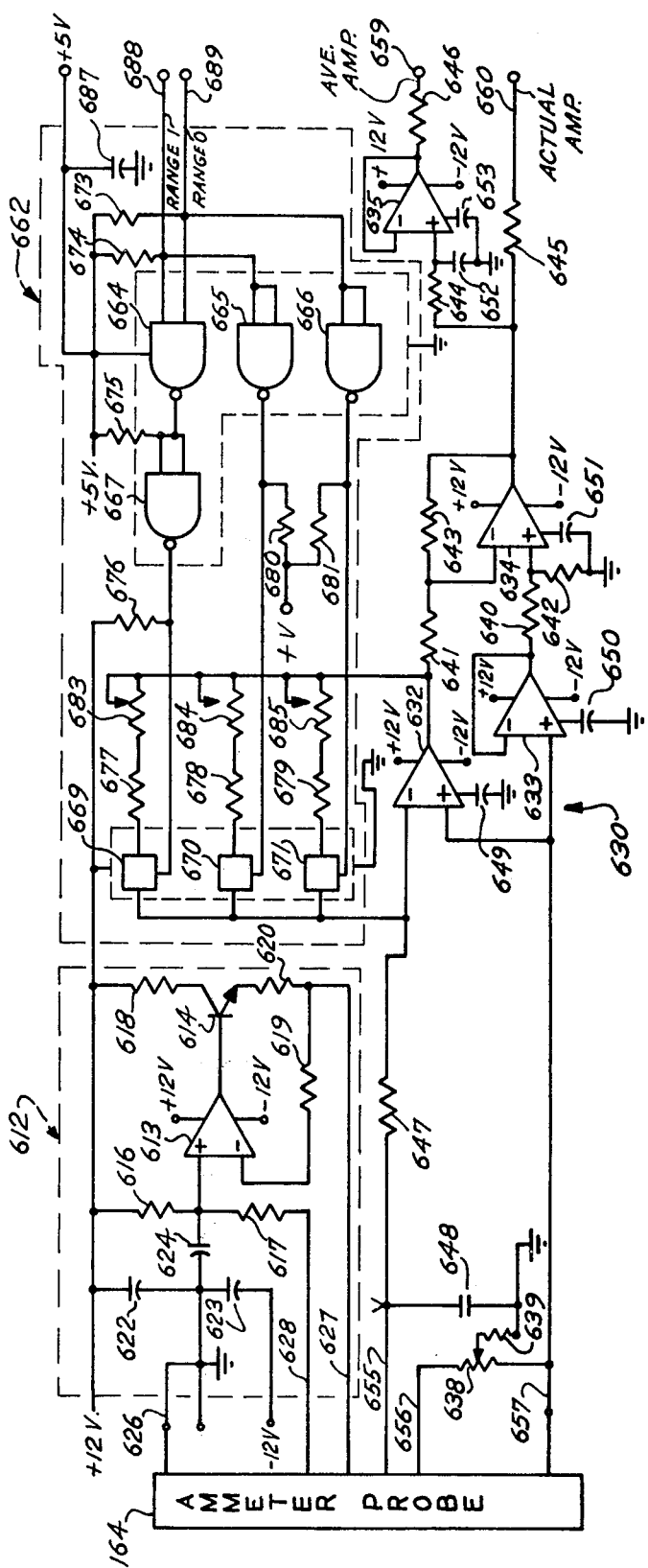
FIG. 10 is a schematic diagram of an ammeter circuit made in accordance with the present invention.

Referring to FIG. 10, ammeter circuit 610 basically comprises a bias circuit 612, a differential amplifier circuit 630 and a range circuit 662.

Bias circuit 612 comprises an operational amplifier 613, a transistor 614, resistors 616-620, and capacitors 622-624, all connected as shown. The components are arranged to provide a constant voltage for ammeter probe 164 through conductor 627. A feedback signal is returned from ammeter probe 164 over conductor 628.

Ammeter probe 164 incorporates a Hall-effect generator which produces a fluctuating DC voltage between conductors 655 and 657 which is proportional to the instantaneous flux density of the field surrounding the wire around which the probe is placed. The flux density, in turn, is proportional to the current flowing through the wire. One such probe is manufactured by Sun Electric Corporation, Chicago, Illinois, under part number 6005-0133. The voltage difference is measured by differential amplifier circuit 630 by the use of operational amplifiers 632-635, resistors 638-647 and capacitors 648-653. Conductor 656, resistor 639 and potentiometer 638 serve as zero adjustment elements to compensate for the offset of the Hall effect generator.

On output conductor 659, the differential amplifier circuit provides a voltage having an amplitude proportional to the average current flowing through the test wire; on output conductor 660, the differential amplifier circuit provides a voltage having an amplitude proportional to the instantaneous or actual value of the current flowing through the test wire. The circuitry relating to operational amplifiers 632-634 has a relatively rapid time constant so that rapid DC fluctuations in the current flowing through the test wire result in corresponding fluctuations of the voltage on output conductor 660. The circuitry associated with operational amplifier 635 includes additional filtering and a longer time constant so that the voltage appearing on output conductor 669 is proportional to the average current fluctuation in the test wire.

The sensitivity of differential amplifier circuit 630 is controlled by range circuit 662 which includes NAND gates 664-667, switching gates 669-671, resistors 673-681, potentiometers 683-685 and a capacitor 687. The value of the resistance in the feedback circuit of operational amplifier 632 is controlled by the conductive state of gate switches 669-671. These gate switches, in turn, are controlled by the logical state of the range adjustment signals appearing on range 1 control conductor 688 and range 0 control conductor 689.

VOLTMETER CIRCUIT 700

Referring to FIG. 11, voltmeter circuit 700 produces on an output conductor 746 a voltage signal having an amplitude proportional to the voltage across test leads 162, 163. The circuit can be automatically ranged by analog system 1100 and the data processor.

Circuit 700 includes operational amplifiers 702, 703 and a field effect transistor 704, as well as a protection diode 705. The circuit also includes potentiometers 712-715, resistors 717-735, and capacitors 740-744, all connected as shown.

The gain of amplifier 703 is adjusted by changing the logic state of the signal on input conductor 747. If small voltages are being measured, the range adjustment signal on conductor 747 is switched to its logical 0 state which turns on field effect transistor 704 so that the gain of amplifier 703 is increased. If larger voltages are being measured, the range signal on conductor 747 is switched to its logical 1 state so that the field effect transistor 704 is switched to its non-conductive state, thereby decreasing the gain of amplifier 703. An output conductor 748 transmits a signal to ohmeter-capacitance circuit 750.

DATA PROCESSOR 1090

Overall system processing and management is controlled by data processor 1090. The processor performs a number of tasks which may be summarized as follows:
 (1) Data is received from analog control 1100 and counting cylinder control 1400 which measure the parameters or conditions of the engine being tested;
 (2) Data received from analog control and counting and cylinder control is manipulated to provide output commands to character controller 1800 and graphic controller 2130 which enable the display of alphabetic, numeric and graphical information on display monitor 190; and
 (3) The status of keyboard 184 and control switch assembly 186 are periodically monitored to determine the type of engine being tested and the kind of test desired by the operator.

As shown in FIG. 3, data processor 1090 treats analog control 1100, counting and cylinder control 1400, character controller 1800, graphic controller 2130 and front panel interface as peripheral devices which are interconnected by means of a processing bus 1096. The bus includes output data bus conductors BDO-BD15, input data bus conductors SW0-SW15 address conductors AD2-AD7 and timing signal conductors T1-T4. The signal mnemonics for the pulses transmitted on conductors T1-T4 are shown in TABLE B.

TABLE B

| Timing Signal Conductor | Signal Mnemonic |
| --- | --- |
| T1 | RESET* |
| T2 | READ STROBE |
| T3 | WRITE STROBE |
| T4 | CLK* |

The manner in which the data processor outputs commands to peripheral devices, such as analog controller 1100 or counting and cylinder control 1400, is shown in FIG. 4. The data processor operates through a number of microcycles, the 6th and 7th of which are illustrated in FIG. 4. The bits of data transmitted in the output commands are communicated to the peripheral device over output data bus conductors BD0-BD15. In order to have the data on the BD conductors received by the proper peripheral devices, the proper address of the peripheral device must by placed on the address (AD) conductors during phase T3 of the 6th microcycle (FIG. 4). During the remaining portion of the 6th microcycle and throughout the 7th microcycle, the address identifying bits on AD conductors are stabilized. Throughout the 6th microcycle and part of the 7th microcycle, information used internally by the data processor continues to be placed on the output BD conductors. This mode of operation is signified by the x's shown in FIG. 4 during phases T3, T5 and T7 of the 6th microcycle and phase T1 of the 7th microcycle. Just prior to phase T3 of the 7th microcycle, the data processor places on the BD output conductors the bits of information intended to be received by the peripheral device addressed by the AD conductors. As soon as the data has stabilized on the BD conductors, between phases T3 and T4 of the 7th microcycle, the data processor generates a WRITE STROBE pulse. During the duration of the WRITE STROBE, the output data on the BD conductors is stored by the peripheral device for later use. After the WRITE STROBE is returned to its 0 state, a different peripheral device can be addressed and different data can be transmitted to the BD output conductors.

The manner in which the data processor inputs data from a peripheral device is shown in connection with FIG. 5. As in the case of the output commands, the address of the peripheral device from which information is needed is placed on address conductors AD during phase T3 of the 6th microcycle. Throughout the remaining portion of the 6th microcycle and the 7th microcycle, this address remains stabilized on the AD conductors. During phase T3 of the 7th microcycle, the data processor transmits a READ STROBE on conductor T2 which enables the peripheral device addressed on conductors AD to transmit bits of data over the input data bus conductors SW. During phase T4 of the 7th microcycle, the input data is stabilized and remains stable until the phase T8 of the 7th microcycle. At the end of the 7th microcycle, the data processor returns the READ STROBE to its 0 state, and then can address a different peripheral device to receive additional information.

One suitable data processor is the IMP-16C manufactured by National Semiconductor Corporation, Santa Clara, California. The IMP-16C is a 16 bit parallel processor having an arithmetic unit and a control unit. The processor includes a read/write memory for temporarily storing values. For example, the values of various modified engine conditions or parameters are temporarily stored before they are transmitted to character controller 1800.

As shown in FIG. 3, data processor 1090 is used in connection with a read-only memory 1094 having a storage capacity of about 4k. The IMP-16C processor can be used with a variety of read-only memories as long as they have an access time equal to or less than 850 nanoseconds. Instructions for wiring read-only memory 1094 and connecting it to the processing bus and data processor may be found in the IMP-16C Application Manual published by National Semiconductor Corporation in January, 1974. (Publication No. 420021C).

ANALOG SYSTEM 1100

Analog system 1100 sets up and controls the data acquisition circuits previously described so that the various analog parameters or conditions of the engine are systematically channeled to a single analog-to-digital converter which makes the value of the parameter available to the data processor in the form of a digital measurement signal.

Referring to FIGS. 12a–12f, analog system 1100 basically comprises a range control circuit 1102, a set-up and selection circuit 1160, a sampling control circuit 1246, a real-time clock 1320, a multiplexer 1350, and an analog-to-digital converter 1352.

Referring to FIG. 12a, range control circuit 1102 receives input data from data output bus conductors BD4–BD6 and uses this information to determine the range of the engine parameter circuitry to be selected for a particular measurement. Information received on the data output bus conductors is stored in quad latches 1104–1111 during the WRITE STROBE signal as described in FIG. 4. The proper analog circuitry range is also selected by NAND gates 1114–1126, AND gates 1128–1135, inverters 1138–1140, and a binary decoder 1142. Decoder 1142 is connected to the range control conductors of the data acquisition circuits previously described. Range adjustment signals are transmitted over these conductors. Output conductors 1145–1152 interconnect the components in the manner shown.

Figure 12B:
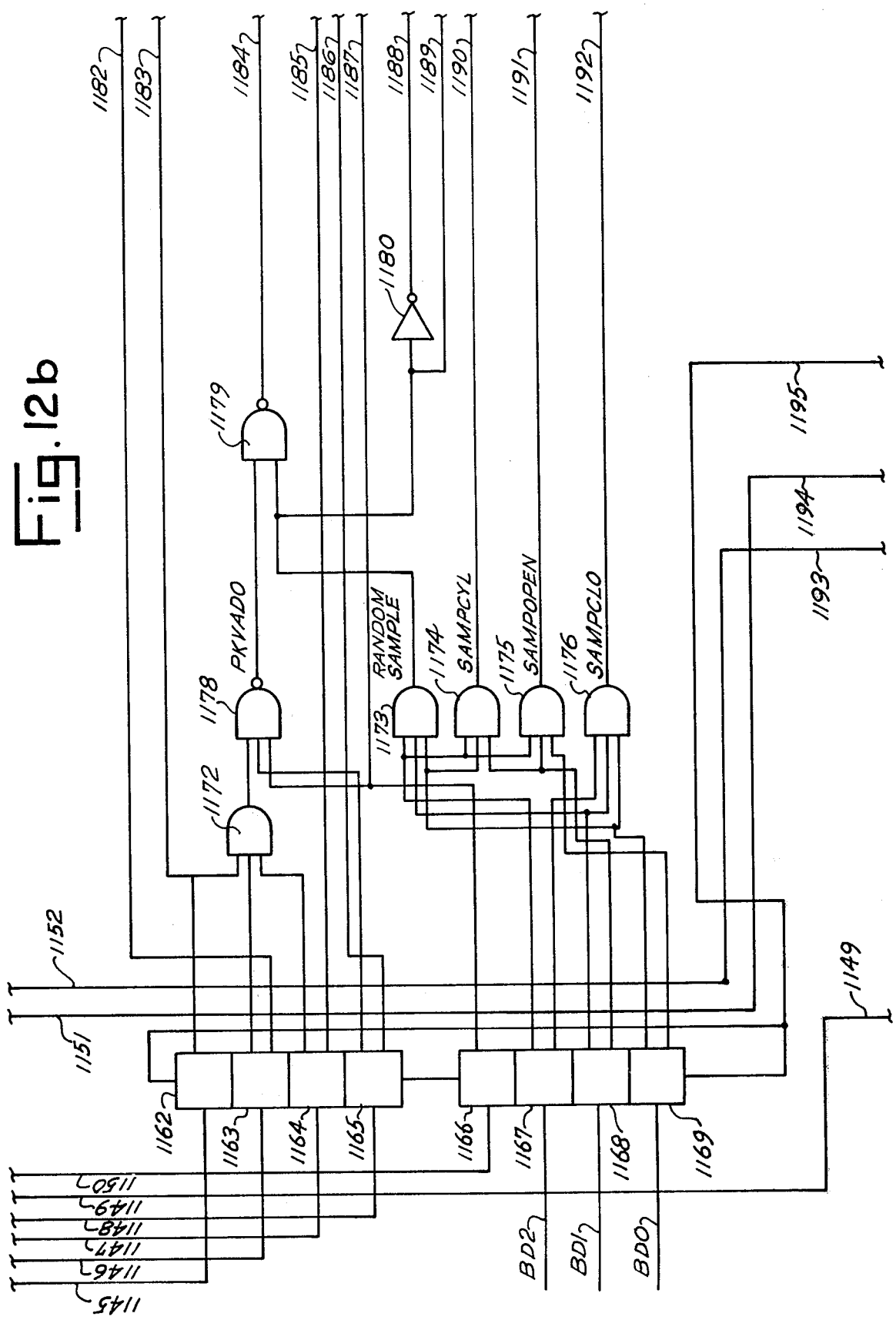

Referring to FIG. 12b, set-up and selection circuit 1160 comprises quad latches 1162–1169, data output bus conductors BD0–BD2, AND gates 1172–1176, NAND gates 1178–1179, an inverter 1180, and output conductors 1182–1195, all connected as shown. Referring to FIG. 12c, circuit 1160 also includes address bus conductors AD2–AD7, timing conductors T1–T4, data outpt bus conductors BD0–BD3, AND gates 1200–1271, NAND gates 1220–1222, inverters 1224–1228, a one shot multivibrator 1230, output conductors 1232–1237, resistors 1240–1241, and a capacitor 1242, all connected as shown.

Figure 12D:
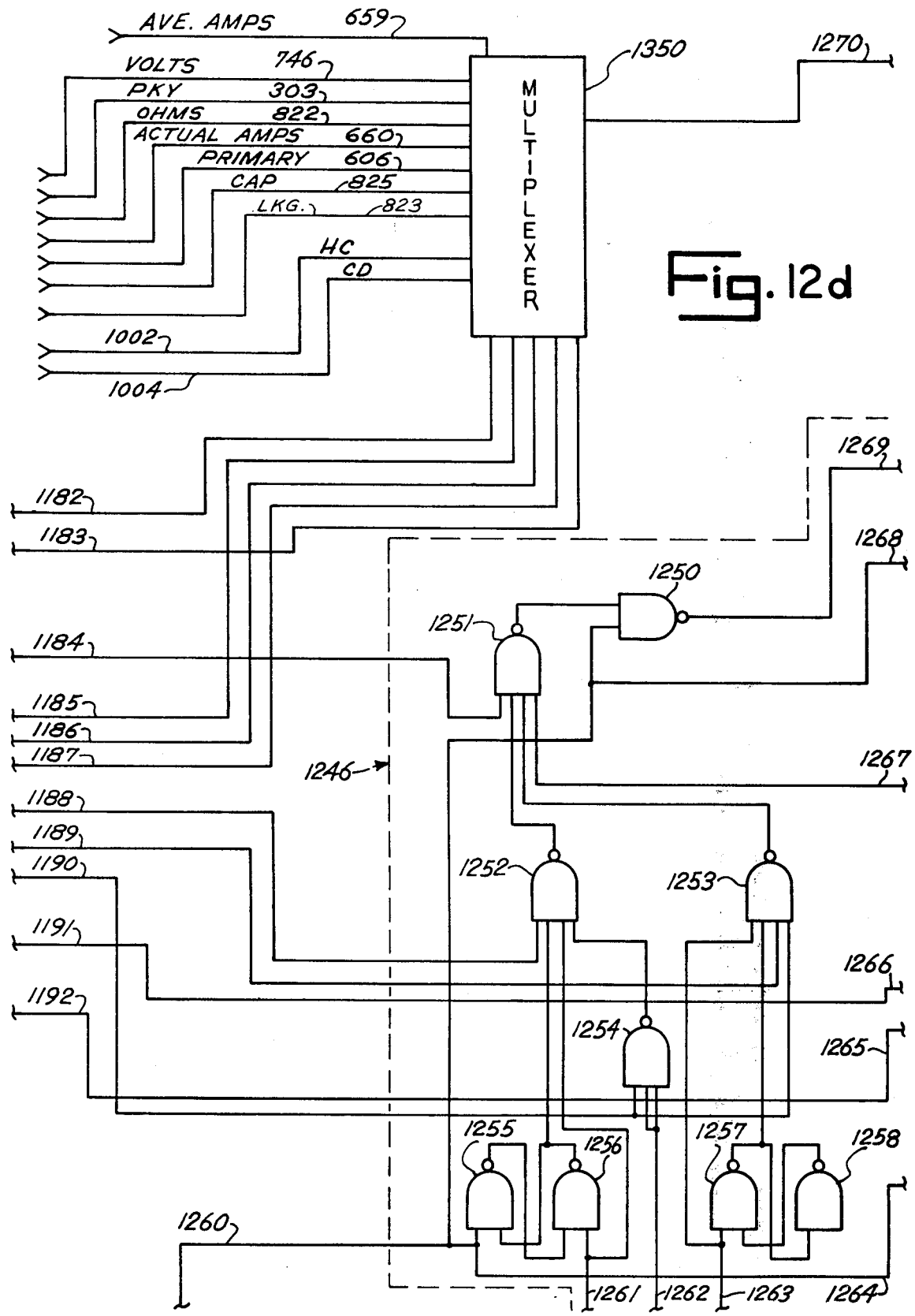
Figure 12E:
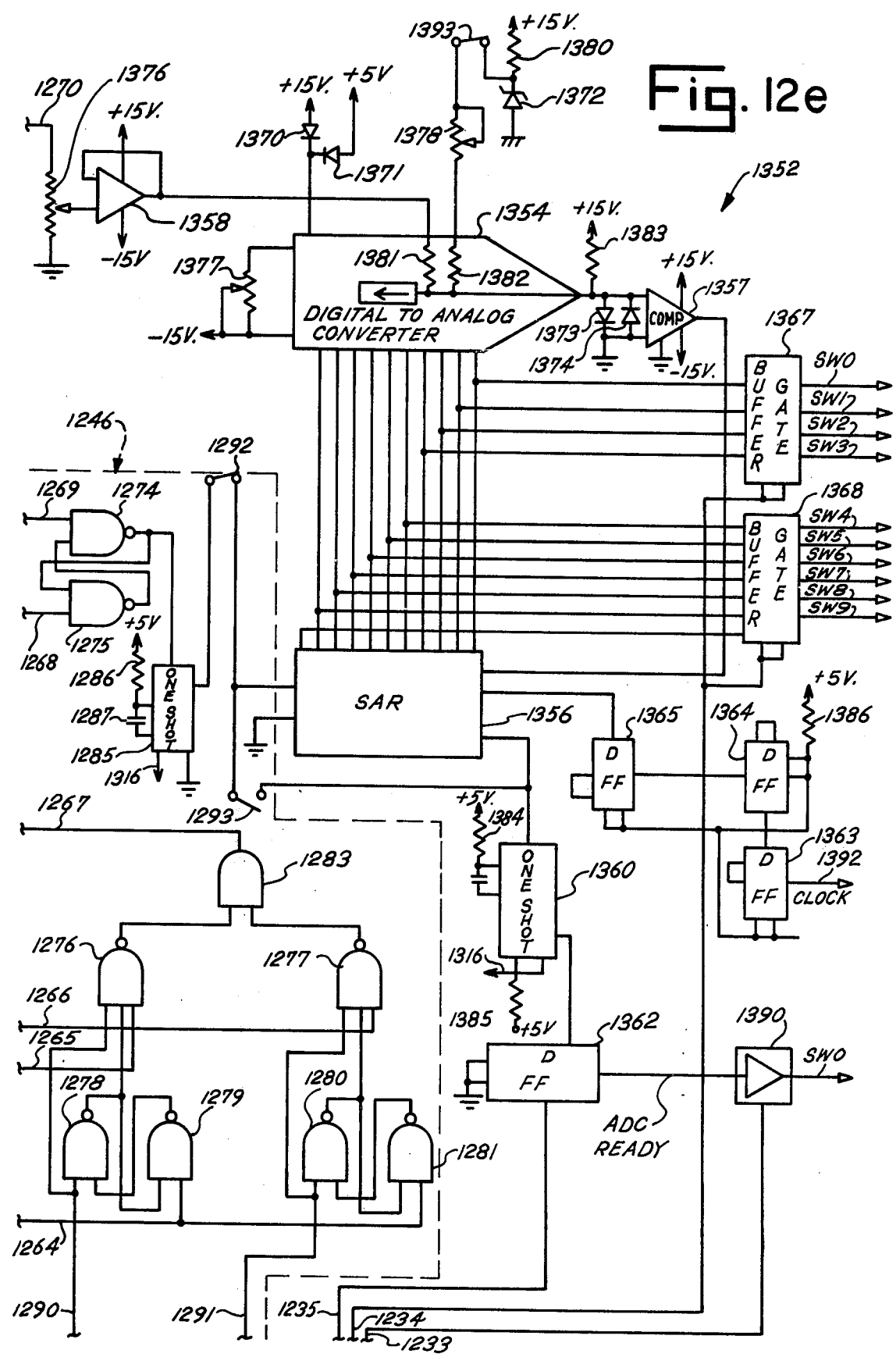
Figure 12F:
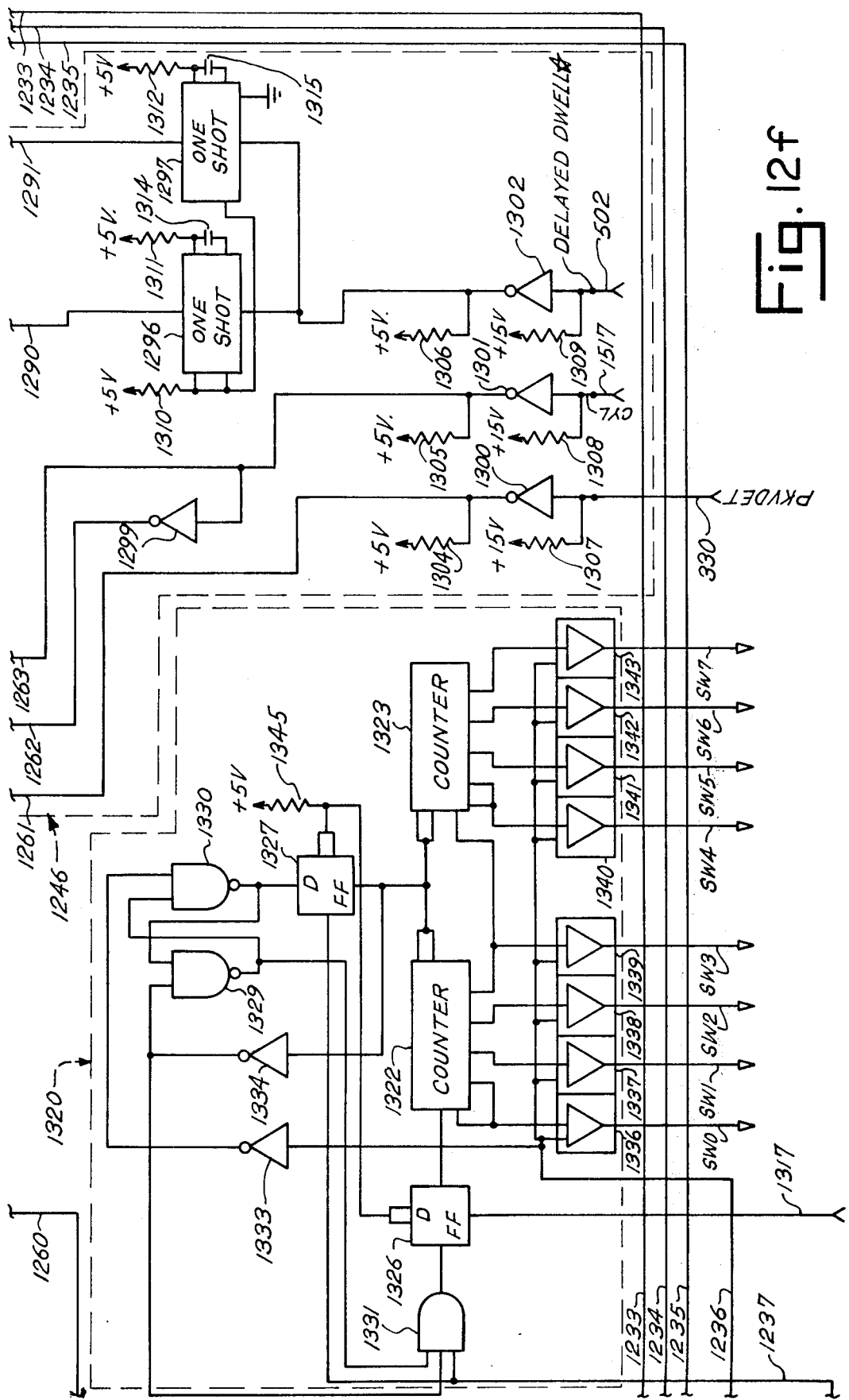

Referring to FIG. 12d, sampling control circuit 1246 comprises NAND gates 1250–1258 and output conductors 1260–1270. Referring to FIG. 12e, circuit 1246 also includes NAND gates 1274–1281, and AND gate 1283, a one shot multivibrator 1285, a resistor 1286, a capacitor 1287, output conductors 1290–1291, a run switch 1292 shown in the run position and a calibrate switch 1293 shown in the run position. Referring to FIG. 12f, sampling control circuit 1246 also includes one shot multivibrators 1296, 1297, inverters 1299–1302, resistors 1304–1312, capacitors 1314–1315, and output conductors 1316, 1317. As shown in FIGS. 12d–12f, the sampling control circuit receives inputs from conductors 330, 1517 and 502 which determine the point of time at which converter circuit 1352 begins to convert the data received by multiplexer 1350.

Referring to FIG. 12f, real-time clock 1320 comprises counters 1322, 1323, D-type flipflops 1326, 1327, NAND gates 1329, 1330, an AND gate 1331, inverters 1333, 1334, tristate buffers 1336–1343, a resistor 1345 and input data bus conductors SW0–SW7. The realtime clock indicates to the data processor how long an operation has been running. This is particularly useful when the analog measuring circuits are being set-up and selected.

Referring to FIG. 12e, analog-to-digital converter 1352 comprises a digital-to-analog converter 1354, a successive approximation register (SAR) 1356, a comparator 1357, an amplifier 1358, one-shot multivibrator 1360, D-type flipflops 1362–1365, tristate buffer gates 1367, 1368, diodes 1370–1374, potentiometers 1376–1378, resistors 1380–1386, a tristate buffer 1390 and an input conductor 1392 for receiving a clock pulse. A switch 1393 is shown in the closed or run position used during normal operation of the system. During calibration, switch 1393 is moved to its open position.

OPERATION OF ANALOG SYSTEM 1100

Ammeter circuit 610, voltmeter circuit 700 and ohmeter-capacitance circuit 750 each are capable of operating in a plurality of ranges depending on the magnitude of the parameter being measured. Each of these circuits requires the selection of the proper range. Once a range is selected, a time delay is required for the circuitry to settle or establish stable conditions before the analog-todigital conversion is performed. In order to achieve this mode of operation, the data processor goes through a similar procedure for each of the circuits. The numerical values read in the various ranges is shown in TABLE C:

TABLE C

| PARAMETER | NUMERICAL RANGE IN DISPLAYED ENGINEERING UNITS | RANGE CODE | RANGE LIMIT NUMBERS READING ACCEPTABLE IF READING $\geq$ VALUE INDICATED, OTHERWISE SWITCH TO NEXT LOWEST RANGE | CONVERSION FACTOR |
|---|---|---|---|---|
| (1) VOLTS | 0–25.00 | 0 | ok | .0476 |
|  | 25.0–100.0 | 1 | $.2 \times 2^9$ | .1905 |
| (2) AMPS | 0–62.5 | 0 | ok | .1190 |
|  | 62.5–250 | 1 | $.2 \times 2^9$ | .4762 |
|  | 250–1000 | 2 | $.2 \times 2^9$ | 1.905 |

If the programming of the data procesor calls for any analog value to be read from engine 100, it issues an ADC FLAG RESET OUTPUT COMMAND of the type shown in Table 1.

TABLE 1

| ADC FLAG RESET OUTPUT COMMAND |||
|---|---|---|
| T1 T2 T3 T4 | AD2 AD3 AD4 AD5 AD6 AD7 | BD0 |
| 1  0  1  0 | 0    1    0    0    0    1 | 1 |

As shown in Table 1, the OUTPUT COMMAND is performed by placing binary bits 1010 on timing conductors T1–T4, respectively, and by placing binary bits 010001 on address conductors AD2–AD7, respectively. Of course, as explained in connection with FIG. 4, each OUTPUT COMMAND, including the one shown in TABLE 1, requires a WRITE STROBE on conductor T3. The BD0 line is switched to its 1state. In response to the coding shown in TABLE 1, the output of AND gate 1215 (FIG. 12c) is switched to its 1 state so that the output of D-type flipflop 1362 (FIG. 12e) is switched to its 0 state, thereby lowering the ADC READY flag.

After the ADC READY flag has been reset to 0, the data processor can issue an ADC SETUP OUTPUT COMMAND by placing the data bits shown in TABLE 2 on the address conductors AD2–AD7 and the data output conductors BD3–BD11.

TABLE 2

| ADC SETUP OUTPUT COMMANDS ||||||||||||||
|---|---|---|---|---|---|---|---|---|---|---|---|---|---|
| AD2 | AD3 | AD4 | AD5 | AD6 | AD7 | BD3 | BD4 | BD5 | BD6 | BD7 | BD8 | BD9 BD10 | BD11 |
| 1 | 0 | 0 | 0 | 0 | 1 | 1 |  | Range |  |  | Analog Channel |  |  |

As shown in TABLE 2, the analog channel (i.e., the parameter to be measured) is coded on conductors BD7–BD11 and is stored in latches 1107–1116, respectively (FIG. 12a). This information is used by multiplexer 1350 to select the proper parameter. The proper range of the parameter selecter for measurement is coded on conductors BD4–BD6 is stored in latches 1104–1106, respectively during the WRITE STROBE.

After issuing the SETUP OUTPUT COMMAND, the data processor determines the proper period of time delay by inputing the count of real time clock 1320 through a REAL TIME CLOCK INPUT COMMAND shown in TABLE 3.

TABLE 3

| REAL TIME CLOCK INPUT COMMAND ||
|---|---|
| AD2 AD3 AD4 AD5 AD6 AD7 | SW0 SW1 SW2 SW3 SW4 SW5 SW6 SW7 |
| 0    1    1    1    0    1 | ← Time → |

The input command addresses the real time clock by putting the bit code shown in TABLE 3 on address conductors AD2–AD7. As soon as a READ STROBE is produced, the count of the real time clock is available over input conductors SW0–SW7. As explained previously, the real time clock registers the count of the increments of a free running clock having a period of about 1.008 milliseconds. The clock is capable of registering the count from 0 to 255 and then resetting to 0 and beginning the count again. A REAL TIME CLOCK INPUT COMMAND resets the clock to 0. By subsequently issuing another REAL TIME CLOCK INPUT COMMAND, the data processor can determine the amount of elapsed time, and thereby knows whether the analog circuit has had sufficient time to set up.

After an appropriate amount of time has elapsed, based on data from the real time clock, the data processor initiates the analog-to-digital conversion by issuing an ADC CONVERSION OUTPUT COMMAND as shown in TABLE 4.

TABLE 4

| ADC CONVERSION OUTPUT COMMANDS |||||||||||||||
|---|---|---|---|---|---|---|---|---|---|---|---|---|---|---|
| AD2 | AD3 | AD4 | AD5 | AD6 | AD7 | BD0 BD1 BD2 | BD3 | BD4 | BD5 | BD6 | BD7 | BD8 BD9 | BD10 | BD11 |
| 1 | 0 | 0 | 0 | 0 | 1 | Sampling Time | 0 | — | — | — | — | Multiplex Channel |  |  |

As soon as a WRITE STROBE is received by analog system 1100, the multiplex channel for the required conversion is designated by the bits on conductors BD7–BD11 and the sampling time is designated by the bits on conductors BD0–BD2. Bits BD0–BD2 enable the conversion to take place in synchronism with the DELAYED DWELL* signal on conductor 502, the CYL signal on conductor 1517, or the PKVDET signal on conductor (330 (FIG. 12f). As soon as the conversion is completed, the analog circuitry automatically raises the ADC READY flag by switching the output of D flipflop 1362 to its 1 state.

The data processor determines whether the ADC conversion is completed by inputting the ADC READY flag through an INPUT STATUS REGISTER INPUT COMMAND of the type shown in TABLE 5.

TABLE 5
| INPUT STATUS REGISTER INPUT COMMAND | | | | | | |
|---|---|---|---|---|---|---|
| AD2 | AD3 | AD4 | AD5 | AD6 | AD7 | SW0 |
| 0 | 1 | 0 | 0 | 0 | 1 | Status of ADC |

The status register consists of a number of storage latches, such as 1390 (FIG. 12e) which are scattered throughout the circuitry. By placing the address of the status register on conductors AD2-AD7, (shown in TABLE 5), the ADC READY flag can be read from the state of conductor SW0, and the status of many other functions in the circuitry can be read from various SW conductors which will be described hereafter. If the data processor finds that the ADC READY flag is in its 1 state, it knows that the analog-to-digital conversion is complete. At this point in time, data processor can receive the digital measurement signal stored in buffer gates 1367, 1368, corresponding to the desired analog parameter, by issuing a READ ADC INPUT COMMAND shown in Table 6.

TABLE 6
| READ ADC INPUT COMMAND | | | | | | |
|---|---|---|---|---|---|---|
| AD2 | AD3 | AD4 | AD5 | AD6 | AD7 | SW0-SW9 |
| 1 | 0 | 0 | 0 | 0 | 1 | ADC Data |

As shown in TABLE 6, as soon as a READ STROBE is generated by the data processor, the ADC digital measurement signal is available for storage by the data processor over conductors SW0-SW9.

COUNTING AND CYLINDER CONTROL SYSTEM 1400

Referring to FIGS. 13a-13c, counting and cylinder control system 1400 comprises a cylinder selection circuit 1402, a counter circuit 1412, and a decoder circuit 1417, together with additional components.

Referring to FIG. 13a, cylinder selection circuit 1402 comprises input inverters 1404-1409. The inverters receive inputs from conductors 1438-1442 that are connected to resistors 1438a-1442a and capacitors 1438b-1442b, respectively. Input conductors 1438-1442 receive MOD3*, MOD4*, MOD6*, MOD8* and MOD12* signals from the front panel depending on whether the engine being tested as 3, 4, 6, 8 or 12 cylinders, respectively.

Counter circuit 1412 includes flipflop-type counters 1414-1416 which continuously count through states 0-7 without being reset, except when the circuit is initially connected to an operating engine. After the first pulse transmitted over conductor 1444 is received, the counter circuit is not reset, but continually counts through states 0-7 at a rate determined by the pulses received on conductor 1445.

Decoder circuit 1417 comprises AND gates 1418-1426, NOR gates 1428-1431, NAND gates 1433-1436 and an inverter 1437. The cylinder selection circuit, counter circuit and decoder circuit are interconnected by conductors 1448-1461 through cables 1462, 1464. Output conductors 1470-1473 represent digital bit positions 0-3, respectively for purposes of determining the spark plug of the engine which is about to be fired.

Referring to FIG. 13b, control system 1400 comprises a latch 1478 which receives binary information from data bus conductors BD0-BD3. The circuitry also includes D-type flipflops 1480-1483, a one-shot multivibrator 1485, NOR gates 1487-1490, Exclusive OR gates 1492-1495, AND gates 1497-1500, inverters 1502-1503, resistors 1506-1510, a capacitor 1512, and output conductors 1514, 1516, 1517, 1520 and 1521.

Exclusive OR gates 1492-1495 operate as comparators. When the binary number stored in latch 1478 is identical to the binary number represented on output conductors 1470-1473, the Exclusive OR gates cause AND gate 1498 to produce an output pulse. During the next clock pulse received over conductor 1521, the Q output of flipflop 1482 is switched to its one state and remains in its one state until the binary number represented by conductors 1470-1473 is changed.

Referring to FIG. 3c, counter and cylinder control system 1400 also comprises AND gates 1524-1527 and a NOR gate 1529 which are used to operate the remaining circuitry when an appropriate address in the form of binary data is received on address conductors AD2-AD7.

The system also includes logic gates 1530-1535, switches 1540-1545, and resistors 1550-1555. The circuitry can be used in order to manually introduce data into the data processor by means of manipulating the switches. Output conductors 1557-1558 connect the circuitry in the manner shown.

In order to designate a particular cylinder of engine 100 for shorting or sampling of engine parameters, the data processor issues a CYLINDER SELECT OUTPUT COMMAND shown in TABLE 7:

TABLE 7
| AD2 | AD3 | AD4 | AD5 | AD6 | AD7 | BD15 | BD0-BD3 |
|---|---|---|---|---|---|---|---|
|  |  |  |  |  |  | Short = 1 | No. of |
| 1 | 0 | 1 | 1 | 0 | 1 | Sample = 0 | Cylinder |

If conductor BD15 is switched to its 1 state, the Q output of flipflop 1480 (FIG. 13b) is switched to its 1 state so that inverter 1503 is enabled to produce an AUTO SHORT* pulse. If conductor BD15 is switched to its 0 state, AND gate 1500 is disabled so that no AUTO SHORT* pulse can be produced. During the WRITE STROBE, the number of the selected cylinder is stored in latch 1478 from conductors BD0-BD3.

Referring to FIGS. 14a-14f, counting and cylinder control system 1400 also comprises an operating command decoding circuit 1562, a trigger generating circuit 1564, a phasing and synchronization circuit 1632, a clock and phase generator 1740, a status readout circuit 1750 and a countercircuit 1764.

These circuits acquire data for measurement of RPM average and per cylinder dwell, and average and per cylinder cam lobe or cylinder timing.

Referring to FIG. 14a, circuits 1562 and 1564 comprise a binary coded decimal-to-decimal decoder 1570, one-shot multivibrators 1572, 1573, NAND gates 1575-1582, AND gates 1586-1590, a NOR gate 1593, inverters 1595-1602, resistors 1605-1615, capacitors 1618, 1619, and output conductors 1620-1629 which comprise a cable 1630.

Operating command decoding circuit 1562 receives data on input conductors AD5-AD7, T2, T3, and decodes the information in order to determine the type of operation required. Trigger generating circuit 1564 receives timing signals over conductors 214, 206, 1620, and 252 in order to initiate certain modes of operation at the required time.

Referring to FIG. 14b, phasing and synchronization circuit 1632 comprises J-K flipflops 1634–1641, a one-shot multivibrator 1643, NAND gates 1645–1653, AND gates 1656–1658, an amplifier 1660, resistors 1662–1666, a capacitor 1668 and output conductors 1670–1680, all connected as shown. Referring to FIGS. 14c and 14d, circuit 1632 also comprises D-type flipflops 1684–1687, J-K flipflops 1690∝1693, NAND gates 1695–1702, AND gates 1706–1709, inverters 1712–1713, amplifiers 1715–1717, resistors 1719–1723 and conductors 1726–1735. Among other functions, circuit 1632 serves as gate circuitry for transmitting clock pulses to counter circuit 1764 or inhibiting clock pulses from being transmitted to counter circuit 1764.

Referring to FIG. 14c, clock and phase generator 1740 comprises divide-by-sixteen counters 1742, 1743, AND gates 1745, 1746, an inverter 1747 and an amplifier 1748. Circuit 1740 generates various clock pulses displaced in phase in order to operate phasing and synchronization circuits 1632.

Referring to FIG. 14d, status read-out circuit 1750 comprises J-K flipflops 1752, 1753, an AND gate 1754, amplifiers 1755, 1756, a resistor 1757, an output conductor 1759 and an output cable 1760,. Circuit 1750 provides signals on output conductors SW4 and SW5 which indicate whether certain portions of counter circuit 1764 have overflowed during the counting process.

Referring to FIGS. 14e and 14f, counter circuit 1764 comprises counter-latches 1766–1773, such as National SemiConductor Model No. DM8554. Counter-latches 1766–1769 alternately generate a "P" count and an "N" count, whereas counter-latches 1770–1773 alternately generate an "E" count and a "D" count. When the latches of circuits 1766–1769 hold the N number, they are referred to as the N register, and when they hold the P number, they are referred to as the P register. Likewise, when the latches of circuits 1770–1773 hold the D number, they are referred to as the D register, and when the latches hold the E number, they are referred to as the E register.

Circuit 1764 also includes inverters 1776, 1777, logic gates 1779–1781 and resistors 1783–1790. The logic gates are used to drive input data bus conductors SW1–SW3 in order to indicate flags which furnish information to the data processor.

OPERATION OF COUNTING AND CYLINDER CONTROL SYSTEM 1400

The circuitry shown in FIGS. 13a–13c and 14a–14f operates as follows:

Referring to FIGS. 14c and 14g, clock and phase generator 1740 produces clock pulses CC05678A, CC06 and CC08. These clock pulses are used in order to provide the correct sequencing and synchronization of ignition information in the circuitry. The clock pulses are generated at about 89.286KHz.

FIG. 14h illustrates exemplary primary ignition waveforms PR101, PR102 and PR108 which correspond with the primary ignition signals produced in order to fire spark plugs 101a, 102a and 108a, respectively. Additional ignition waveforms, of course, are produced by primary coil 115 in order to fire spark plugs 103a–107a. Also shown in FIG. 14h are the ENG SYNG pulses produced by the circuitry shown in FIG. 3, and the DELAYED DWELL* signal produced by the circuitry in FIG. 5. The DELAYED DWELL* signal is inverted by inverter 1712 (FIG. 14c) and is synchronized by clock signals CC06 in flipflop 1684 in order to produce the PRIM SYZD signals shown in FIG. 14h. The PRIM SYZD signals are transmitted to conductor 1445 in order to advance counters 1414–1416 (FIG. 13a).

When the system is turned on, the first ENG SYNC pulse resets counters 1414–1416, and thereafter, the counters continue to operate in response to the PRIM SYZD pulses without being reset. Due to the delays inherent in the filtering circuits in FIGS. 6 and 7, as well as the synchronizing operation of the circuitry shown in FIGS. 14a–14f, the ENG SYNC, DELAYED DWELL* and PRIM SYZD signals actually may be delayed a few hundred microseconds from their time relationship with the primary ignition signals shown in FIG. 14h.

In order to obtain information about the ignition signals for a particular cylinder of engine 100, the circuitry shown in FIGS. 13a–13c is capable of producing a CYL signal of the type shown in FIG. 14h. In the example shown in FIG. 14h, the CYL signal is used to obtain information for cylinder 102 or spark plug 102a. In order to produce the CYL signal shown in FIG. 14h, the data processor issues a CYLINDER SELECT OUTPUT COMMAND in the manner previously described.

The circuits shown in FIGS. 13a–13c and FIGS. 14a–14c are also used in order to derive digital numbers having values proportional to the time periods designated as N and P on FIG. 14h. More specifically, the N number has a value corresponding to the period of time from the opening of points 118, 118a to fire spark plug 101a (time P01, FIG. 14h) until the time the FLASH* signal is received from the timing light circuit over conductor 206 or the time the MONTIM* signal is received from the monolithic timing pick up over conductor 214. The P number has a value proportional to the period from time P01 to time P01' (FIG. 14h). That is, it has a value proportional to the time from one opening of contact points 118, 118a to fire spark plug 101a until the next opening of contact points 118, 118a to fire spark plug 101a.

Referring to FIG. 14i, the N and P numbers are obtained as follows:

The operator of the system throws an appropriate switch on the front panel (described hereafter) which energizes conductor 1620 (FIG. 14a) so that the circuitry responds to either the MONTIM* pulse received over conductor 214 or the FLASH* pulse received over conductor 206. In this example, it will be assumed that the circuitry is set to be responsive to the MONTIM* pulse.

When the data processor determines that it wants to obtain an N or a P number, it issues a P, N FLAG RESET OUTPUT COMMAND shown in TABLE 8.

TABLE 8

| P, N FLAG RESET | | | | | | OUTPUT COMMAND | | |
|---|---|---|---|---|---|---|---|---|
| AD2 | AD3 | AD4 | AD5 | AD6 | AD7 | BD1 | BD2 | BD3 |
| 0 | 1 | 0 | 0 | 0 | 1 | 1 | 1 | 1 |

In response to this COMMAND and a WRITE STROBE which switches conductor 1622 to its 1 state, NAND gate 1645 produces a PN CLEAR* pulse and NAND gate 1653 produces an N RESET* pulse (FIGS. 14b and 14i). In response to these pulses, the P FLAG and N FLAG signals are switches from their 1 to 0 states, the counters of circuits 1766-1769 are cleared to their 0 count states, and the PNTRNFR signal is switched from its 1 to its 0 state in order to close the port between the counters and latches in circuits 1766-1769. As shown in FIG. 14i, all of these operations occur at time T0.

As soon as contact points 118, 118a open to produce the next PR1 ignition signal, the ENG SYNC pulse is produced by the circuitry shown in FIG. 3 and is transmitted to conductor 252 (FIG. 14a). In response to this pulse, the PRTIG pulse, the PNCNTENABL signal is switched from its 0 to 1 state in order to make the counter portion of circuits 1766-1769 responsive to clock pulses CC05678A. As shown in FIG. 14i, each of these events occurs at time T1.

At time T2, (FIG. 14i), the MONTIM* signal is received over conductor 214 (FIG. 14a). In response to the MONTIM* signal, one-shot multivibrator 1573 generates an NRTIG signal which causes the N FLAG signal to switch from its 0 to 1 state. At the same time, the PNTRNFR signal is briefly switched to its 1 state so that the number represented in the counter portion of circuits 1766-1769 is transferred to the latch portion of the circuits. The transition of the PNTRNFR signal to its 1 state occurs between CC05678A clock pulses so that the counter portion of circuits 1766-1769 continues to count without missing any clock pulses.

After time T2 (FIG. 14i), the N number is held in the latch portion of circuits 1766-1769 and may be read at any time by the data processor. In order to determine whether the N or P numbers are ready, the data processor issues a PN STATUS INPUT COMMAND shown in Table 9:

TABLE 9

| PN STATUS INPUT COMMAND | | | | | | |
|---|---|---|---|---|---|---|
| AD2 | AD3 | AD4 | AD5 | AD6 | AD7 | SW1-SW3 |
| 0 | 1 | 0 | 0 | 0 | 1 | P,N STATUS |

When a READ STROBE is generated, the status of the PFLAG, NFLAG and POVRFLOW signals can be sensed over conductors SW1-SW3. When the data processor decides to read the N number, it issues a READ N INPUT COMMAND shown in TABLE 10:

TABLE 10

| READ N INPUT COMMAND | | | | | | |
|---|---|---|---|---|---|---|
| AD2 | AD3 | AD4 | AD5 | AD6 | AD7 | SW0-SW15 |
| 0 | 0 | 1 | 0 | 0 | 1 | ←N NUMBER→ |

In response to this command and a READ STROBE, the PNREAD* pulse and N READ STROBE* pulse are generated which causes the latches of circuits 1766-1769 to transmit the N number over conductors SW0-SW15 to the data processor. As shown in FIG. 14i, these events occur at the time T3.

At time T4, in response to the N READ STROBE* signal, flipflops 1639, 1640 and NAND gates 1650-1652 cause the PNTRNRF signal to switch from its 0 to 1 state so that the ports between the counters and latches of circuits 1766-1769 are opened. Thereafter, the latches store each number generated by the counters.

The counters of circuit 1766-1769 continue to count clock pulses unti the occurrence of the next ENG SYNC* pulse at time T5. At this time, a PTRIG pulse is generated, the PNCNTENABL signal is switched from its 1 to 0 state to prevent the counters of circuits 1766-1769 from responding to any additional clock pulses, and the PFLAG signal is switched from its 0 to 1 state. At this point in time, the P number is held in the latches of circuits 1766-1769 and may be read by the data processor at any time.

When the data processor wants to know the status of the P number, it transmits a PN STATUS OUTPUT COMMAND (TABLE 9). Since the PFLAG signal is in its 1 state, the data processor knows that the P number is available for reading.

When the data processor desires to read the P nnumber, it issues a P READ INPUT COMMAND shown in Table 11:

TABLE 11

| P READ INPUT COMMAND | | | | | | |
|---|---|---|---|---|---|---|
| AD2 | AD3 | AD4 | AD5 | AD6 | AD7 | SW0-SW15 |
| 1 | 1 | 0 | 0 | 0 | 1 | P NUMBER |

In response to this command and a READ STROBE, the PN READ* pulse and N READ STROBE* pulse are generated on conductor 1627. In response to this signal, the latches of circuits 1766-1769 transmit the P number over conductors SW0-SW15 to the data processor.

CHARACTER CONTROLLER 1800

Character controller 1800 is a character generator used to generate the video signals required to display alphabetic, numeric and symbolic characters on the face of the CRT tube located in display monitor 190. The character controller has a refresh capability which continues refreshing the data on the CRT screen once a set of characters has been inputted to the device by the data processor. This same set of characters will be refreshed until a new command is received from the data processor.

Referring to FIGS. 15a-15e, information relating to the display data is stored in a character generator read-only memory 1810. The appropriate data is also generated by a main shift register 1812 and not display shift registers 1814, 1815. Data identifying the type of information to be displayed, as well as the location of the information on the CRT face, is received and stored in data display address registers 1818, 1819 and character identification latches 1820, 1821.

Controller 1800 also includes refresh buffer memories 1824-1826, a line counter 1829, a character row/line counter 1830, a row/line counter 1831, additional counters 1832, 1833, J-K flipflops 1836-1842, one-shot multivibrators 1845, 1846, NAND gates 1849-1864, AND gates 1865-1906, NOR gates 1908-1920, an OR GATE 1924, inverters 1928-1946, Exclusive OR gates 1950-1958, a logic gate 1959, diodes 1961-1964, resistors 1967-2013, and capacitors 2020-2027. The components are connected by conductors 2031-2079 which are schematically shown as merging together into cables 2084-2087. Of course, in practice, the conductors remain isolated from each other. The entrance and exit points from the cables are clearly shown both by the numbers of the conductors at both ends and also by mnemonic identification codes drawn beside the conductors. Additional conductors 2090-2100 are also used in order to interconnect the components.

OPERATION OF THE CHARACTER CONTROLLER 1800

The control of information placed on CRT 192 is maintained completely by character controller 1800 which has a refresh capability to continue refreshing data on the CRT screen. Once the set of characters has been inputted to the controller by the data processor, this same set of characters will be refreshed until a new command is received.

For purposes of character display, CRT screen 192 is divided into 16 horizontal rows (row 0 at the top to row 15 at the bottom) and 32 vertical columns (column 0 at the left to column 31 at the right) (See FIG. 16). CRT 192 includes an electron beam-producing electron gun which scans the face of the CRT with a predetermined number of parallel beam scan lines at a predetermined rate. Each line is scanned at the same predetermined rate during a time period having a predetermined duration. Character controller 1800 includes a clock, a line counter and a row counter which enable the scan of the electron gun to be divided into rows and lines within a row. A total of 512 characters may be placed on the screen at any one time. The character set normally stored in read-only memory 1810 is described in the following Table S:

TABLE S

| CHARACTER SET FOR DISPLAY |||||||| 
|---|---|---|---|---|---|---|---|
| OCTAL CODE | CHARACTER | OCTAL CODE | CHARACTER | OCTAL CODE | CHARACTER | OCTAL CODE | CHARACTER |
| 00 | at | 20 | P | 40 | (Blank) | 60 | 0 |
| 01 | A | 21 | Q | 41 | ' | 61 | 1 |
| 02 | B | 22 | R | 42 | "(Quote) | 62 | 2 |
| 03 | C | 23 | S | 43 | # | 63 | 3 |
| 04 | D | 24 | T | 44 | $ | 64 | 4 |
| 05 | E | 25 | U | 45 | % | 65 | 5 |
| 06 | F | 26 | V | 46 | & | 66 | 6 |
| 07 | G | 27 | W | 47 | '(Apostrophe) | 67 | 7 |
| 10 | H | 30 | X | 50 | ( | 70 | 8 |
| 11 | I | 31 | Y | 51 | ) | 71 | 9 |
| 12 | J | 32 | Z | 52 | * | 72 | : |
| 13 | K | 33 | [ | 53 | + | 73 | ; |
| 14 | L | 34 | \ | 54 | , (Comma) | 74 | < |
| 15 | M | 35 | ] | 55 | - | 75 | = |
| 16 | N | 36 | ↑ (Overflow) | 56 | . (Period) | 76 | > |
| 17 | O | 37 | ← | 57 | / | 77 | ? |

Only one character is entered into the controller registers 1818-1821 at a time, and each time a row and column must be specified in a CHARACTER CONTROLLER WRITE CHARACTER OUTPUT COMMAND shown in TABLE 17:

TABLE 17

| CHARACTER CONTROLLER WRITE CHARACTER OUTPUT COMMAND |||||||||
|---|---|---|---|---|---|---|---|---|
| AD2 | AD3 | AD4 | AD5 | AD6 | AD7 | BD0 | BD1-BD6 Character | BD7-BD11 Column | BD12-BD15 Row |
| 1 | 1 | 1 | 0 | 0 | 1 | 0 | | | |

As shown in TABLE 17, the address of the character controller is transmitted to conductors AD2-AD7, the BD0 conductor is set to its 0 state, the binary code of character to be entered into the controller is transmitted to conductors BD1-BD6, the column in which the character is to be displayed is transmitted to conductors BD7-BD11, and the row in which the characters are to be displayed is transmitted to conductors BD12-BD15. The signals by which the column and row are identified constitute display address signals which determine the location on CRT screen 192 at which the character is displayed. These address signals are normally stored in read-only memory 1094.

After the character is stored in the character controller, it is outputted to the CRT screen and the SW0 conductor is set to its 1 state, indicating that a new character can be accepted. The data processor can read the status of the ready/busy flag on conductor SW0 by issuing a CHARACTER CONTROLLER STATUS INPUT COMMAND shown in TABLE 18:

TABLE 18

| CHARACTER CONTROLLER STATUS UNPUT COMMAND |||||||
|---|---|---|---|---|---|---|
| AD2 | AD3 | AD4 | AD5 | AD6 | AD7 | SW0 |
| 1 | 1 | 1 | 0 | 0 | 1 | 0 = busy 1 = ready |

The approximate time required to store and display one character is about 1.1 millisecond.

By using a CHARACTER CONTROLLER FLUSH OUTPUT COMMAND shown in TABLE 19, the data processor can erase the CRT screen and all previous character data.

TABLE 19

| CHARACTER CONTROLLER FLUSH OUTPUT COMMAND |||||||
|---|---|---|---|---|---|---|
| AD2 | AD3 | AD4 | AD5 | AD6 | AD7 | BD0 |
| 1 | 1 | 1 | 0 | 0 | 1 | 1 |

The erase operation takes about 7.0 milliseconds. No reset is required, simply a CHARACTER CONTROLLER STATUS INPUT COMMAND to sense the ready/busy flag.

Referring to FIG. 18, the block format for generation of a single character is divided horizontally into 9 clock periods and vertically into 15 lines per row. The RPM scale marks are generated approximately in the first 9 lines of row 0, and the horizontal bar portion of the RPM bar graph is generated in approximately lines 11, 12, and 13 of row 0.

In order to properly position the characters on the CRT screen, the character controller produces a HORBLANK signal at the end of each line. At the end of each 15 HORBLANK pulses, the controller knows that a row has been completed, and therefore, generates a ROWEND pulse. In addition, when the entire face of the CRT screen has been scanned, the controller produces a FRAME-START pulse indicating that a new frame has started. These pulses are used by the character controller in order to insure that video information is transmitted to the monitor over conductor 2090 (FIG. 15e) at the proper instant to place the character in the correct position on the CRT face. The characters can be displayed on the CRT screen in a character group consisting of one or more characters.

FRONT PANEL INTERFACE CIRCUIT 2240

Referring to FIGS. 19a and, 20c front panel 182 includes the front panel interface circuitry 2240. As indicated in FIG. 19a, the circuitry includes the following set-up switches which must be properly adjusted by the operator before the system is ready for operation: cylinder number switch 2250, timing switch 2290, ignition type switch 2296, and ignition selector switch 2300.

Cylinder number switch 2250 is settable to the 2, 3, 4, 6, 8 and 12 cylinder positions which correspond to conductors C2, C3, C4, C6, C8 and C12, respectively. The information derived from the conductors is coded by AND gates 2252-2268. The coded information is recorded in a panel register 2270 comprising latches 2272-2287, and the coded number of cylinders in engine 100 is held in latches 2272-2275.

Timing switch 2290 is set to the "magnetic" position corresponding to contact 2292 if timing information is to be received by magnetic pick-up 137 and is set to the "manual" position corresponding to contact 2293 if timing information is to be introduced by manual means, such as a timing light. The type of timing selected by switch 2290 is stored in latch 2282 of the panel register.

Ignition type switch 2296 is moved to the "2 cycle" position, corresponding to contact 2298, if a two-cycle engine is tested, and is moved to the four-cycle position, corresponding to contact 2299, if a four-cycle engine is tested. This information is stored in latch 2283.

The front panel also includes a pin point switch 2318 and an area switch 2320 which determine whether pin point or area tests are performed by the system. This information is coded by means of resistors 2322, 2323, NAND gates 2325, 2326 which prevent the pin point and area switches from being activated at the same time. If the pin point switch is activated, an amplifier 2328 illuminates a light bulb 2829 in order to indicate the mode of operation to the operator. If the area switch is activated, an amplifier 2330 illuminates a light bulb 2331 in order to indicate this mode of operation to the operator. In this specification, it will be assumed that only area tests are performed.

Referring to FIGS. 19a, 19b and 20a, keyboard 184 has 20 switches which are conductively connected through a cable 2346 to a conventional encoder 2348. The encoder communicates with the circuitry shown in FIG. 20a through conductors 2350-2358. Each time the ENTER, RESTART 1, conductors 2350-2358. Each time the ENTER, RESTART 1, RESTART 2 and 0 switches are pushed, the respective conductors 2350, 2355, 2356 and 2357 are switched to their 0 states. The remaining conductors 2351-2354 are used to code the remaining switches of keyboard 184 into a binary code.

Referring to FIG. 20a information transmitted from the keyboard is stored in a keyboard register 2359 comprising latches 2360-2364, as well as a latch 2365 used to indicate a request for an amperes calibrate procedure.

Circuitry used for transmitting keyboard data to latches 2360-2364 and for setting the KB FLAG in latch 2452 of the status register includes NAND gates 2370-2377, AND gate 2379, NOR gates 2380, 2381, one-shot multivibrators 2382, 2383, inverters 2386-2390, resistors 2393-2408, a diode 2412 and capacitors 2415-2424.

If any of the switches on the keyboard is depressed, the normally 0 output of NAND gate 2375 is switched to its 1 state. As a result, the output of NOR gate 2380 is switched to its 1 state for about 1 millisecond so that NAND gates 2370-2374 can transmit data from the keyboard into latches 2360-2364, respectively. Thereafter, the 0 state of the output of NOR gate 2380 prevents additional information from being entered into latches 2360-2364. At the same time the output of NOR gate 2380 is switched to its 1 state, the output of the flipflop formed by NAND gates 2376, 2377 is switches to its 1 state in order to set the KB FLAG in latch 2452 to its 1 state. If a pulse is received over conductor 2526, the output of the flipflop formed by NAND gates 2376, 2377, is reset to its 0 state, thereby resetting the KB FLAG to its 0 state and also resetting the keyboard register 2359 to its 0 state.

If the operator wants the system to perform an amps calibrate routine, he closes switch 2430 (FIG. 20b) which is located physically on the ammeter probe. Closure of switch 2430 stores a logical 1 signal in latch 2365 by means of one-shot multivibrator 2432, an inverter 2434, a diode 2435, resistors 2437-2442, capacitors 2444-2447 and a conductor 2449. Latch 2365 is reset at the same time the keyboard register 2359 is rest.

Referring to FIG. 20a, the DELTA FLAG is stored in latch 2453 of the status register in order to control the data displayed by the character controller, as well as the sampling time interval of various engine parameters. The operator can control the data display and sampling time intervals by means of a refresh rate switch 2455 (FIG. 19a) which includes a potentiometer slide 2456 and a command switch 2457.

During the automatic phase of operation, switch 2455 is moved to the automatic portion of its span shown in FIG. 19a which causes switch 2457 to close. The time required in order to store a DELTA FLAG in latch 2453 is then controlled by the time period of oscillator 2460. The oscillator, in turn, is controlled by capacitor 2463 and resistors 2465-2467. The rate at which the oscillator produces pulses can be controlled by means of potentiometer slider 2456 from about 0.1 and 10 seconds. When the oscillator produces a pulse in the automatic mode, it is transmitted and stored in latch 2453 by means of NAND gates 2469-2472, and AND gate 2474, an inverter 2475 and resistors 2477-2480.

If switch 2455 is moved to the command position shown in FIG. 17a, oscillator 2460 no longer controls the rate at which a DELTA FLAG is stored. Instead, in order to store a DELTA FLAG in latch 2453, the ENTER switch on the keyboard must be depressed, or a button on the remote controller must be depressed. In either case, the enter conductor 2350 is switched to its 0 state, which results in the storing of a DELTA FLAG in latch 2453 by means of a one-shot multivibrator 2482, a diode 2483, resistors 2485, 2486 and capacitors 2488, 2489.

Referring to FIG. 20b, the circuitry for reading and resetting the KB, panel and status registers includes AND gates 2492-2502, NOR gates 2506-2508, NAND gates 2510-2514, inverters 2517-2519 and conductors 2523-2527.

In order to read the information stored in the panel register, the data processor issues a PANEL REGISTER READ INPUT COMMAND shown in TABLE 21.

TABLE 21
PANEL REGISTER READ INPUT COMMAND

| AD2 | AD3 | AD4 | AD5 | AD6 | AD7 | |
|---|---|---|---|---|---|---|
| | 1 | 0 | 0 | 1 | 0 | 1 |
| SW0 | SW1 | SW2 | SW4 | SW5-SW10 | SW11-SW14 | SW15 |
| Pinpoint Mode | Pinpoint or Area | Timing Type | Pinpoint Test Selection | No. of Cylinders | | 2/4 Cycles |

As previously explained, as soon as a keyboard switch is depressed, the KB FLAG is stored in latch 2452. The data processor recognizes that keyboard data is prepared to be read by issuing a STATUS REGISTER READ INPUT COMMAND shown in TABLE 22.

TABLE 22
STATUS REGISTER READ INPUT COMMAND

| AD2 | AD3 | AD4 | AD5 | AD6 | AD7 | SW14 | SW15 |
|---|---|---|---|---|---|---|---|
| 0 | 1 | 0 | 0 | 0 | 1 | KB FLAG | FLAG |

By issuing the command, the data processor can read the status of the KB FLAG from conductor SW14.

If the KB FLAG is positive, the data processor reads the information on the keyboard by issuing a KEYBOARD REGISTER AND AMP. CAL. READ INPUT COMMAND shown in TABLE 23.

TABLE 23
KEYBOARD REGISTER & AMP. CAL. READ INPUT COMMAND

| AD2 | AD3 | AD4 | AD5 | AD6 | AD7 | SW0-SW4 | SW6 |
|---|---|---|---|---|---|---|---|
| 0 | 1 | 0 | 1 | 0 | 1 | Keyboard Data | Amp. Cal. Request |

By issuing this command, the data processor can read the keyboard data from conductors SW0-SW4 and can determine whether an amps calibrate request is made from the state of conductor SW6.

After the data from the keyboard register is read, the KB FLAG is reset by issuing a KEYBOARD RESET OUTPUT COMMAND shown in TABLE 24.

TABLE 24
KEYBOARD RESET OUTPUT COMMAND

| AD2 | AD3 | AD4 | AD5 | AD6 | AD7 | BD14 |
|---|---|---|---|---|---|---|
| 0 | 1 | 0 | 0 | 0 | 1 | 1 |

In this command, conductor BD14 is switched to its 1 state, FIG. 17d, so that AND gate 2500 produces a pulse which resets the keyboard register 2359 and the KB FLAG and latch 2452.

In order to reset latch 2365, which determines whether an amps calibrate routine is requested, the data processor issues an AMP. CAL. RESET OUTPUT COMMAND shown in TABLE 25.

TABLE 25
AMP. CAL. RESET OUTPUT COMMAND

| AD2 | AD3 | AD4 | AD5 | AD6 | AD7 | BD13 |
|---|---|---|---|---|---|---|
| 0 | 1 | 0 | 0 | 0 | 1 | 1 |

During this command, conductor BD13 is switched to its 1 state (FIG. 20b), so that AND gate 2503 transmits a pulse which resets latch 2365.

In order to determine whether additional data should be displayed or generated, the data processor from time-to-time issues a status register read input command to determine the state of the DELTA FLAG on conductor SW15. This command is shown in TABLE 22. If the DELTA FLAG has been switched to its 1 state, if indicates that a new time interval has elapsed. The data processor then resets the DELTA FLAG, thereby acknowledging that the time interval has elapsed, by issuing a DELTA FLAT RESET OUTPUT COMMAND shown in TABLE 26..

TABLE 26
DELTA (Δ) FLAG RESET OUTPUT COMMAND

| AD2 | AD3 | AD4 | AD5 | AD6 | AD7 | BD15 |
|---|---|---|---|---|---|---|
| 0 | 1 | 0 | 0 | 0 | 1 | 1 |

During this command, conductor BD15 is switched to its 1 state so that AND gate 2501 (FIG. 20b) produces a pulse which resets latch 2450.

Referring to FIG. 21, remote control transmitter 2550 cooperates with a companion radio receiver 2552. A typical transmitter and receiver pair useful for this purpose is manufactured by Intercontinental Dynamics Corporation, Model RT101. In response to the depression of a button 2551 (FIG. 3b) on the transmitter, the receiver generates a voltage pulse for approximately 0.5 seconds on conductor 2553.

Depression of the button either results in a PROCEED command which advances the analyzing system to the next test, or in an ENTER command which allows data to be entered into the system. The response of the system to the depression of button 2551 depends on whether the system is in the command mode, or the automatic refresh mode determined by switch 2445 (FIG. 19a). If the system is in the command mode, switch 2455 opens switch 2457 (FIG. 20a) so that a positive voltage is conducted over conductor 2562 (FIG. 21). In response to this positive voltage, a pulse is transmitted through NAND gate 2556 to conductor 2350. This pulse generates the DELTA FLAG and stores it in latch 2353 (FIG. 20a) in the manner previously described.

If the system is in the automatic refresh mode, switch 2457 (FIG. 20a) is closed so that conductor 2562 is held to ground potential. In this mode of operation, NAND gate 2556 is disabled and NAND gates 2557-2559 are enabled, so that output conductors 2352-2354 are each switched to their 0 state in the same manner as if the PROCEED button of the keyboard had been depressed. As a result, a PROCEED command is stored in latches 2350-2364 of keyboard register 2359 (FIG. 20a).

INPUT STATUS REGISTER

As previously described, a peripheral device called the input status register has storage latches located throughout the circuitry. Most of these latches have been described in connection with FIGS. 12–19. In general, upon the happening of a particular event, one of the devices described in FIGS. 12–19 sets a flag bit to a 1 state. By issuing an INPUT STATUS REGISTER INPUT COMMAND (Table 5), the data processor may read all the bits of the status register to determine the status of the flag in question. The data processor also may selectively reset the flag to a 0 state or may leave the flag bit in its 1 state by means of output commands previously described. The location and function of the various input status register flag bits is summarized in TABLE 27:

In order to obtain the analog and digital data required for display on the CRT screen in the area tests, the data processor steps through a basic executive control sequence schematically shown in the flowchart of FIG. 19. This sequence is common to all test modes and is used throughout all data acquisition subroutines, area tests and pin point tests. The executive sequence embodies a basic set of subroutines used to scan the front panel control switches and registers, read entries from keyboard 184, display characters and messages on the CRT screen, monitor the real time clock, and scan the input status register. The executive subroutines, combined with the calls to them embedded within the measure-

TABLE 27
INPUT STATUS REGISTER

| FLAG NAME | SW CONDUCTOR | LOCATION | FUNCTION |
|---|---|---|---|
| ADC READY | 0 | FIG. 12e | Indicates whether an analog-to-digital conversion has been completed. |
| P | 1 | FIG. 14e | Indicates whether the P number is in the P register (latches of circuits 1766–1769). |
| POVRFLOW | 2 | FIG. 14e | Indicates whether the counters of circuits 1766–1769 have overflowed (i.e., P and N numbers are invalid.) |
| N | 3 | FIG. 14e | Indicates whether the N number is in the N register (latches of circuits 1766–1769). |
| E | 4 | FIG. 14d | Indicates whether the E number is in the E register (latches of circuits 1770–1773). |
| EOVRFLOW | 5 | FIG. 14d | Indicates whether the counters of circuits 1770–1773 have overflowed (i.e., D and E numbers are invalid). |
| PREX | 8 | FIG. 35a | Indicates whether printer is operative. |
| KB | 14 | FIG. 20a | Indicates that data is available in the keyboard register. |
| DELTA | 15 | FIG. 20a | Indicates that time interval for refreshing display or sampling data has elapsed. |

SYSTEM PROCESSING AND MANAGEMENT

The preferred embodiment of the present invention is structured around data processor 1090 which is a 16-bit parallel bus microprocessor having multiple accumulators, a LIFO stack, and a microinstruction set implemented in a control read-only memory for interpretation and execution of macro-level assembly language instructions.

Data processor 1090 manages the acquisition of analog and digital data from engine 100, processes the data and displays the results in alphanumeric and graphical form on CRT face 192 of display monitor 190. The system is managed under the control of front panel 182 and keyboard 184. By the use of switch 2320 (FIG. 19a), the operator may select area tests for display on the CRT screen:

The area tests are conducted in a program sequenced manner in order to locate a general area of engine malfunction. As the operator pushes the remote control button 2551 or the PROCEED button on keyboard 184, the next area test in the sequence is initiated. Until the operator pushes the PROCEED button, the data processor updates the data on the CRT screen at a refresh rate determined by the position of Refresh Rate switch 2455. The operator is allowed to push the BACK SPACE button on keyboard 184 if he wishes to return at any time to the previous step in the test sequence. Pushing the RESTART button on the keyboard at any time aborts the sequence, flushes or blanks the CRT screen, and returns the operator to the setup phase of operation.

ment and computational program segments, form the executive control sequence.

System status words are stored and updated in a read/write memory contained within data processor 1090. The status words enable the executive control sequence to transfer control to the required program segments or mesurement subroutines. The system status words include such items as:
(1) Input status register
(2) Front panel register
(3) Last keyboard entry
(4) Program segment linkages
(5) Mode flags (area or pin point)
(6) Display row and column coordinates The encircled A in FIG. 22 indicates the initial entry point into the test mode. This same symbol is used to indicate the initial entry point on the area test flow charts. The encircled B in FIG. 22 indicates a secondary entry point after test mode initialization and no change in test mode has been requested by the operator through the front panel or the keyboard. The same encircled B symbol is used on the area test flow charts to indicate a secondary entry point.

As shown in FIG. 22, analog data is acquired and displayed in steps S2, S3, and the digital-type ignition data obtained from the P and N registers is acquired, computed and displayed in steps S4 and S5.

The manner in which the analog data is acquired and displayed is more fully described in the analog-digital converter data acquisition and display flow chart of FIG. 20. As shown in step S24, the data processor sets the range code of analog control system 1100 as required. As previously explained, the range is set by issuing the ADC FLAG RESET and ADC SETUP output commands described in TABLES 1 and 2. Basically, the data processor first reads the highest numbered range of ammeter circuit 610 and voltmeter circuit 700. If the value of amperes or volts obtained from ammeter circuit 610 or voltmeter circuit 700 is lower than the stored range number (TABLE C), the next lower numbered range is read. As a result of this operation, amperes and volts are always measured in the range of the analog circuits which maximizes accuracy. The range is altered by changing the range adjustment signal line which is activated by decoder 1142 (FIG. 12a).

In step S33 of FIG. 23, the data processor delays the conversion of analog data by reading real time clock 1320 through a REAL TIME CLOCK INPUT COMMAND (Table 3). As previously explained, the delay period is needed in order to allow certain of the analog data acquisition circuits to settle and attain stable conditions. The amount of time required varies from one circuit to the next and extends from a low of 50 milliseconds settling time required to read the actual amperes from circuit 610 to a high of 6000 milliseconds settling time required for the condenser leakage test conducted by circuits 750, 830 and 950.

In step S28, the data processor issues an ADC CONVERSION OUTPUT COMMAND (TABLE 4) which causes the conversion of the analog signal to digital form. In step S31, the status of the conversion is determined by issuing an INPUT STATUS REGISTER OUTPUT COMMAND (TABLE 5). If the conversion is complete, the result is read from buffers 1367, 1368 in step S36 by issuing a READ ADC INPUT COMMAND (TABLE 6). If the resulting digital number is outside the proper range, the program returns to step S24 where the range is adjusted by switching a different output of decoder 1142 to its 1 state.

If an overflow condition exists in which no range can read the parameter, the overflow symbol (TABLE S) is displayed in step S39. This is a unique feature which enables the operator to tell at a glance that the parameter cannot be measured.

In step S42, K is 2500. If no conversion has been completed within 2.5 seconds, the invalid data signal is displayed (step S43).

Once analog parameter reading has fallen within the limits defined by the ranging criteria, it can be converted to a decimal number for display in engineering units on CRT face 192 using the following formula:

Units = (ADC reading obtained from buffers 1367, 1368) (conversion factor).

The data processor automatically uses the foregoing formula in order to accurately convert the digital measurement numbers obtained from buffers 1367, 1368 to digital display signals having an engineering unit suitable for display on CRT face 192 and understandable to the operator of the system. The digital display signals are stored in the read/write memory of processor 1090 before they are outputted to character controller 1800. This is a unique feature which enables a parameter to be displayed in different engineering units merely by changing the processor program.

Aside from the analog parameters, the data processor calculates a number of digital type engine parameters obtained from the P and N registers. The manner in which this data is obtained by the data processor is shown in the flow chart of FIG. 24. FIG. 24 describes the acquisition and display of the P, N and accumulated D numbers.

In steps S65, S66 (FIG. 24), the status of the N and P registers is determined by issuing a PN STATUS INPUT COMMAND (Table 10). In step S78, the N register is read by issuing a READ N INPUT COMMAND (Table 10); in step S80, the P register is read by issuing a P READ INPUT COMMAND (Table 11). In step S82, the program determines whether the PC mode has been set by use of the MODE CONTROL OUTPUT COMMAND (Table 12). In step S90, the P and N registers are reset by issuing a P, N FLAG RESET OUTPUT COMMAND (TABLE 8) and the E and D registers are reset by issuing an E FLAG RESET OUTPUT COMMAND (TABLE 13). In step S97, the value of K is 10,000.

The calculations of RPM (speed), referred to in step S94 of FIG. 22 are defined in TABLE 28:

TABLE 28

$$\text{RPM for 2 cycle engines} = \frac{2678578}{P},$$

$$\text{RPM for 4 cycle engines} = \frac{2(2678578)}{P}$$

P = P number obtained from circuits 1766 – 1769 (FIGS. 14e and 14i)

As seen in Table 28, when the P number is used to calculate RPM, it constitutes a digital RPM signal which is converted by the data processor.

The data processor includes numerical averaging techniques for engine parameters having continuous variations, such as engine speed. The averages are taken over a predetermined number of engine revolutions or a fixed number of readings depending upon the display requirements. Examples of these averaging techniques will be described more fully in connection with area test 1.

The data processor uses the foregoing data acquisition, calculation and display capabilities in order to properly calibrate and set up the system and conduct area tests designed to uncover general areas of malfunction.

The basic organization of these set up procedures and tests is described in the man/machine flow diagram of FIG. 25. When the system is first turned on, step S140 of FIG. 25 results in the display on CRT face 192 shown in FIG. 26. This display communicates instructions to the operator which enables cable assembly 150 to be connected to engine 100 in the manner shown in FIG. 1.

When the PROCEED button (or remote control button 2551) is pushed, step S141 is entered which results in the display shown in FIG. 27. The operator is informed to select the number of cylinders in the engine, ignition type, ignition selector position and type of timing by operating switches 2250, 2296, 2300 and 2290. The display of FIG. 27 also invites the operator to enter the TDC offset angle of the magnetic or monolithic timing input. The offset angle of the monolithic mark supplied by the manufacturer is entered by the operator on keyboard 184 (See S129 of FIG. 24). If the value is accepted by the data processor, it is displayed in the lower right hand corner of the CRT face in the position indicated by the x's in FIG. 27. If the operator makes an error in entering the offset angle, the data processor displays the word ERROR in the place where the word ACCEPTED is shown in FIG. 27. The operator can then attempt to correct the offset angle by entering a new value in the keyboard. If the new value is accepted, the display shown in FIG. 27 is outputted to the CRT face.

When the PROCEED button on the keyboard is pushed, step S142 (FIG. 25) is entered and the display shown in FIG. 28 is generated. The operator is invited to close amps calibrate switch 2430 (FIG. 20b) so that the data processor automatically goes through an amps calibration routine wherein the ambient field picked up by ammeter probe 164 is read and is automatically stored in the memory for use later in the program. The stored ampere value provides a 0 offset value which is subtracted from the later-acquired ampere readings.

When the PROCEED button is again depressed, step S143 (FIG. 25) is entered and the display shown in FIG. 29 is generated. At this point in time, it is assumed that the operator pushes the AREA button (FIG. 19a). If the PROCEED button is then depressed, step S144 is entered and the display shown in box S144 of FIG. 25 is generated. When the PROCEED button is again pressed, the area tests are entered.

AREA TESTS

In area tests, a specified programmed sequence of tests is conducted by the data processor to locate a general area of engine malfunction. As the operator pushes the PROCEED button on the keyboard, the next step in the sequence is initiated, and, under control of the data processor, the operator is instructed by the CRT display. The results of each area test are displayed in alphanumeric form. Until the operator pushes the PROCEED button, the data processor updates (i.e., converts, calculates and displays) the data on CRT screen 192 at a refresh rate determined by refresh rate switch 2455.

In order to increase the flexibility of the system, the operator may push the BACK SPACE button on the keyboard anytime he desires to return to the previous step in the sequence. Pushing the RESTART button on the keyboard at any time aborts the sequence, blanks or flushes the CRT screen, and returns the operator to the preliminary or set-up phase (steps S140–S144, FIG. 25).

Two steps in the area sequence are described in this specification, and each step corresponds to one "page" of information which is simultaneously displayed on the CRT screen. The two area tests, together with the test conditions and parameters measured in each test, are described in the following TABLE 29:

TABLE 29

| NO. | TEST | TEST CONDITIONS | PARA-METERS MEAS-URED |
|---|---|---|---|
| 1. | CRANKING | DYNAMIC DISTRIB-UTOR "RESIST-ANCE" (POINTS CLOSED PRIMARY VOLTAGE) | VOLTS |
|  |  | CRANK VOLTAGE (BATTERY) OUTPUT | VOLTS |
|  |  | CRANK AMPS (BATTERY) | AMPS |
|  |  | SPEED | RPM |
| 2. | ALTERNATOR OUTPUT | ALTERNATOR | RPM, MAX. AMPS |

Additional area tests are described in the above-identified Cashel et al application.

In order to illustrate the flexibility of the system, area tests one and two will now be described in detail:

AREA TEST ONE - CRANKING

As soon as area test one is entered, the data processor causes a display of the type shown in FIG. 30 to be presented on CRT face 192. However, in place of the x's shown in FIG. 30, the data processor presents arabic numbers which quantitatively define the parameters shown in FIG. 30. These numbers are derived from the data processor program segment shown in the flow chart of FIG. 31.

As shonw in FIG. 31, step S171 results in the display of the test title and alphabetic format shown in FIG. 30. As previously explained in connection with character controller 1800, in order to display the format shown in FIG. 30, each separate character or symbol, together with its location on the CRT screen, is transmitted one-at-a-time to registers 1818—1821 and is stored in refresh memories 1824–1826 (FIG. 15c). When all the data required to display the format of FIG. 30 has been stored in the refresh memories, the display is commenced. The refresh capability of the character controller is then utilized in order to keep displaying the format until new instructions are received from the data processor. Thus, each area test format is displayed as a singel "page" on the CRT face. The page format of presenting data simplifies the task of the operator because he can view all of the critical parameters for each area test at a single glance. The same technique is used to display all other area test formats on CRT screen 192.

As shown in FIG. 30, in order to conduct the cranking test, the operator disables the ignition of engine 100 and cranks the engine by energizing the starter.

In step S172 of FIG. 31, the data processor enables an analog-to-digital conversion of the average amperes flowing through the battery cable (conductor 659) while the engine is being cranked. As shown in step S173, the data processor does not allow the number of amperes, or the number associated with any of the other parameters, to be displayed on CRT face 192 (FIG. 30) until the amperes flowing through the battery cable exceeds a predetermined number K. Normally, the value of K is 50 amperes. As a result, the proper information is displayed on the face of CRT 192 only during the actual cranking condition of the engine, not while the engine is stopped.

Before the starter draw current is displayed on row 6 of the CRT display (FIG. 30), the ambient current value stored during the amps calibration routine is substracted from the starter draw current value obtained from analog system 1100.

As soon as the current flowing through the battery cable exceeds 50 amperes and 1 second has elapsed (X=1000 in step S175), the system automatically reads, stores and displays the parameters shown in FIG. 30.

Referring to step S180 (FIG. 31), the data processor takes readings of the points closed portion of the primary signal transmitted over conductor 606 to multiplexer 1350 (FIG. 12d). The N signal samplings of the points closed portion of the primary signal are then averaged and displayed opposite the legent "DYN. DIST. RES." on the CRT face 192 (FIG. 30). Normally, N=8.

AREA TEST TWO - ALTERNATOR OUTPUT

When the operator has finished area test one, he may advance to area test two by pushing the PROCEED button on the keyboard. At that time, the data processor causes character controller 1800 to display on CRT screen 192 the format shown in FIG. 32. As shown in FIG. 32, the operator is instructed to enable the ignition system, start the engine, accelerate the engine to a predetermined test speed (e.g., 2500 RPM), and return the engine to idle speed. As the engine is being accelerated to the test speed, the data processor enables the maximum amperes produced by the alternator to be displayed on screen 192, together with the engine speed at which the maximum amperes were generated. These numbers appear in the positions occupied by the x's in FIG. 32.

In order to determine the peak alternator output and the speed at which it is produced, the data processor executes the program segment shown in the flow chart of FIG. 33. In step S186, the data required to display the format shown in FIG. 32 is transmitted to character controller 1800 and is stored in the refresh memories 1824-1826 (FIGS. 15c). This results in continual refreshing of the display shown in FIG. 32.

At step S187, the current engine speed is determined. If the current engine speed is greater than the value S (which is normally set at the engine idle speed, 700 RPM), the average amperes are read from analog system 1100. In step S190, if the current average amperes are greater than the previous average ampere reading, the current reading is stored and displayed. By continuing this process as the engine is accelerated to its test speed, the maximum ampere reading and the corresponding engine speed at which the maximum reading occurs are numerically displayed on CRT screen 192. The maximum ampere reading, and corresponding RPM, are automatically computed and stored so that the operator can read them at his leisure.

In step S191, the current engine RPM is calculated and displayed. This display is executed by means of the commands previously described in TABLES 17-21.

PRINTER SYSTEM 2600

Referring to FIG. 3, printer system 2600 includes impact printer 2604 which prints on a paper sheet 2602 text data displayed on CRT face 192. During the printing operation, the text is "frozen" on the CRT face. The operation of printer 2604 is directed by printer controller 2630 which receives commands from data processor 1090.

Referring to FIG. 34, impact printer 2604 is a 5×7 dot matrix-type printer, such as Model IPM 130 manufactured by the Victor Corporation. The printer includes a print head 2606 containing seven needles arranged substantially vertically which are driven by seven print solenoids generally indicated by 2608. The needles are driven against a cylindrical platen 2610 which is held behind sheet 2602. During the printing process, head 2606 is driven from right to left along a drive screw 2612 by a print motor (not shown) which responds to a signal on conductor MD. The motor is connected to the head through a main clutch (not shown) operated by signal on conductor MC.

The printer also includes a comb 2613 which defines 34 slots. The slots are used in order to generate signals defining the position of the head at any point in time. A print ribbon (not shown) arranged between head 2606 and sheet 2602 has a red segment and a black segment. The position of the ribbon is controlled by the logic state of a conductor RR. A paperfeed clutch (not shown) advances sheet 2602 from roll 2603 in response to the logic state of conductor PFC. The logic state of conductor PFC, in turn, is determined by a home position signal detected by a notch in the clutch disc. In general, the signal on the conductor PFC tells the paperfeed clutch when to stop advancing the paper.

The impact printer functions by forcing selected needles aganst either the red or black segments of the ribbon to form a character on sheet 2602. A 5×7 dot pattern arrangement is utilized in order to form any conceivable character. The characters are each seven dots high and five dot positions wide and are formed in a two dimensional array as the print head moves across the sheet. In addition to print solenoids 2608, print head 2606 contains an optical switch consisting of a light-emitting diode and a photo transistor (not shown). The optical switch is mounted to the print head and straddles the 34 slots in comb 2613. The openings are sensed as the head moves along a line of print. The resulting signals are transmitted through conductor OS1 to printer controller 2630 and are processed in a manner described later.

In order to cause the solenoids in head 2606 to print, the motor and the main clutch are energized by the operation of the printer controller. The print head 2606 then travels from right to left across the paper. At the end of a print row, the main clutch is deenergized, and the head is returned to the home position by a return spring. The rate of return of the print head is indicated by the frequency of the signals on conductor OS1. Logic circuitry in the printer control monitors the return rate in order to break the head if its speed exceeds a predetermined velocity. The paper advance is monitored by another optical switch which detects an opening in the notched clutch disc. When the home position is reached, a signal is transmitted over conductor OS2 which tells the paperfeed circuit to stop advancing paper.

A page of printing on sheet 2602 is divided into 32 columns and 16 rows, a total of 512 character positions. This is the same arrangement used in order to display characters on display face 192.

Referring to FIG. 1, the impact printer is controlled by switches located on the pinter console: a manual-auto switch 2620 determines whether the printer is used in the manual or automatic mode; a manual print switch 2621 initiates the printing of preselected material displayed on face 192, and a paper advance switch 2622 rotates paper roll 2603 so that sheet 2602 is advanced. The printer is also controlled from keyboard 184 and remote controller 2551 in a manner described later.

Printer controller 2630 is responsible for the controlling of all matrix printer sequence operations. It contains the control circuitry which develops the proper timing for head 2606, the advance of sheet 2602 and the storing of the text to be printed. The address data and output busses connected to data processor 1090 are used to input print text to a read/write buffer memory located in controller 2630. The buffer memory stores the text to be printed while the ame text is being displayed on face 192 and addresses a read-only memory character generator which controls the formation of the characters by the print head.

More specifically, referring to FIGS. 35a-36b, controller 2630 includes flip-flops 2632-2637, as well as an additional flip-flop 2638 comprising NAND gates 2639, 2640. One-shot multivibrators 2646-2654 provide proper timing for the logic circuitry. The controller also includes random access memories (RAM's)

2660-2663 which form a buffer memory for storing the characters to be printed in the form of six-bit ASCII codes. The six bit ASCII code for each character is read out of conductors D1-D6. Memories 2660 and 2662 form a memory pair which stores 256, 6-bit character words, and memories 2661 and 2663 form another memory pair which stores an additional 256, 6-bit character words.

Controller 2630 also includes a read-only memory decoder 2666 which transforms each ASCII code word on conductors D1-D6 into appropriate signals for driving the seven solenoids of head 2606 through conductors ROW1-ROW7.

Counters 2670-2673 supervise the addressing of memories 2660-2663. Counter 2673 is a 3-bit counter which counts the five dot positions which form each character and generates a clock pulse which toggles counter 2672 after each character is printed. Counters 2671 and 2672 comprise a 5-bit character counter which counts the number of characters printed in each row. At the end of each row, the counter 2671 produces an output pulse on conductor X4 which toggles counter 2670. Counter 2670 is a row counter which counts each of the 16 rows on a printed page of text material.

Controller 2630 also includes multiplexers 2675, 2676 which transmit addresses to a memory address bus (MAB) either from counters 2670, 2671 or from a pair of latches 2678, 2679 which receive character addresses from output data bus lines BD8-BD15. Controller 2630 also includes latches 2680, 2681 which receive data identifying a character to be printed over output data bus lines BD1-BD7.

In addition to the foregoing components, controller 2630 also includes NAND gates 2686-2717, AND gates 2726-2783, Exclusive OR gates 2784-2791, NOR gates 2796-2797, inverters 3002-3028, amplifiers 3036-3041, Tristate buffers 3048-3051, resistors 3058-3108, capacitors 3115-3128, diodes 3132-3133.

The components are connected in the manner shown in FIGS. 35a-36b by conductors 3140-3166, as well as additional lettered conductors. The components shown in FIGS. 35a-36b are arranged into the following circuits:

The circuitry shown in FIG. 35a comprises a register control circuit 3174 which receives and decodes commands from data processor 1090 and stores commands to be read into processor 1090. Conductor P receives a positive voltage from the printer power supply which indicates that the printer is on line and operating. The operable condition of the printer is detected by means of conductor SW8 of the input status register.

FIG. 35b includes an address decoding circuit 3175 and a print control circuit 3176 which includes the row and column counters 2670-2672.

FIG. 35c includes a multiplexer circuit 3177 which cooperates with multiplexers 2675, 2676 and multiplexes the most significant bit of the memory address transmitted over conductors A8 and $\overline{A8}$. A memory control circuit, including NAND gates 2695-2697 and AND gate 2750, controls the writing of data into memories 2660-2663. FIG. 35c also includes a write/flush logic circuit 3178 which determines whether print text is to be read into memories 2660-2663 or whether the text material is to be removed from the memories.

FIG. 35d discloses a dot matrix column counter 3179 which counts the number of dot positions in each character in the manner previously described.

FIG. 35e discloses a character generator 3180 which generates the proper control signals for the wire solenoids in head 2606 and based on the ASCII code read from memories 2660-2663.

Referring to FIG. 36a, a head strobe conditioning circuit 3182 converts the square wave signals from comb 2613 transmitted over conductor OS1 into square-wave clock pulses used to clock counter 2673. A head return rate circuit 3183 determines when the head is returning at a rate faster than normal and energizes the main clutch over conductor MC in order to slow the rate of return. A head home position circuit 3184 enables a new row of printing to occur when the head is returned to the righthand or home position. The remaining circuitry shown in FIG. 36a is used to drive the main motor and main clutch.

Referring to FIG. 36b, a paper advance logic circuit 3185 controls the length of advance of sheet 2602, and a ribbon control circuit 3186 controls whether the characters are printed in red or black ink.

OPERATION OF PRINTER SYSTEM 2600

The operation of printer system 2600 is controlled and coordinated with the operation of display monitor 190 by data processor 1090. The data processor communicates with the printer controller 2630 by means of input and output commands in much the same manner as it communicates with character controller 1800.

At the beginning of each area test or pinpoint test, the print text from the previous test is blanked from memories 2660-2663. In order to achieve this result, processor 1090 executes a Printer Data Output Command of the type shown in TABLE 30.

TABLE 30

| PRINTER DATA OUTPUT COMMAND | | | | | | | | | |
|---|---|---|---|---|---|---|---|---|---|
| AD2 | AD3 | AD4 | AD5 | AD6 | AD7 | BD15-BD12 | BD11-BD7 | BD6-BD1 | BD0 |
| 1 | 1 | 0 | 1 | 0 | 1 | ROW | COLUMN | CHARACTER | FLUSH WRITE |

The addressing code shown in TABLE 30 is put on conductors AD2-AD7 by the data processor in order to address printer controller 2630. As previously explained, all output commands are accompanied by a WRITE strobe and all input commands are accompanied by a READ strobe. The Printer Data Output Command results in the generation of a WRM signal (FIG. 35c) which enables a logical 1 state on line BD0 to be transmitted through NAND gate 2701 to one-shot 2649. One-shot 2649 triggers another one-shot 2648 which produces a $\overline{\text{BLANK}}$ signal on its $\overline{Q}$ output. During the generation of the $\overline{\text{BLANK}}$ signal, a fast clock 3190 developed from the data processor toggles counters 2670-2672 so that all of the memory locations sequentially are addressed. Since the $\overline{\text{BLANK}}$ signal is switched to its zero state during the flushing of the memories, the outputs of AND gates 2779-2783 (FIG. 35c) are held at their zero states, thereby forcing logical zeros on memory input conductors C0-C4 and a logical 1 on conductor C5. As a result of this operation, all of the locations in memories 2660-2663 are filled with logical blank codes during the BLANK period.

At the beginning of an area or pin point test, the format for the data display is transmitted to the character controller, one character at a time, by a series of Character Controller Write Character Output Commands (TABLE 17). The same Commands are decoded by printer controller 2630 and result in the CRT ADD conductor being switched to its logical 1 state (FIGS. 35b and 35c). In response to this decoding, latches 2678-2681 (FIG. 35c) are able to receive the address and character code being transmitted to character controller 1800. this is an important feature which enables the data processor to write print and display data to the character controller and printer controller simultaneously.

The data processor also can write printing text or blanks (e.g., logical 0's) to the buffer memory of the printer controller independent from the character controller. This mode of operation is achieved by transmitting a Printer Data Output Command (TABLE 30) in which the BD0 bit is switched to its logical 0 state, and the information contained in bits BD1-BD15 can be written into latches 2678-2681. As shown in TABLE 30, bits DB1-BD6 define the character to be written into the column and row of the printer memory defined by bits BD7-BD11 and BD12-BD15, respectively.

During a pinpoint of area test, the data processor determines the status of the printer by executing a Printer Status Input Command of the type shown in TABLE 31.

TABLE 31

| PRINTER STATUS INPUT COMMAND | | | | | | | | |
|---|---|---|---|---|---|---|---|---|
| AD2 | AD3 | AD4 | AD5 | AD6 | AD7 | SW7 | SW4 | SW0 |
| 0 | 0 | 1 | 1 | 0 | 1 | ROWEND | PRINT REQUEST | MODE |

The SW conductors referred to in TABLE 31 are shown in FIG. 35a. If bit SW0 is in a logical 1 state, the printer system is in the automatic mode; if bit SW0 is in a logical 0 state, the system is in a manual mode. As shown in FIG. 35a, conductor SW4 is set to its logical 1 state by tristate buffer 3048 in response to the closing of print request switch 2621. After printing has begun, the data processor determines whether a row of print has been completed by examining bit SW7.

At the end of a test, the operator can initiate printing by depressing the PROCEED switch on keyboard 184 or by operating remote controller 2550. If a print request has been received, the data processor initiates printing by executing a Printer Control Output Command of the type shown in TABLE 32.

to drive the solenoids of head 2606 so that the proper characters are printed on sheet 2602.

After the print head is moved thirty-two character positions, one shot 2646 generates a logical 1 state on the ROWEND conductor for 100 milliseconds. During the ROWEND time period, the main clutch disengages the print head from the motor drive so that the head is returned to its home or right-hand position by a spring. Circuit 3183 (FIG. 36a) periodically engages the main clutch to brake the head if its return speed becomes excessive.

The data processor detects the ROW END time period by executing the Printer Status Input Command and reading the status of conductor SW7 into its memory. The data processor then selects the red or black ink color for the next print row by executing a Printer Control Output Command (TABLE 32) in which conductors BD4 and BD5 are switched to their logical 1 and 0 states, respectively, for the blank segment of the ribbon and to their logical 0 and 1 states, respectively, for the red segment of the ribbon. Switching the ROWEND conductor to its one state also causes the paper to advance one line.

The additional rows of the page are printed in the manner previously described. At the end of the sixteenth row, the data processor resets the manual print flag and advances the paper by executing a Printer Control Output Command (TABLE 32) in which conductors BD15 and BD11 are set to their logical 1 states.

The system is then ready to remove the previously printed material from memories 2660-2663 and to begin another test.

While the printing is taking place, The text material displayed on face 192 is "frozen". That is, the text material continues to be displayed until the entire printing operation is completed.

PRINTER, PROCESSING AND MANAGEMENT

The preferred embodiment of the present invention enables data processor 1090 to coordinate the operation of display monitor 190 and printer system 2600. By coordinating the operation of these two system components, an operator is able to designate lines of the CRT display for special printing and enter a message indicat-

TABLE 32

| AD2 | AD3 | AD4 | AD5 | AD6 | AD7 | BD15 | BD11 | BD8 | BD4 | BD5 | BD0 |
|---|---|---|---|---|---|---|---|---|---|---|---|
| 0 | 0 | 1 | 1 | 0 | 1 | RESET MANUAL PRINT FLAG | PAPER ADVANCE | PRINT COMMAND | INK COLOR | | BUSY FLAG |

As shown in TABLE 32, data processor 1090 initiates printing by setting conductor BD8 to its logical 1 state. In response to the print command on conductor BD8, flip-flop 2633 (FIG. 35a) sets the BUSY conductor to its one state, thereby causing print head 2606 to move from right to left. As the print head moves, the signals from the comb 2613 are transmitted over conductor OS1 and are converted to digital CLOCK pulses which toggle counter 2673 (FIG. 35d). Counters 2670-2673 operate in the manner previously indicated in cooperation with the OS1 signals to address memories 2660-2663 in order ing a possible vehicle problem. The novel manner in which this mode of operation is achieved is described in connection with FIGS. 37-43b. Basically, printer system 2600 operates in one of two modes: automatic or manual. The printer is aset into the automatic mode by moving switch 2620 (FIG. 35a) to the position shown and is switched to the manual mode by moving switch 2620 to the opposite position adjacent resistor 3061.

In the automatic mode, each time a proceed command is received by the data processor, the printer will reproduce the area or pin point test data displayed on face 192. After the data for each test is printed, sheet 2602 is advanced four lines by an execution of the Printer Control Output Command in which conductor BD11 is set to its logical 1 state (TABLE 32).

The automatic mode will not allow printing of any of the cue messages associated with the initial setup of the front panel controls or the calibration instructions, nor will the service calibration data be printed. As long as the system is in the automatic mode, test data will be printed upon each proceed command regardless of whether the data is desired or not. To avoid this situation, the manual print mode may be entered at any time by operating switch 2620, thereby allowing the operator to skip over tests without printing them.

In the manual mode of operation, print request switch 2621 must be closed in order to initiate a printing operation. As in the automatic printer mode, the paper is advanced four lines following each pate of printing. The operator also can manually advance the paper by closing switch 2622 (FIG. 36b). However, the manual paper advance is disabled while printing is underway. During the manual print mode only, the operator may display a cursor adjacent any line of data. After the cursor is located, the operator may designate the line for special printing in order to indicate a possible vehicle problem. For any line so indicated, a flag appears in place of the cursor. A maximum total of fourteen lines may be indicated for special printing.

In both the automatic and manual print modes, an identification number may be entered on the printed sheet. The identification (ID) number may only be entered by the operator at the beginning of area test one. The procedure for entering the ID number is more specifically described in connection with FIGS. 42a and 42b.

Figure 40:
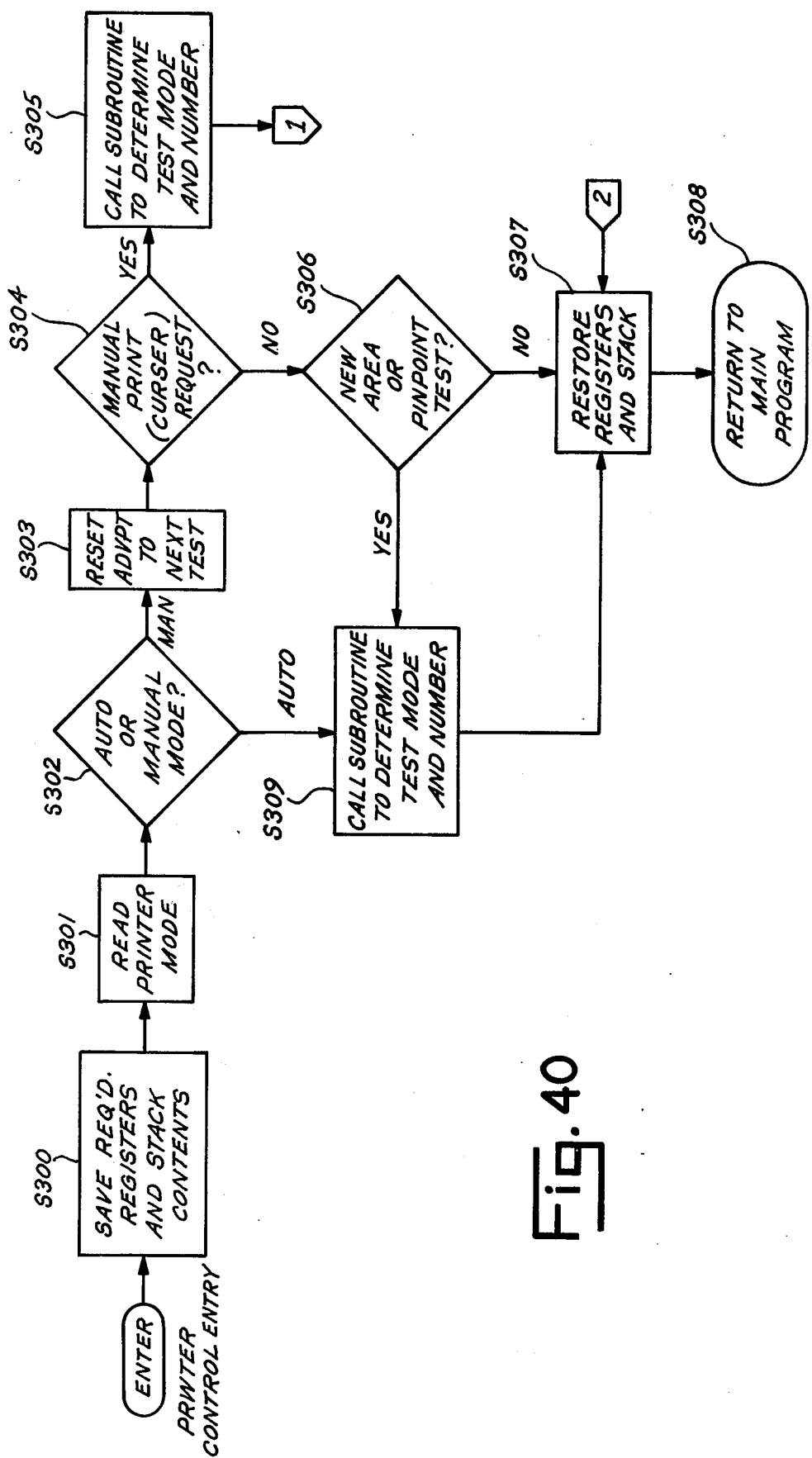

The data processor periodically executes a printer control routine shown in the form of a flow chart in FIG. 40. In step S300, the processor saves the required registers and stack contents of the program segment currently being executed. In step S301, the printer mode is read by executing a Printer Status Input Command (TABLE 31) in which the logic state of Conductor SW0 is read. If the printer is in the manual mode, the data processor resets the advance pointer (ADVPT) to the next test. The advance pointer is a memory location which identifies the program segment to be executed next after the proceed button is pushed. According to step S304, if there is a manual print or cursor request, the subroutine to determine the test mode and number is called in step S305. If there is no manual print or cursor request, the subroutine to determine the test mode and number is not called unless the system has entered a new area or pin point test as determined by step S306. In the event the test is not new, the processor returns to the main program through steps S307 and S308. As shown in FIG. 40, The subroutine to determine the test mode and number can be entered through either the manual or automatic mode. The subroutine is shown in detail in FIG. 41.

AUTOMATIC PRINTER MODE OPERATION

In order to provide an illustrative example of the operation of the subroutine, it will be assumed that the operator has completed the setup and calibration procedures discussed in connection with FIGS. 27-29 and has pushed the area switch 2320 (FIG. 19a which takes him into area test one. Since area test one has just been entered, step S311 determines that the advance pointer has not been set to print control, and step S313 determines that the operator is in an active area test (i.e., area test one). Since area test one has just been entered, step S314 determines that the test no. has changed; therefore, step S315 establishes a new test number. The ID number processing subroutine shown in FIGS. 42a and 42b is called in step S316.

Figure 42A:
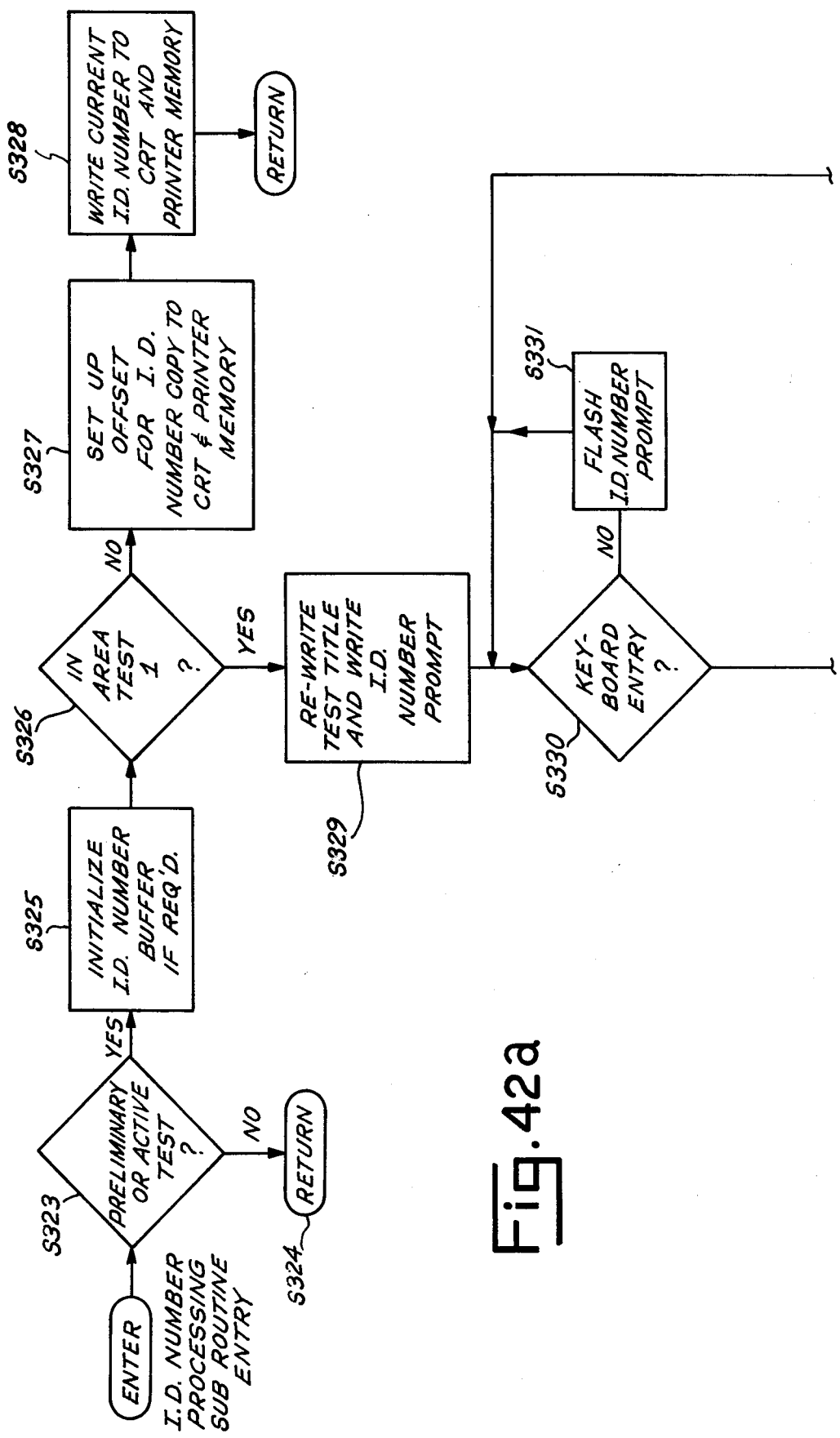
Figure 42B:
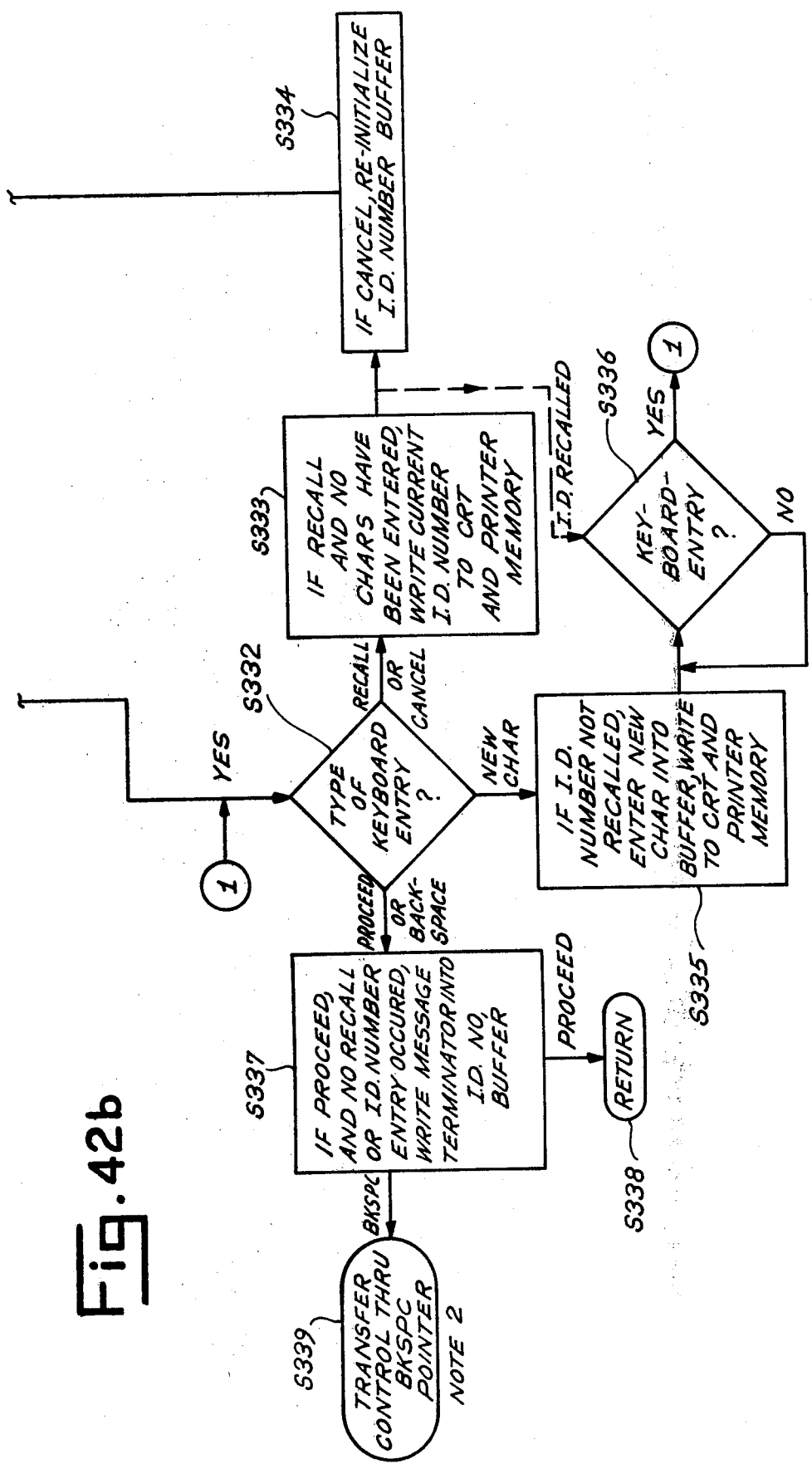

Referring to FIGS. 42a and b, an ID number buffer is initialized in step S325 after it is determined that an active test is underway in step S323. Since the operator is in area test one (step S326), the system rewrites the test title and writes the ID number prompt to CRT face 192 (step S329). At this point in time, the format shown in FIG. 37 is displayed on CRT face 192. In particular, the "ENTER ID NUMBER" prompt in row 1 is flashed to request the operator to enter an ID number on keyboard 184. According to steps S330 and S331, the ID number prompt will continue to flash until a number is entered on the keyboard. Any combination of numbers 0–9 and a "—" may be entered from keyboard 184. Up to fourteen total characters may comprise an ID number. The digits will appear on CRT face 192 in row 1 as they are entered, and once entry of a number begins, the ID prompt will stop flashing.

If an error is made in entering a number, the operator may press the cancel switch on keyboard 184 (FIG. 19b). If it is desired to maintain the same Id number as previously entered, the "TDC DEG." switch on keyboard 184 is depressed. If the previous ID number is recalled, the processor looks for additional keyboard entries through steps S336 and S330. As shown in steps S333 and S334, if the ID number is cancelled, the Id number buffer is reinitialized, and the ID number prompt again is flashed.

As each new character of the ID number is entered by the operator through keyboard 184, it is entered into the character buffer in processor 1090 and simultaneously is written into the buffer memories of the character controller and printer controller (step S335) by issuing the appropriate output commands. Assuming the operator pushes switches 1, 2 and 3 of the keyboard, the character controller causes CRT face 192 to display the format shown in FIG. 38 in which the ID number is identified on row 1. If the operator pushes the PROCEED switch on keyboard 184 without recalling or entering an ID number, a message terminator code is written into the ID number buffer to indicate that no number is present, so that no ID number is displayed. If the operator pushes the BACKSPACE switch on keyboard 184, control is transferred through the BACKSPACE pointer in order to resume the previous test in the main program. These modes of operation are achieved through steps S337 and S339. While the ID number processing subroutine is in progress, the processor prevents the system from analyzing or displaying engine test data.

Returning to FIG. 41, after the ID number has been processed, the test mode and the number subroutine sets the advance pointer to print control in step S317 and returns to the main program.

As previously explained, the main program measures and displays the parameters for Area Test 1 in the form of numbers which replace the x's shown in FIG. 37. Each character of each number is simultaneously transmitted to the buffer memories of character controller 1800 and printer controller 2630 by the previously described output command. Each character is accompanied by an address signal which identifies the row and column location of the character on the display face and the print sheet. The character of each number ae transmitted one-at-a-time to the respective buffer memories until all numbers and corresponding addresses needed for the display and printing of Area Test 1 are stored.

After area test one is completed, the format shown in FIG. 38 is displayed on CRT face 192, except that the x's in rows 5–9 and 11 are filled with appropriate numbers. The same information also is stored in the printer controller buffer memories 2660–2663. When the operator pushes the PROCEED switch on keyboard 184 or remote controller 2550, the data processor freezes the test displayed on CRT face 192 and begins the printing operation when in the automatic mode through the printer control subroutine shown in FIG. 43b. According to step S356, the processor first clears the line number table if required; however, since the operator presently is in the automatic mode, thre are no entries in the line number table. In steps S357, S358, the data processor writes the "computer diagnosis" title and blanks the RPM scale if required. However, in area test one, there is no RPM scale, and the computer diagnosis title already is written into the printer controller buffer memories and displayed on face 192 (See row 0, FIG. 38). In step S359, the processor initializes a software counter used for purposes of the printing cycle. In steps S360 and S361, the data processor resets the BUSY flag and sets the ribbon for black printing by issuing a Printer Control Output Command (TABLE 32). After an appropriate delay (step S363), the data processor detects each ROWEND signal (step S364) by issuing a Printer Status Input Command (TABLE 31). The processor keeps track of the number of rows printed through the software counter (step S359). At the end of each print row (except the last one), the processor scans the line number table to determine whether the red or black ribbon segment should be used in the next row (step S362). However, in area test onein the automatic mode, only the black segment is utilized. When the last row is printed (step S365), the data processor issues a Printer Control Output Command (TABLE 32) which resets the manual print flag, sets the black ribbon for printing, advances the paper and resets the print command (step S367). In steps S368 and S369, the manual print request from the keyboard is reset and a delay of 300 milliseconds is initiated for interface timing.

After the printing is completed, the processor returns to the main program which displays the appropriate format for area test two as shown in FIG. 44. Since the ID number was entered in the preliminary stages of area test one, it is displayed in row 2 as shown. In addition, the RPM bar graph is displayed on face 192 in rows 0 and 1. However, after area test two is completed and the operator pushes the PROCEED switch on keyboard 184, the "SUN 2001 COMPUTER DIAGNOSIS" title is written into the printer controller buffer memory only by issuing a series of Printer Data Output Commands (TABLE 30) (step S357). In step S358, the portion of the RPM bar graph shown in row 1 is blanked or eliminated by issuing another series of Printer Data Output Commands (TABLE 30) to the printer controller buffer memories alone. As a result, the format shown in FIG. 45 is printed on sheet 2602 rather than the format shown in FIG. 44 which is displayed on CRT face 192. This is an important feature which enables the data processor to rewrite and eliminate certain information displayed on the CRT face which should not be included in the printed text.

MANUAL MODE PRINTER OPERATION

It will now be issued that the operator has returned the system to area test one and has entered ID number 123 in the manner previously described, so that the format shown in FIG. 38 is displayed on CRT face 192. At this point in time, the operator may designate any line of data shown in FIG. 38 for special printing by the printer. A cursor is displayed on the CRT face in responce to a manual mode and a manual print request initiated by closing switches 2620 and 2621, respectively. In response to the operation of these switches, a cursor consisting of a hyphen (−) appears on the first valid data row in any area or pin point test. In the case of area test one, the cursor appears in column 0, row 5, as shown in FIG. 39. The cursor can be moved vertically up and down in column 0 to any row of data. In order to move the cursor down, the operator pushes switch 1 on keyboard 184. The processor determines that switch 1 has been pushed by executing a Keyboard Register Read Input Command (TABLE 23) and generates a down cursor control signal which causes the row address of the cursor to advance by 1. The new row address is sent to character controller 1800 by issuing a Character Controller Write Character Output Command (TABLE 17), and the cursor then is displayed in row 6.

In order to move the cursor up, the operator pushes switch 3 on keyboard 184. The processor determines that switch 3 has been pushed by executing the appropriate input command, and generates an up cursor control signal which causes the row address of the cursor to decrement by 1. As a result, the cursor moves back to row 5.

When the cursor has been moved to the desired row, the operator can indicate that row for special printing by pushing switch 5 on keyboard 184. As soon as switch 5 has been pushed, the cursor is replaced with a flag, such as the one shown in column 0, row 6, FIG. 39. If the cursor is located on the same line as a flag, the flat is flashed on and off by the processor.

Figure 43A:
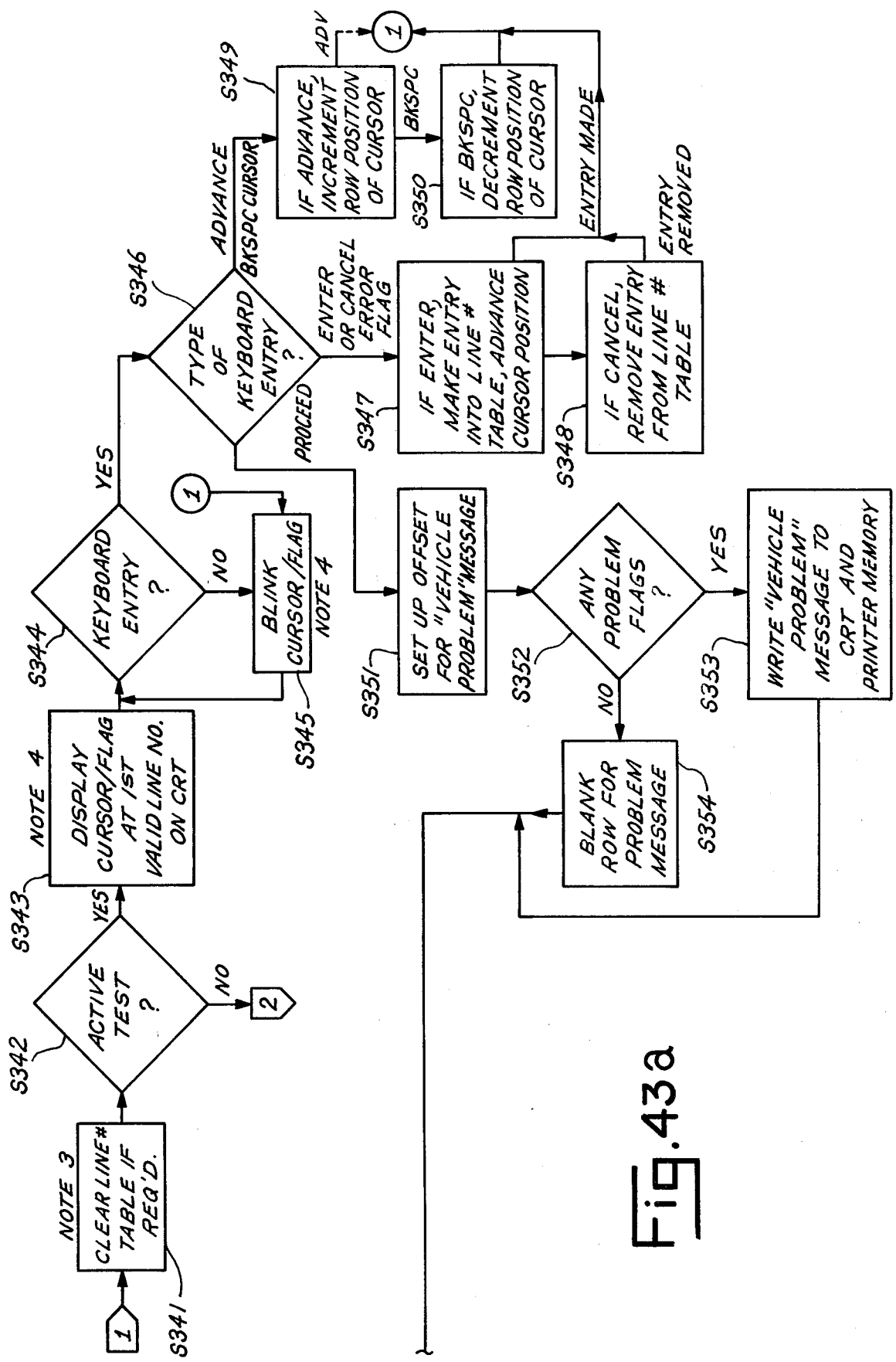

The manner in which the processor displays the cursor and flag on CRT face 192 is described in connection with the flow chart of FIG. 43a. According to step S341, the line number table is cleared. Since the system is in an active test (area test one, step S342), the cursor is displayed on the first valid line or row of data (step S343). In case of area test one, the first valid line of data is row 5. In step S345, the processor flashes or blinks the cursor until a keyboard entry is received (steps S344, S345). If a 1 or 3 is entered from the keyboard, the cursor position is advanced or decremented (steps 349, S350) in the manner previously described. If the operator closes the ENTER switch on keyboard 184 (FIG. 19b, the flag is displayed in place of the cursor, the cursor position is advanced to the next lower row of data and the row or line number in which the flag is displayed is entered into the line number table (step S347) in the form of a control signal. If the operator closes the CANCEL switch on keyboard 184, the flag is removed from the row in which the cursor is displayed, and that line number is removed from the line number table (step S348). For example, if the cursor is positioned in row 6 and the ENTER switch is closed, the flag is displayed on CRT face 192 in the manner shown in FIG. 39.

As soon as all the flags have been positioned and the operator is ready for a printout, he closes the PROCEED switch on the keyboard 184 or operates remote controller 2550 and the data processor determines the proper row for entry of a "POSSIBLE VEHICLE PROBLEM" legend. As shown in FIG. 39, the legend is displayed in row 13 in connection with area test one. If any flags have been entered, the "POSSIBLE VEHICLE PROBLEM" message simultaneously is written into the character controller and printer controller buffer memories by the data processor. If no flags have been entered, the row set up for the "POSSIBLE VEHICLE PROBLEM" legend is canceled by filling the buffer memories for line 13 with blank character codes.

Figure 43B:
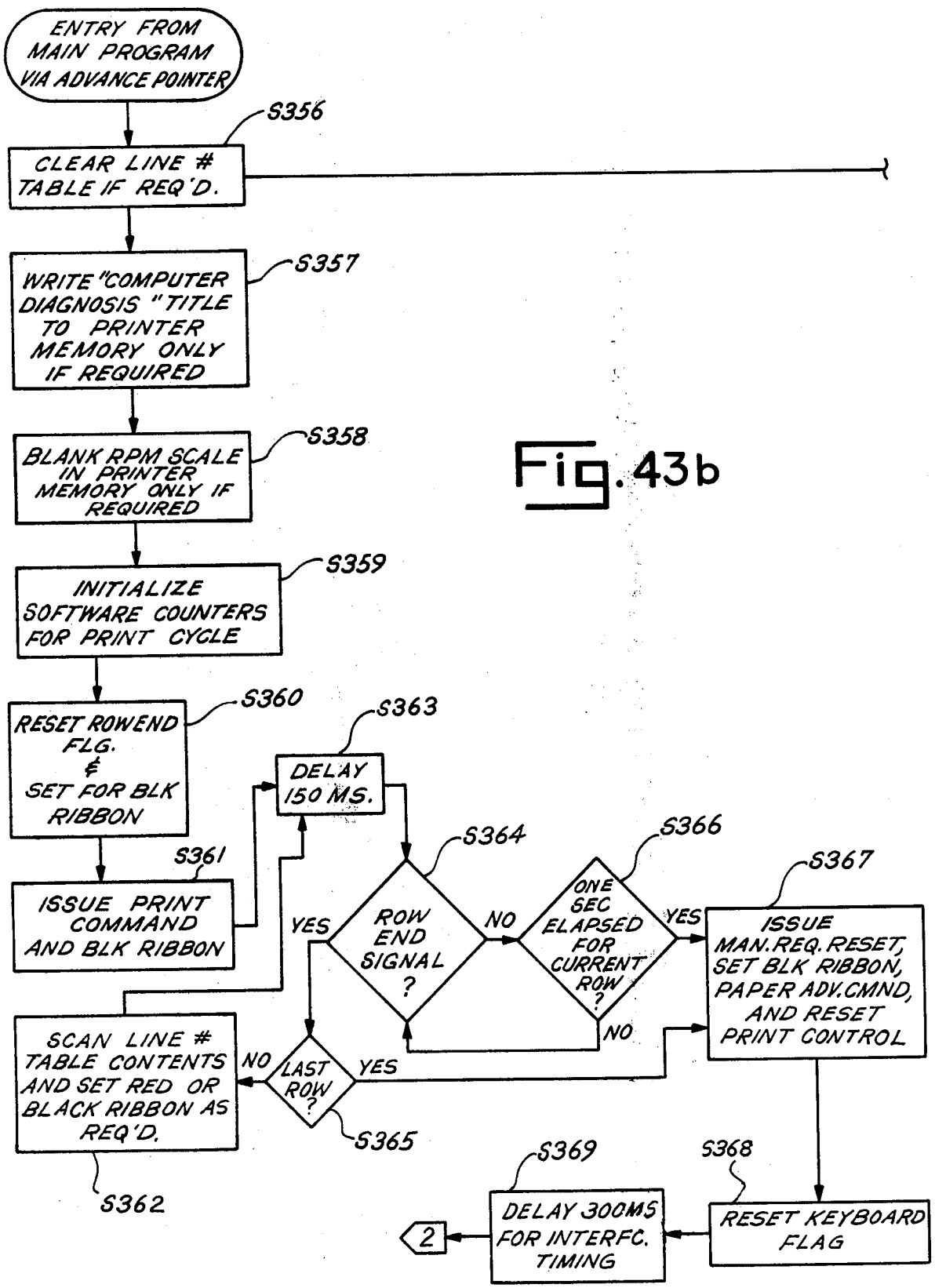

At this point in time, the printing process enters step S356 (FIG. 43b) and proceeds in the manner previously described. In step S360, the first row of printing row 0 is set for the black ribbon segment since no flags could be set in connection with the first row. However, in connection with subsequent rows, step S362 scans the line number table to determine if any flag was entered in the row. If a flag was entered, the processor executes a Printer Control Output Command in which conductor BD4 is set to its logical 0 state, thereby causing the row to print in red ink. The remaining steps of the routine described in FIG. 43b are completed in the manner previously described.

In summary, each of the lines for which a flag was entered are printed in red ink and the legend "POSSIBLE VEHICLE PROBLEM" is printed in the manner shown in FIG. 39. The flag is printed on sheet 2602, but the cursor is not. This is an important feature which enables the operator to visually determine which lines represent possible vehicle problems and to designate these lines for special printing. In this way, a permanent record of data representing possible vehicle problems is maintained and easily recognized by the operator.

The program described in connection with FIGS. 40–43b can be implemented on an IMP-16C processor by means of the following program listing which is encoded in hexadecimal form. The following program listing is used in connection with the program listed in the above-identified application Ser. No. 641,362. The left-hand column of the following listing represents line numbers; the middle column is the address in memory; and the right-hand column is the contents in memory.

Those skilled in the art will recognize that the preferred embodiment described may be altered and modified without departing from the true spirit and scope of the invention as defined in the appended claims.

```
159     E000
160
161
162
163
164
165
166
167
168
169     E000    A497    B
170     E001    A898    B
171     E002    4C00    A
172     E003    A0AD    B
173     E004    2D52    A@
174     E005    4FB0    A
175     E006    0400    A
176     E007    A09B    B
177     E008    131A    A
178
179     E009    8011    B
180     E00A    F15E    A
181     E00B    2101    A
182     E00C    2102    A
183     E00D    8096    B
184     E00E    A011    B
185
186     E00F    809B    B
187     E010    5CFC    A
188     E011    1301    A
189     E012    2102    A
190     E013    290E    A
191     E014    2543    A@
192     E015    8011    B
193     E016    F0C1    B
194     E017    2106    A
195     E018    A0C1    B
196     E019    2908    A
197     E01A    2103    A
198     E01B    80AD    B
199     E01C    1101    A
200     E01D    2103    A
201     E01E    2D3A    A@
202     E01F    8497    B
203     E020    8898    B
204     E021    0200    A
205
206
207
208
209     E022    A0AD    B
210     E023    8011    B
211     E024    F144    A
212     E025    21F5    A
213
214     E026    894E    A
215     E027    4F01    A
216     E028    4D07    A
217     E029    F200    A
218     E02A    2115    A
219     E02B    4B01    A
220     E02C    4A01    A
221     E02D    49FF    A
222     E02E    21FA    A
223
224     E02F    F144    A
225     E030    2945    A
226
227
228
229     E031    FD28    A
230     E032    2101    A
231     E033    210C    A
232     E034    8017    B
233     E035    F13C    A
234     E036    2102    A
235     E037    291A    A
236     E038    21E2    A
237
238     E039    80B0    B
239     E03A    E120    A
240     E03B    21FB    A
241
242     E03C    8073    B
243     E03D    611E    A
244     E03E    D11E    A
245     E03F    3300    A
246     E040    8041    B
247     E041    1101    A
248     E042    4F00    A
249     E043    FCA9    B
250     E044    2102    A
251     E045    ACA9    B
252     E046    2934    A
253
```

| | | | | |
|---|---|---|---|---|
| 254 | E047 | 80AD | B | |
| 255 | E048 | 15D2 | A | |
| 256 | | | | |
| 257 | E049 | 8011 | B | |
| 258 | E04A | A096 | B | |
| 259 | E04B | 811D | A | |
| 260 | E04C | A011 | B | |
| 261 | E04D | 21CD | A | |
| 262 | | | | |
| 263 | | | | |
| 264 | | | | |
| 265 | | | | |
| 266 | E04E | 2903 | A | |
| 267 | E04F | 250E | A@ | |
| 268 | | | | |
| 269 | | | | |
| 270 | E050 | 2901 | A | |
| 271 | E051 | 250D | A@ | |
| 272 | | | | |
| 273 | E052 | 4C00 | A | |
| 274 | E053 | A0A9 | B | |
| 275 | E054 | A0C1 | B | |
| 276 | E055 | A0C2 | B | |
| 277 | E056 | 0200 | A | |
| 278 | E057 | E329 | A | |
| | E058 | E14D | A | |
| | E059 | E332 | A | |
| | E05A | 0008 | A | |
| | E05B | F5B8 | A | |
| | E05C | 0003 | A | |
| | E05D | 0001 | A | |
| | E05E | F159 | A | |
| | E05F | F505 | A | |
| | E060 | 0000 | A | |
| | E061 | 0000 | A | |
| | E062 | 0000 | A | |
| | E063 | 0000 | A | |
| | E064 | 0000 | A | |
| | E065 | 0000 | A | |
| | E066 | 0000 | A | |
| | E067 | 0000 | A | |
| | E068 | 0000 | A | |
| 279 | | | | |
| 280 | | | | |
| 281 | | | | |
| 282 | E069 | E218 | A | |
| 283 | E06A | F190 | A | |
| 284 | E06B | F23C | A | |
| 285 | E06C | F2A3 | A | |
| 286 | E06D | F2F2 | A | |
| 287 | E06E | F379 | A | |
| 288 | E06F | F421 | A | |
| 289 | E070 | F485 | A | |
| 290 | E071 | F00B | A | |
| 291 | E072 | F4DF | A | |
| 292 | E073 | F505 | A | |
| 293 | E074 | F3AB | A | |
| 294 | E075 | E06B | A | |
| 295 | | | | |
| 296 | | | | |
| 297 | | | | |
| 298 | | | | |
| 299 | E076 | 4400 | A | |
| 300 | E077 | 81E8 | A | |
| 301 | E078 | 4000 | A | |
| 302 | E079 | 4F05 | A | |
| 303 | E07A | A4A9 | B | |
| 304 | | | | |
| 305 | | | | |
| 306 | E07B | FDE5 | A | |
| 307 | E07C | 0200 | A | |
| 308 | | | | |
| 309 | | | | |
| 310 | E07D | 85E4 | A | |
| 311 | E07E | 80B7 | B | |
| 312 | E07F | 5CF8 | A | |
| 313 | E080 | E1E2 | A | |
| 314 | E081 | 2101 | A | |
| 315 | E082 | A4B7 | B | |
| 316 | E083 | FDD9 | A | |
| 317 | E084 | 2113 | A | |
| 318 | | | | |
| 319 | E085 | EDDE | A | |
| 320 | E086 | 2102 | A | |
| 321 | E087 | 810D | A | |
| 322 | E088 | A011 | B | |
| 323 | E089 | 810D | A | |
| 324 | E08A | FDDA | A | |
| 325 | E08B | 810A | A | |
| 326 | E08C | A0AA | B | |
| 327 | E08D | 4F9C | A | |
| 328 | E08E | 2DD7 | A@ | |
| 329 | E08F | 0267 | A | |
| 330 | E090 | 7067 | A | |
| 331 | E091 | 00B7 | B | |
| 332 | E092 | 6060 | A | |
| 333 | E093 | 0200 | A | |
| 334 | E094 | E04E | A | |
| 335 | E095 | E050 | A | |
| 336 | E096 | 0060 | A | |
| 337 | E097 | 0040 | A | |
| 338 | | | | |
| 339 | | | | |
| 340 | E098 | 81FB | A | |
| 341 | E099 | A017 | B | |
| 342 | | | | |
| 343 | E09A | 4F9C | A | |
| 344 | E09B | 2DCB | A@ | |
| 345 | E09C | 00A0 | A | |
| 346 | E09D | 00A0 | A | |
| 347 | E09E | 00A0 | A | |
| 348 | E09F | 0060 | A | |
| 349 | E0A0 | 2DC7 | A@ | |
| 350 | E0A1 | 8353 | A | |
| 351 | E0A2 | 554E | A | |
| | E0A3 | 2032 | A | |
| | E0A4 | 3030 | A | |
| | E0A5 | 3120 | A | |
| | E0A6 | 434F | A | |
| | E0A7 | 4D50 | A | |
| 352 | E0A8 | 6060 | A | |
| 353 | E0A9 | 2102 | A | |
| 354 | | | | |
| 355 | | | | |
| 356 | | | | |
| 357 | | | | |
| 358 | E0AA | 2500 | A | |
| 359 | E0AB | E3FC | A | |
| 360 | | | | |
| 361 | E0AC | 2DBB | A@ | |
| 362 | E0AD | 9067 | A | |
| 363 | E0AE | 5554 | A | |
| | E0AF | 4552 | A | |
| | E0B0 | 2044 | A | |
| | E0B1 | 4941 | A | |
| | E0B2 | 474E | A | |
| | E0B3 | 4F53 | A | |
| | E0B4 | 4953 | A | |
| 364 | E0B5 | C704 | A | |
| 365 | E0B6 | 2031 | A | |
| 366 | E0B7 | 2D1A | A | |
| 367 | E0B8 | 494E | A | |
| | E0B9 | 4720 | A | |
| 368 | E0BA | A044 | A | |
| 369 | E0BB | 4953 | A | |
| 370 | E0BC | 01A0 | A | |
| 371 | E0BD | 1A20 | A | |
| 372 | E0BE | 0260 | A | |
| 373 | | | | |
| 374 | | | | |
| 375 | E0BF | 8141 | A | |
| 376 | E0C0 | A0B6 | B | |

```
377 E0C1 4C01 A
378 E0C2 A0BF B
379 E0C3 4C00 A
380 E0C4 A0C0 B
381 E0C5 A0C4 B
382
383
384
385 E0C6 2911 A
386
387 E0C7 813A A
388 E0C8 853A A
389 E0C9 4E01 A
390 E0CA 4F88 A
391 E0CB 2D38 A@
392 E0CC 211B A
393
394 E0CD 4F9C A
395 E0CE 2D98 A@
396 E0CF A000 A
397 E0D0 6060 A
398 E0D1 8130 A
399 E0D2 8530 A
400 E0D3 4E01 A
401 E0D4 4F88 A
402 E0D5 2D2E A@
403 E0D6 2111 A
404 E0D7 21EE A
405
406 E0D8 2D8F A@
407 E0D9 A067 A
408 E0DA 454E A
    E0DB 5445 A
    E0DC 5220 A
    E0DD 492E A
    E0DE 442E A
    E0DF 204E A
    E0E0 554D A
    E0E1 4245 A
    E0E2 5220 A
409 E0E3 6060 A
410 E0E4 0200 A
411 E0E5 2D1F A@
412 E0E6 21FE A
413 E0E7 2103 A
414
415
416
417
418
419 E0E8 29EF A
420 E0E9 2D1B A@
421 E0EA 21DB A
422 E0EB F11A A
423 E0EC 2101 A
424 E0ED 2102 A
425 E0EE 4CFD A
426 E0EF 2128 A
427 E0F0 1101 A
428 E0F1 2102 A
429 E0F2 4C1F A
430 E0F3 2124 A
431 E0F4 E112 A
432 E0F5 2122 A
433 E0F6 F111 A
434 E0F7 2115 A
435 E0F8 F110 A
436 E0F9 2143 A
437 E0FA F10F A
438 E0FB 250F A@
439 E0FC F10F A
440 E0FD 2136 A
441 E0FE F144 A
442 E0FF 2136 A
443 E100 21E4 A
444 E101 00B7 B
    E102 01F0 A
    E103 4000 A
    E104 E27E A
    E105 FD29 A
    E106 000F A
    E107 0009 A
    E108 000C A
    E109 000E A
    E10A 000D A
    E10B FD05 A
    E10C 0010 A
445
446
447
448
449 E10D 80C4 B
450 E10E 15D6 A
451 E10F 4D7F A
452 E110 A4C0 B
453
454 E111 4F9C A
455 E112 2D31 A@
456 E113 B267 A
457 E114 7067 A
458 E115 00B7 B
459 E116 6060 A
460 E117 21CD A
461
462
463
464
465 E118 88C0 B
466 E119 F92B A
467 E11A 2101 A
468 E11B 21C9 A
469
470 E11C 4E7F A
471 E11D A8C4 B
472 E11E C127 A
473 E11F 3281 A
474 E120 8C79 B
475
476
477 E121 FD25 A
477 E122 21C2 A
478 E123 2D24 A@
479
480 E124 7CBF B
481 E125 2106 A
482 E126 78BF B
483 E127 78BF B
484 E128 5E08 A
485
486 E129 C91F A
487 E12A B8B6 B
488 E12B 21B9 A
489
490 E12C 94B6 B
491 E12D 651C A
492 E12E 3600 A
493 E12F B8B6 B
494 E130 78B6 B
495
496 E131 8919 A
497 E132 B8B6 B
498 E133 21B1 A
499
500 E134 2D17 A@
501 E135 2554 A@
502
503 E136 4F9C A
504 E137 2D0C A@
505 E138 A000 A
506 E139 6060 A
507 E13A 8110 A
508 E13B A0B7 B
509 E13C 2182 A
```

```
510
511
512 E13D 850D A
513 E13E 80C4 B
514 E13F C0C0 B
515 E140 1501 A
516 E141 B4B6 B
517 E142 0200 A
518 E143 000A A
    E144 E2BD A
    E145 0000 A
    E146 0030 A
    E147 2000 A
    E148 F0E8 A
    E149 0066 A
    E14A FF00 A
    E14B 6666 A
    E14C E052 A
519
520
521
522
523
524
525
526
527
528
529
530
531 E14D 84A9 B
532 E14E F4C2 B
533 E14F 2102 A
534 E150 A4C2 B
535 E151 2952 A
536
537 E152 80A9 B
538 E153 1503 A
539 E154 2536 A@
540
541
542
543
544 E155 2500 A
545 E156 E3FE A
546
547
548 E157 8941 A
549 E158 C8A9 B
550 E159 8200 A
551 E15A 5CF8 A
552 E15B A059 B
553 E15D 8000 B
555 E15E 612D A
556 E15F A055 B
557 E160 80AA B
558 E161 5C0C A
559 E162 84A9 B
560 E163 E529 A
561 E164 2101 A
562 E165 C128 A
563 E166 A0AC B
564
565
566
567
568 E167 2D27 A@
569 E168 4C00 A
570 E169 2D26 A@
571 E16A 2101 A
572 E16B 2901 A
573 E16C 210B A
574
575
576
577
578 E16D 4C00 A
579 E16E 2D21 A@
580 E16F 2103 A
581 E170 80AC B
582 E171 C11F A
583 E172 2102 A
584 E173 80AC B
585 E174 C11D A
586 E175 2D1D A@
587 E176 0600 A
588 E177 0200 A
589
590
591
592 E178 8189 A
593 E179 8589 A
594 E17A 4E01 A
595 E17B 4F88 A
596 E17C 2D87 A@
597 E17D 2130 A
598
599 E17E 29EE A
600 E17F 4C00 A
601 E180 2D0F A@
602 E181 2101 A
603 E182 2D0C A@
604 E183 8110 A
605 E184 8510 A
606 E185 4E01 A
607 E186 4F88 A
608 E187 2D0E A@
609 E188 2125 A
610 E189 21DD A
611 E18A FD09 A
    E18B E266 A
    E18C 00FF A
    E18D 0007 A
    E18E 0100 A
    E18F E2B5 A
    E190 E296 A
    E191 005A A
    E192 007C A
    E193 FC86 A
    E194 01F0 A
    E195 4000 A
    E196 E27E A
    E197 0000 A
    E198 0000 A
612
613
614
615 E199 E199 A
616 E19A 050B A
617 E19B 0A0B A
618 E19C 0509 A
619 E19D 0509 A
620 E19E 060F A
621 E19F 040F A
622 E1A0 050C A
623 E1A1 0505 A
624 E1A2 050F A
625 E1A3 050F A
626
627
628 E1A4 4D0C A
629 E1A5 4C00 A
630 E1A6 A0C3 B
631 E1A7 89EF A
632 E1A8 A89C B
633 E1A9 A200 A
634 E1AA 4A01 A
635 E1AB 49FF A
636 E1AC 21FC A
637 E1AD 0200 A
638
639
```

```
640
641 E1AE 2DE9 A@
642 E1AF 21B7 A
643 E1B0 F136 A
644 E1B1 210F A
645 E1B2 F135 A
646 E1B3 2113 A
647 E1B4 F134 A
648 E1B5 2117 A
649 E1B6 F18C A
650 E1B7 211E A
651 E1B8 F131 A
652 E1B9 2134 A
653 E1BA 21AC A
654
655
656 E1BB 29B1 A
657 E1BC 4C00 A
658 E1BD 2DD2 A@
659 E1BE 2101 A
660 E1BF 25CF A@
661 E1C0 0200 A
662
663
664 E1C1 29F9 A
665 E1C2 80AA B
666 E1C3 F055 B
667 E1C4 2101 A
668 E1C5 78AA B
669 E1C6 2199 A
670
671
672 E1C7 29F3 A
673 E1C8 80AA B
674 E1C9 F059 B
675 E1CA 2101 A
676 E1CB 7CAA B
677 E1CC 2193 A
678
679
680
681 E1CD 4C01 A
682 E1CE 2DC1 A@
683 E1CF 2101 A
684 E1D0 2196 A
685 E1D1 80AC B
686 E1D2 C1BF A
687 E1D3 2DBF A@
688 E1D4 0600 A
689 E1D5 21EC A
690
691
692
693 E1D6 4C02 A
694 E1D7 2DB8 A@
695 E1D8 2101 A
696 E1D9 218D A
697
698 E1DA 2DB4 A@
699 E1DB 218B A
700
701
702
703 E1DC E1DC A
704 E1DD D000 A
705 E1DE D000 A
706 E1DF F000 A
707 E1E0 F000 A
708 E1E1 5000 A
709 E1E2 6000 A
710 E1E3 D000 A
711 E1E4 E000 A
712 E1E5 6000 A
713 E1E6 F000 A
714 E1E7 0001 A
    E1E8 0003 A
    E1E9 0005 A
    E1EA 000E A
    E1EB 0000 A
    E1EC 0000 A
    E1ED 0000 A
715
716
717
718
719
720 E1EE 29CC A
721 E1EF 80A9 B
722 E1F0 1175 A
723
724 E1F1 8071 B
725 E1F2 A0AB B
726 E1F3 89E8 A
727 E1F4 C8A9 B
728 E1F5 8200 A
729 E1F6 5CF9 A
730 E1F7 A071 B
731 E1F8 3181 A
732
733
734 E1F9 80C3 B
735 E1FA 1115 A
736 E1FB 5DFB A
737 E1FC A49C B
738
739 E1FD 2DED A@
740 E1FE 3E3E A
    E1FF 3E3E A
    E200 504F A
    E201 5353 A
    E202 4942 A
    E203 4C45 A
    E204 2056 A
    E205 4548 A
    E206 4943 A
    E207 4C45 A
741 E208 2050 A
    E209 524F A
    E20A 424C A
    E20B 454D A
    E20C 3E3E A
    E20D 3E3E A
742 E20E 6060 A
743 E20F 2105 A
744
745 E210 4F9C A
746 E211 A4AA B
747 E212 2DD9 A@
748 E213 0067 A
749 E214 6060 A
750
751 E215 80AB B
752 E216 A071 B
753 E217 2104 A
754
755
756
757
758
759
760
761
762 E218 80C2 B
763 E219 F0A9 B
764 E21A 2101 A
765 E21B 2988 A
766
767 E21C 4FAC A
768 E21D 2DCF A@
769 E21E 0083 A
770 E21F 5355 A
    E220 4E20 A
```

|     |      |      |    |     |      |      |    |
|-----|------|------|----|-----|------|------|----|
|     | E221 | 3230 | A  |     | 835  |      |    |
|     | E222 | 3031 | A  |     | 836  | E25F | 8115 A |
|     | E223 | 2043 | A  |     | 837  | E260 | 0600 A |
|     | E224 | 4F4D | A  |     | 838  |      |    |
|     | E225 | 5055 | A  |     | 839  |      |    |
|     | E226 | 5445 | A  |     | 840  | E261 | 4F88 A |
|     | E227 | 5220 | A  |     | 841  | E262 | 8113 A |
|     | E228 | 4449 | A  |     | 842  | E263 | 0600 A |
|     | E229 | 4147 | A  |     | 843  |      |    |
|     | E22A | 4E4F | A  |     | 844  | E264 | 8112 A |
|     | E22B | 5349 | A  |     | 845  | E265 | 2D0B A@ |
|     | E22C | 5320 | A  |     | 846  | E266 | 2D11 A@ |
| 771 | E22D | 6060 | A  |     | 847  | E267 | 8497 B |
| 772 | E22E | 80A9 | B  |     | 848  | E268 | 8898 B |
| 773 |      |      |    |     | 849  | E269 | 809B B |
| 774 | E22F | F1B7 | A  |     | 850  | E26A | 1301 A |
| 775 | E230 | 2104 | A  |     | 851  | E26B | 0200 A |
| 776 | E231 | 2DBB | A@ |     | 852  | E26C | 8096 B |
| 777 | E232 | A000 | A  |     | 853  | E26D | A011 B |
| 778 | E233 | 6060 | A  |     | 854  | E26E | 2411 B |
| 779 | E234 | 2106 | A  |     | 855  | E26F | 0110 A |
| 780 | E235 | 2DB7 | A@ |     |      | E270 | 0095 A |
| 781 | E236 | A000 | A  |     |      | E271 | FDF9 A |
| 782 | E237 | 8002 | A  |     |      | E272 | 03E0 A |
| 783 | E238 | 7067 | A  |     |      | E273 | 0080 A |
| 784 | E239 | 00B7 | B  |     |      | E274 | 009C B |
| 785 | E23A | 6060 | A  |     |      | E275 | 8811 A |
| 786 |      |      |    |     |      | E276 | 4000 A |
| 787 |      |      |    |     |      | E277 | 012C A |
| 788 |      |      |    |     |      | E278 | E332 A |
| 789 |      |      |    |     |      | E279 | 0000 A |
| 790 |      |      |    |     |      | E27A | 0000 A |
| 791 |      |      |    |     |      | E27B | 0000 A |
| 792 | E23B | 4C10 | A  |     |      | E27C | 0000 A |
| 793 | E23C | A0AA | B  |     |      | E27D | 0000 A |
| 794 | E23D | 4C00 | A  |     | 856  |      |    |
| 795 | E23E | A0AC | B  |     | 857  |      |    |
| 796 | E23F | 4FB0 | A  |     | 858  |      |    |
| 797 | E240 | 4C11 | A  |     | 859  |      |    |
| 798 | E241 | 0600 | A  |     | 860  |      |    |
| 799 | E242 | 812C | A  |     | 861  |      |    |
| 800 | E243 | 0600 | A  |     | 862  |      |    |
| 801 | E244 | 812B | A  |     | 863  |      |    |
| 802 | E245 | 2D2B | A@ |     | 864  |      |    |
| 803 | E246 | 812B | A  |     | 865  |      |    |
| 804 | E247 | 852B | A  |     | 866  |      |    |
| 805 | E248 | 4E01 | A  |     | 867  |      |    |
| 806 |      |      |    |     | 868  |      |    |
| 807 | E249 | 2934 | A  |     | 869  |      |    |
| 808 | E24A | 2101 | A  |     | 870  | E27E | A099 B |
| 809 | E24B | 2113 | A  |     | 871  | E27F | AC9A B |
| 810 | E24C | 7CAA | B  |     | 872  | E280 | 4FB8 A |
| 811 | E24D | 2101 | A  |     | 873  | E281 | 0400 A |
| 812 | E24E | 2110 | A  |     | 874  | E282 | 8C9A B |
| 813 |      |      |    |     | 875  | E283 | 0400 A |
| 814 | E24F | 78AC | B  |     | 876  | E284 | 3483 A |
| 815 | E250 | 80AC | B  |     | 877  | E285 | 1503 A |
| 816 | E251 | 8922 | A  |     | 878  | E286 | 3881 A |
| 817 | E252 | 4D0D | A  |     | 879  | E287 | 110B A |
| 818 | E253 | F200 | A  |     | 880  | E288 | 2102 A |
| 819 | E254 | 2101 | A  |     | 881  | E289 | 3881 A |
| 820 | E255 | 2103 | A  |     | 882  | E28A | 1508 A |
| 821 | E256 | 4C20 | A  |     | 883  | E28B | 4FB8 A |
| 822 | E257 | 0600 | A  |     | 884  | E28C | 0400 A |
| 823 | E258 | 21EB | A  |     | 885  | E28D | 6107 A |
| 824 | E259 | 4A01 | A  |     | 886  | E28E | 5001 A |
| 825 | E25A | 49FF | A  |     | 887  | E28F | C099 B |
| 826 | E25B | 21F7 | A  |     | 888  | E290 | A099 B |
| 827 |      |      |    |     | 889  | E291 | 1B02 A |
| 828 | E25C | 4C10 | A  |     | 890  | E292 | 21EF A |
| 829 | E25D | 0600 | A  |     | 891  | E293 | 0200 A |
| 830 | E25E | 21E5 | A  |     | 892  | E294 | 0201 A |
| 831 |      |      |    |     | 893  | E295 | 00FF A |
| 832 |      |      |    |     | 894  |      |    |
| 833 |      |      |    |     | 895  |      |    |
| 834 |      |      |    |     | 896  |      |    |

| | | | |
|---|---|---|---|
|897| | | |
|898| | | |
|899| | | |
|900| | | |
|901| | | |
|902| | | |
|903| | | |
|904| | | |
|905| | | |
|906| | | |
|907| | | |
|908| | | |
|909| | | |
|910| | | |
|911| | | |
|912| | | |
|913| | | |
|914|E296|A0C4|B|
|915|E297|4F00|A|
|916|E298|4D0C|A|
|917|E299|89DF|A|
|918|E29A|80AA|B|
|919|E29B|F200|A|
|920|E29C|2106|A|
|921|E29D|FE00|A|
|922|E29E|210D|A|
|923|E29F|4A01|A|
|924|E2A0|49FF|A|
|925|E2A1|21F9|A|
|926|E2A2|0201|A|
|927| | | |
|928|E2A3|80C4|B|
|929|E2A4|13FD|A|
|930|E2A5|5CFF|A|
|931|E2A6|1301|A|
|932|E2A7|0200|A|
|933| | | |
|934|E2A8|AE00|A|
|935|E2A9|7CC3|B|
|936|E2AA|3081|A|
|937|E2AB|0200|A|
|938|E2AC|A0AB|B|
|939|E2AD|80C4|B|
|940|E2AE|1302|A|
|941|E2AF|80AB|B|
|942|E2B0|21EE|A|
|943|E2B1|80AB|B|
|944|E2B2|A200|A|
|945|E2B3|78C3|B|
|946|E2B4|0200|A|
|947| | | |
|948| | | |
|949| | | |
|950| | | |
|951| | | |
|952|E2B5|80AC|B|
|953|E2B6|C1C3|A|
|954|E2B7|2DC3|A@|
|955|E2B8|0600|A|
|956|E2B9|0200|A|
|957| | | |
|958| | | |
|959| | | |
|960| | | |
|961| | | |
|962| | | |
|963| | | |
|964| | | |
|965| | | |
|966| | | |
|967| | | |
|968| | | |
|969| | | |
|970| | | |
|971| | | |
|972| | | |
|973| | | |
|974| | | |
|975| | | |
|976| | | |
|977| | | |
|978| | | |
|979| | | |
|980| | | |
|981| | | |
|982| | | |
|983| | | |
|984| | | |
|985| | | |
|986| | | |
|987|E2BA|2963|A|
|988|E2BB|4C01|A|
|989|E2BC|0600|A|
|990| | | |
|991| | | |
|992|E2BD|4C00|A|
|993|E2BE|A0AA|B|
|994|E2BF|4600|A|
|995|E2C0|80AA|B|
|996|E2C1|5C07|A|
|997|E2C2|A0AC|B|
|998| | | |
|999|E2C3|8200|A|
|1000|E2C4|5CF8|A|
|1001|E2C5|2904|A|
|1002|E2C6|8200|A|
|1003|E2C7|2902|A|
|1004|E2C8|4A01|A|
|1005|E2C9|21F9|A|
|1006| | | |
|1007| | | |
|1008|E2CA|6133|A|
|1009|E2CB|E133|A|
|1010|E2CC|2126|A|
|1011|E2CD|F132|A|
|1012|E2CE|4C4F|A|
|1013|E2CF|E139|A|
|1014|E2D0|2114|A|
|1015|E2D1|F130|A|
|1016|E2D2|2128|A|
|1017|E2D3|F133|A|
|1018|E2D4|2123|A|
|1019|E2D5|F12D|A|
|1020|E2D6|0200|A|
|1021|E2D7|F12C|A|
|1022|E2D8|2116|A|
|1023|E2D9|E12B|A|
|1024| | | |
|1025| | | |
|1026| | | |
|1027| | | |
|1028|E2DA|25A1|A@|
|1029| | | |
|1030| | | |
|1031|E2DB|84AC|B|
|1032|E2DC|6524|A|
|1033|E2DD|5C09|A|
|1034|E2DE|5CFE|A|
|1035|E2DF|3400|A|
|1036|E2E0|84AA|B|
|1037|E2E1|5D07|A|
|1038|E2E2|3400|A|
|1039|E2E3|A0AC|B|
|1040|E2E4|0200|A|
|1041| | | |
|1042|E2E5|6120|A|
|1043|E2E6|5C01|A|
|1044|E2E7|C0AC|B|
|1045|E2E8|2935|A|
|1046|E2E9|0600|A|
|1047|E2EA|80AC|B|
|1048|E2EB|C11E|A|

```
F2F2   A
E06D   A*
F379   A
F3AB   A
E074   A
E06E   A*
F421   A
E06F   A*
F485   A
E070   A*
00AD   B
009B   B
E023   A
```

What is claimed is:

1. Apparatus for analyzing an internal combustion engine and for recording the results of the analysis comprising:

means connectable to the engine for generating when properly enabled first and second digital measurement signals corresponding to first and second engine conditions;

display means having a face for displaying at a first display location on the face a first number indicative of the first engine condition and for displaying at a second display location on the face a second number indicative of the second engine condition;

printer means for printing on a sheet at a first print location said first number and for printing on said sheet at a second print location said second number;

main memory means for storing a first display address signal corresponding to the first display location and first print location and for storing a second address signal corresponding to the second display location and second print location;

display controller means for enabling the display means to display the first number at the first display location in response to the first display address signal and a first digital display signal corresponding to the value of said first engine condition, and for enabling the display means to display the second number at the second display location in response to the second display address signal and a second digital display signal corresponding to the value of said second engine condition; printer controller means for enabling the printer means to print the first number at the first print location in response to the first display address signal and said first display address signal and said first digital display signal, and for enabling the printer means to print the second number at the second print location in response to the second display addresss signal and the second digital display signal; and processor means for enabling the means connectable to the engine to generate the first and second digital measurement signals for altering the value of the first and second digitial measurement signals to produce the first and second digital display signals, for transmitting the first digital display signal and first display address signal to the display controller means and printer controller means during a first time period, and for transmitting the second digital display signal and the second display address signal to the display controller means and printer controller means during a second time period, whereby the values of the first and second engine conditions are displayed in numerical form on the face of the display means and are printed on the sheet in order to create a permanent record.

2. Apparatus, as claimed in claim 1, wherein the means coupled to the engine for generating comprises:

analog measuring means for generating analog measuring signals corresponding to the first and second engine conditions being measured; and converter means for converting the analog measuring signals to the first and second digital measurement signals in response to the processor means.

3. Apparatus, as claimed in claim 1, wherein the main memory means comprises a digital, read-only memory.

4. Apparatus, as claimed in claim 1, wherein the processor means comprises:

a random access memory;
an arithmetic unit;
a control unit; means for transmitting data from the main memory means to the display controller means and printer controller means; and
means for enabling the storage of the first and second digital display signals in the random access memory before transmitting the first and second digital display signals to the display controller means and printer controller means.

5. Apparatus, as claimed in claim 1, wherein the display controller means comprises a first buffer memory for simultaneously storing the first and second display address signals and the first and second digital display signals, and wherein the printer controller means comprises a second buffer memory for simultaneously storing the first and second display address signals and the first and second digital display signals while the first and second numbers are displayed on the face of the display means.

6. Apparatus, as claimed in claim 5, wherein the processor means comprises means for simultaneously transmitting signals to the display controller means and the printer controller means whereby the printer means is enabled to print at least some of the same information displayed on the display means.

7. Apparatus, as claimed in claim 6, wherein the second buffer memory receives all data transmitted to the first buffer memory and wherein the processor means includes means for blanking some of the data from the second buffer memory.

8. Apparatus, as claimed in claim 1, wherein:

the apparatus further comprises manually operable switch means for generating control signals designating the first number or second number for special printing;

the processor means, main memory means, display controller means and display means comprise means for displaying on the display means a flag adjacent whichever of the first or second numbers is designated for special printing by the control signals; and the printer controller means comprises means for enabling the printer means to distinctively identify on the sheet the first or second number designated by the control signals for special printing.

9. Apparatus, as claimed in claim 8, wherein:

the switch means comprises an operator controllable first switch means for generating a cursor control signal and an operator controllable second switch means for generating a flag control signal;

the processor means, main memory means, display controller means and display means comprise means for displaying a cursor adjacent one of the

```
1049 E2EC 7110 A
1050 E2ED A0AC B
1051 E2EE 0200 A
1052
1053
1054 E2EF 4A02 A
1055 E2F0 4200 A
1056 E2F1 4AFF A
1057 E2F2 2103 A
1058
1059
1060 E2F3 4200 A
1061 E2F4 8916 A
1062 E2F5 3200 A
1063 E2F6 8A00 A
1064 E2F7 21CB A
1065
1066
1067 E2F8 4600 A
1068 E2F9 4600 A
1069 E2FA 0200 A
1070
1071
1072 E2FB 4400 A
1073 E2FC 2201 A
1074
1075
1076 E2FD 0F80 A
1077 E2FE 00FF A
1078 E2FF 001F A
1079 E300 0030 A
1080 E301 F07F A
1081 E302 0060 A
1082 E303 0067 A
1083 E304 0070 A
1084 E305 007F A
1085 E306 003F A
1086 E307 0066 A
1087 E308 0020 A
1088 E309 005F A
1089 E30A 0080 A
1090
1091
1092
1093 E30B E30C A
     E30C E30F A
     E30D E314 A
     E30E E317 A
1094
1095
1096
1097 E30F 0101 A
1098 E310 0101 A
1099 E311 0101 A
1100 E312 0101 A
1101 E313 6666 A
1102 E314 2020 A
     E315 2020 A
1103 E316 6666 A
1104 E317 492E A
     E318 442E A
     E319 204E A
     E31A 554D A
     E31B 4245 A
     E31C 523A A
1105 E31D 6666 A
1106
1107
1108
1109 E31E FD03 A
1110 E31F 0200 A
1111 E320 2D02 A@
1112 E321 0200 A
1113 E322 FFAC A
     E323 FC86 A
     E324 0000 A
```

```
     E325 0000 A
     E326 0000 A
     E327 0000 A
     E328 0000 A
1114
1115
1116
1117
1118
1119
1120
1121 E329 4700 A
1122 E32A 89F9 A
1123 E32B 4D07 A
1124 E32C 4400 A
1125 E32D A200 A
1126 E32E 4A01 A
1127 E32F 49FF A
1128 E330 21FB A
1129 E331 2300 A
1130
1131
1132
1133
1134 E332 4700 A
1135 E333 89F1 A
1136 E334 4D07 A
1137 E335 8200 A
1138 E336 4000 A
1139 E337 4AFF A
1140 E338 49FF A
1141 E339 21FB A
1142 E33A 2300 A
1143
1144
1145      0000
ASECT PTRS

E060 E01B A
     E061 0000 A
     E062 6666 A
     E063 0039 A
     E064 0007 A
     E065 0005 A
     E066 E2BF A
     E067 E2BD A
     E068 FB9D A
     E197 009D B
     E198 FD29 A
     E1EB FB9F A
     E1EC E2BF A
     E1ED E2BD A
     E279 009D B
     E27A 0040 A
     E27B FC86 A
     E27C F00B A
     E324 00AF B
     E325 00B5 B
TSECT PTRS

BSECT PTRS

MAP
     009A   B
     E1C2   A
     E1C1   A
     0011   B
     F190   A
     E098   A
     E235   A
     E06A   A*
     F23C   A
     E06B   A
     F2A3   A
     E06C   A*
``` first or second numbers on the display means in response to one of the cursor control signals and for displaying a flag adjacent said one number in response to the generatio of the flag control signal by an operator while the cursor is being displayed adjacent said one number; and the printer controller means comprises means for enabling the printer means to distinctively identify on the sheet said one number adjacent which the flag is displayed.

10. Apparatus, as claimed in claim 9, wherein the first switch means comprises means for generating an up cursor control signal or a down cursor control signal in response to operator control and wherein the processor means, main memory means, display controller means and display means comprise means for moving the displayed cursor in one direction in response to the up cursor control signal and in the opposite direction in response to the down cursor control signal.

11. Apparatus, as claimed in claim 1, wherein:

the apparatus further comprises manually operable ID switch means for generating an identification number;

the processor means comprises means for enabling the display controller means and display means to display a prompt requesting the entry of the identification number and for inhibiting the analysis of the engine until the identification number is entered; and the printer controller means comprises means for temporarily storing the identification number while the printing is occurring, whereby the identification number is printed on the sheet, so that the first and second numbers are identified with the proper engine.

12. A process automatically carried out by apparatus for analyzing an internal combustion engine and for creating a record of a portion of the analysis which indicates an engine problem comprising the steps of:

electronically generating first and second digital measurement signals corresponding to first and second engine conditions;

displaying a first number indicative of the first engine condition and a second number indicative of the second engine condition;

moving a cursor adjacent a selected one of the first or second numbers which appears to indicate an engine problem;

generating a flag control signal when the cursor is adjacent the selected one of the first or second numbers;

displaying a flag adjacent the selected one of the first or second numbers in response to the flag control signal;

storing a flag print signal identifying the selected one of the first or second numbers; and printing the first and second numbers, the selected one of said numbers being distinctively identified by the printing.

13. A process, as claimed in claim 12, wherein the step of displaying comprises the steps of:

storing a first display address signal corresponding to a first location;

storing a second display address signal corresponding to a second location;

displaying the first number at the first location; and displaying the second number at the second location.

14. A process, as claimed in claim 13, wherein the step of moving a cursor comprises the steps of:

storing a third display address signal corresponding to a third location adjacent the first location;

storing a fourth display address signal corresponding to a fourth location adjacent the second location;

initially displaying the cursor in the third location;

generating a cursor control signal if movement of the cursor to the fourth location is desired;

displaying the cursor in the fourth location in response to the cursor control signal; and storing a cursor location word indicating the current location in which the cursor is displayed.

15. A process, as claimed in claim 14, wherein the step of storing a flag print signal comprises the step of storing a line signal indicating a line in which the selected one of the first or second numbers appears.

16. A process, as claimed in claim 14, wherein the step of printing comprises the step of printing the selected one of the numbers in an ink color different from the unselected number.

* * * * *